(12) United States Patent
Sato et al.

(10) Patent No.: US 10,133,189 B2
(45) Date of Patent: Nov. 20, 2018

(54) LIQUID IMMERSION MEMBER, EXPOSURE APPARATUS, EXPOSING METHOD, METHOD OF MANUFACTURING DEVICE, PROGRAM, AND RECORDING MEDIUM

(71) Applicant: NIKON CORPORATION, Tokyo (JP)

(72) Inventors: Shinji Sato, Fukaya (JP); Kenyo Odanaka, Kawagoe (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/786,042

(22) Filed: Oct. 17, 2017

(65) Prior Publication Data

US 2018/0052397 A1      Feb. 22, 2018

Related U.S. Application Data

(60) Division of application No. 14/743,265, filed on Jun. 18, 2015, now Pat. No. 9,823,582, which is a continuation of application No. PCT/JP2013/084800, filed on Dec. 26, 2013.

(60) Provisional application No. 61/746,470, filed on Dec. 27, 2012.

(51) Int. Cl.
*G03B 27/52* (2006.01)
*G03F 7/20* (2006.01)

(52) U.S. Cl.
CPC .......... *G03F 7/70341* (2013.01); *G03F 7/709* (2013.01)

(58) Field of Classification Search
CPC .............................. G03F 7/70341; G03F 7/709
USPC ............................................................ 355/30
See application file for complete search history.

(56) References Cited

U.S. PATENT DOCUMENTS

| 6,208,407 B1 | 3/2001 | Loopstra |
| 6,262,796 B1 | 7/2001 | Loopstra et al. |
| 6,341,007 B1 | 1/2002 | Nishi et al. |
| 6,452,292 B1 | 9/2002 | Binnard |
| 6,611,316 B2 | 8/2003 | Sewell |
| 6,778,257 B2 | 8/2004 | Bleeker et al. |
| 6,897,963 B1 | 5/2005 | Taniguchi et al. |
| 7,292,313 B2 | 11/2007 | Poon et al. |

(Continued)

FOREIGN PATENT DOCUMENTS

| EP | 1 713 113 A1 | 10/2006 |
| EP | 2 523 210 A1 | 11/2012 |

(Continued)

OTHER PUBLICATIONS

Oct. 25, 2017 Office Action issued in Taiwanese Patent Application No. 102148421.

(Continued)

*Primary Examiner* — Peter B Kim
(74) *Attorney, Agent, or Firm* — Oliff PLC

(57) ABSTRACT

A liquid immersion member is used in a liquid immersion exposure apparatus which exposes a substrate by exposure light via a first liquid between an emitting surface of an optical member and the substrate, and is capable of forming a liquid immersion space on an object movable below the optical member. The liquid immersion member includes a first member that is disposed at at least a portion of surrounding of the optical member; a second member that is capable of being opposite to the object and is movable outside an optical path of the exposure light; and a protection part that protects the optical member. The protection part decreases a change in pressure which the optical member receives from the liquid in the liquid immersion space.

23 Claims, 32 Drawing Sheets

(56) References Cited

U.S. PATENT DOCUMENTS

| | | |
|---|---|---|
| 7,394,522 B2 | 7/2008 | Hasegawa et al. |
| 7,656,501 B2 | 2/2010 | Ten Kate et al. |
| 7,864,292 B2 | 1/2011 | Leenders et al. |
| 8,004,651 B2 | 8/2011 | Nagasaka |
| 8,068,209 B2 | 11/2011 | Poon et al. |
| 8,134,685 B2 | 3/2012 | Nishii et al. |
| 8,237,911 B2 | 8/2012 | Poon et al. |
| 8,289,497 B2 | 10/2012 | Poon et al. |
| 8,400,610 B2 | 3/2013 | Poon et al. |
| 8,477,283 B2 | 7/2013 | Nishii |
| 8,610,873 B2 | 12/2013 | Poon et al. |
| 8,675,174 B2 | 3/2014 | Mizutani |
| 8,743,343 B2 | 6/2014 | Poon et al. |
| 8,891,059 B2 | 11/2014 | Nagasaka |
| 8,896,806 B2 | 11/2014 | Sato |
| 8,934,080 B2 | 1/2015 | Poon et al. |
| 9,013,675 B2 | 4/2015 | Nishii et al. |
| 9,223,225 B2 | 12/2015 | Shibazaki |
| 2007/0177125 A1 | 8/2007 | Shibazaki |
| 2007/0288121 A1 | 12/2007 | Shibazaki |
| 2007/0296939 A1 | 12/2007 | Nishii |
| 2008/0049209 A1 | 2/2008 | Nagasaka et al. |
| 2009/0231560 A1 | 9/2009 | Poon et al. |
| 2009/0237631 A1 | 9/2009 | Poon et al. |
| 2009/0280436 A1 | 11/2009 | Nishii |
| 2010/0304310 A1 | 12/2010 | Sato |
| 2011/0199591 A1 | 8/2011 | Sato |
| 2013/0265555 A1 | 10/2013 | Shibazaki |
| 2013/0265556 A1 | 10/2013 | Sato |
| 2014/0022522 A1 | 1/2014 | Sato |
| 2014/0253886 A1 | 9/2014 | Sato |
| 2014/0285781 A1 | 9/2014 | Sato |
| 2014/0300875 A1 | 10/2014 | Sato et al. |
| 2014/0307235 A1 | 10/2014 | Sato |

FOREIGN PATENT DOCUMENTS

| | | |
|---|---|---|
| JP | 2007-005363 A | 1/2007 |
| JP | 2008-034801 A | 2/2008 |
| JP | 2011-205121 A | 10/2011 |
| WO | 01/35168 A1 | 5/2001 |
| WO | 2004/019128 A2 | 3/2004 |
| WO | 2011-083724 A1 | 7/2011 |
| WO | 2013/153939 A1 | 10/2013 |

OTHER PUBLICATIONS

Apr. 1, 2014 International Search Report issued in International Patent Application No. PCT/JP2013/084800.
Apr. 17, 2014 Written Opinion of the International Searching Authority issued in International Patent Application No. PCT/JP2013/084800.
Mar. 24, 2016 Office Action issued in U.S. Appl. No. 14/134,417.
Aug. 22, 2016 Extended Search Report issued in European Patent Application No. 13868247.1.
Sep. 20, 2016 Office Action issued in the U.S. Appl. No. 14/134,417.
Nov. 4, 2016 Office Action issued in Chinese Patent Application No. 2013800731833.
May 18, 2017 Office Action issued in European Patent Application No. 13868247.1.
Jan. 13, 2017 Office Action issued in U.S. Appl. No. 14/743,265.
Jul. 3, 2017 Notice of Allowance issued in U.S. Appl. No. 14/743,265.
U.S. Appl. No. 14/743,265, filed Jun. 18, 2015 in the name of Sato et al.
Oct. 3, 2017 Office Action issued in Japanese Patent Application No. 2014-554525.
Oct. 31, 2017 Corrected Notice of Allowability issued in U.S. Appl. No. 14/743,265.
May 22, 2018 Office Action issued in Taiwanese Patent Application No. 102148421.

FIG. 40A
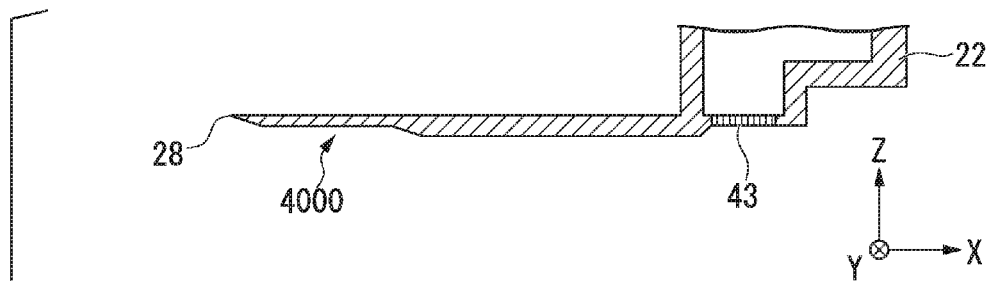
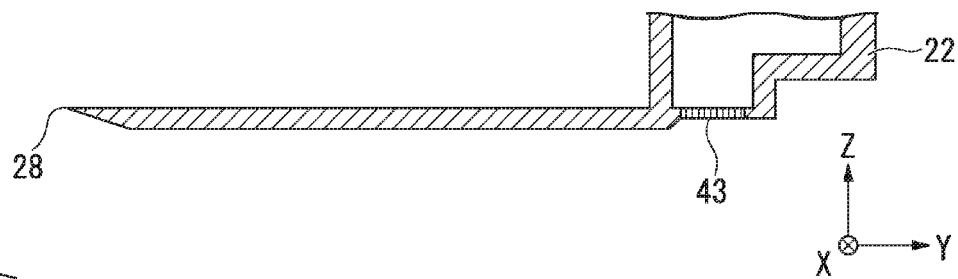
FIG. 40B
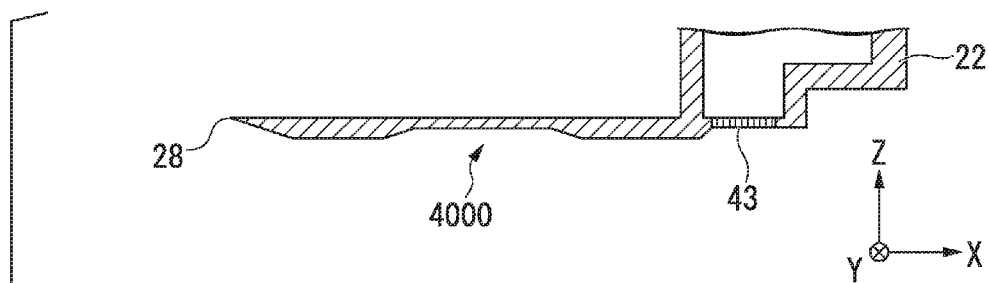
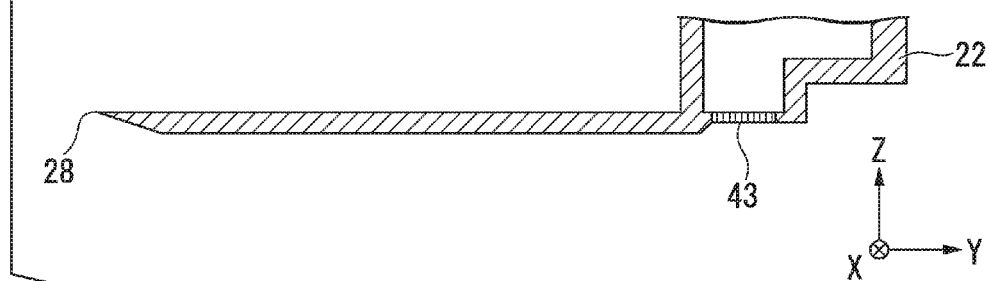

LIQUID IMMERSION MEMBER, EXPOSURE APPARATUS, EXPOSING METHOD, METHOD OF MANUFACTURING DEVICE, PROGRAM, AND RECORDING MEDIUM

CROSS-REFERENCE TO RELATED APPLICATION

This application is a divisional of U.S. application Ser. No. 14/743,265 filed Jun. 18, 2015, and claims priority based on U.S. Patent Provisional Application No. 61/746,470, filed Dec. 27, 2012. The parent application is a continuation application of International Application PCT/JP2013/084800, filed on Dec. 26, 2013. The contents of the above applications are incorporated herein by reference.

BACKGROUND

Technical Field

The present invention relates to a liquid immersion member, an exposure apparatus, an exposing method, a method of manufacturing a device, a program, and a recording medium.

For example, in an exposure apparatus which is used in a photolithography process, as disclosed in U.S. Pat. No. 7,864,292, a liquid immersion exposure apparatus is known, which exposes a substrate by exposure light via liquid between an emitting surface of an optical member and the substrate.

SUMMARY

For example, in a liquid immersion exposure apparatus, if an optical member which emits an exposure light is changed or bubbles (a part of gas) occur in the liquid, exposure failure may occur. As a result, a defective device may be manufactured.

An object of an aspect of the present invention is to provide a liquid immersion member, an exposure apparatus, and an exposing method capable of reducing occurrences of exposure failure. Moreover, an object of another aspect of the present invention is to provide a method of manufacturing a device, a program, and a recording medium capable of reducing occurrences of defective devices.

According to a first aspect of the present invention, there is provided a liquid immersion member that is used in a liquid immersion exposure apparatus which exposes a substrate to exposure light via a first liquid between an emitting surface of an optical member and the substrate, and is capable of forming a liquid immersion space in an object movable below the optical member, the liquid immersion member including: a first member that is disposed at at least a portion of surrounding of the optical member; a second member that is capable of being opposite to the object, and is movable outside an optical path of the exposure light; and a protection part that is configured to protect the optical member, in which the protection part decreases a change in pressure which the optical member receives from the liquid in the liquid immersion space.

According to a second aspect of the present invention, there is provided a liquid immersion member that is used in a liquid immersion exposure apparatus which exposes a substrate by exposure light via a first liquid between an emitting surface of an optical member and the substrate, and is capable of forming a liquid immersion space on an object movable below the optical member, the liquid immersion member including: a first member that is disposed at at least a portion of surrounding of the optical member; and a second member that is capable of being opposite to the object, and is movable outside an optical path of the exposure light, in which the first member includes a wall part which is disposed between the optical member and the second member, the second member includes a second upper surface and a second lower surface which is capable of being opposite to a surface of the object, and a lowermost part of the wall part is disposed at a same height as the second upper surface or is disposed below the second upper surface.

According to a third aspect of the present invention, there is provided a liquid immersion member that is used in a liquid immersion exposure apparatus which exposes a substrate by exposure light via a first liquid between an emitting surface of an optical member and the substrate, and is capable of forming a liquid immersion space on an object movable below the optical member, the liquid immersion member including: a first member that is disposed at at least a portion of surrounding of the optical member; and a second member that is capable of being opposite to the object, and is movable outside an optical path of the exposure light, in which the first member includes a wall part which is disposed between the optical member and the second member, the second member includes a second upper surface and a second lower surface which is capable of being opposite to a surface of the object, and a lowermost part of the wall part is disposed at a same height as the second lower surface or is disposed below the second lower surface.

According to a fourth aspect of the present invention, there is provided a liquid immersion member that is used in a liquid immersion exposure apparatus which exposes a substrate by exposure light via a liquid between an emitting surface of an optical member and the substrate, and is capable of forming a liquid immersion space on an object movable below the optical member, the liquid immersion member including: a first member that is disposed at at least a portion of surrounding of the optical member; and a second member that is capable of being opposite to the object, and is movable outside an optical path of the exposure light, in which the first member includes a wall part which is disposed between the optical member and the second member, the second member includes a second upper surface and a second lower surface which is capable of being opposite to a surface of the object, a lowermost part of the wall part is disposed above the second upper surface of the second member, a gap is formed between the first member and the second upper surface outside the lowermost part with respect to the optical path, and a distance between the lowermost part and the second upper surface is smaller than a size of the gap in a direction parallel to the optical axis of the optical member.

According to a fifth aspect of the present invention, there is provided a liquid immersion member that is used in a liquid immersion exposure apparatus which exposes a substrate by exposure light via a liquid between an emitting surface of an optical member and the substrate, and is capable of forming a liquid immersion space on an object movable below the optical member, the liquid immersion member including: a first member that is disposed at at least a portion of surrounding of the optical path of the exposure light; and a second member which is capable of being opposite to the object, and is movable outside the optical path, in which the first member includes a wall part which is disposed between the optical member and the second member, the wall part includes a first part which is nearest to the optical path, the second member includes a second part which is nearest to the optical path, and the second part is continuously disposed outside the first part with respect to the optical path in a movement period of the second member.

According to a sixth aspect of the present invention, there is provided a liquid immersion member that is used in a liquid immersion exposure apparatus which exposes a substrate by exposure light via a first liquid between an emitting surface of an optical member and the substrate, and is capable of forming a liquid immersion space on an object movable below the optical member, the liquid immersion member including: a first member that is disposed at at least a portion of surrounding of the optical member; and a second member that is capable of being opposite to the object, and is movable outside an optical path of the exposure light, in which the first member includes a first lower surface in which at least a portion is capable of being opposite to the second member, and the first lower surface includes a first region, and a second region, the second region being disposed outside the first region with respect to the optical path and is disposed above the first region.

According to a seventh aspect of the present invention, there is provided a liquid immersion member that is used in a liquid immersion exposure apparatus which exposes a substrate by exposure light via a first liquid between an emitting surface of an optical member and the substrate, and is capable of forming a liquid immersion space on an object movable below the optical member, the liquid immersion member including: a first liquid supply part that is configured to supply the first liquid; a first member that is disposed at at least a portion of surrounding of the optical member; a second member that is capable of being opposite to the object, and is movable outside an optical path of the exposure light; and a second liquid supply part that is configured to supply a second liquid, in which the second member is moved so that one of a first state and a second state is changed to the other state, the first state being a state in which the second member is opposite to the second liquid supply part and the second state being a state in which the second member is not opposite to the second supply part.

According to an eighth aspect of the present invention, there is provided an exposure apparatus which exposes a substrate by exposure light via a liquid, including: the liquid immersion member according to any one of the first to seventh aspects.

According to a ninth aspect of the present invention, there is provided an exposure apparatus that exposes a substrate by exposure light via a first liquid, including: an optical member that includes an emitting surface from which the exposure light is emitted; a liquid immersion member that includes a first member and a second member and that is configured to form a liquid immersion space on an object movable below the optical member, the first member being disposed at at least a portion of surrounding of the optical member and the second member being capable of opposing the object and being movable outside an optical path of the exposure light; and a protection member configured to protect the optical member, in which the protection member decreases a change in pressure in which the optical member receives from the liquid in the liquid immersion space.

According to a tenth aspect of the present invention, there is provided a method of manufacturing a device, including: exposing the substrate using the exposure apparatus according to the eighth or the ninth aspect; and developing the exposed substrate.

According to an eleventh aspect of the present invention, there is provided an exposing method that exposes a substrate by exposure light via a first liquid between an emitting surface of an optical member and the substrate, the exposure method including: forming a liquid immersion space of a liquid on the substrate movable below the optical member by using a liquid immersion member that includes a first member which is disposed at at least a portion of surrounding of the optical member, a second member which is capable of being opposite to the object and is movable outside an optical path of the exposure light, and a protection part which protects the optical member; exposing the substrate by the exposure light emitted from the emitting surface via the liquid in the liquid immersion space; moving the second member with respect to the first member in at least a part of an exposure of the substrate; and decreasing a change of a pressure, which the optical member receives from the liquid in the liquid immersion space, by use of the protection part.

According to a twelfth aspect of the present invention, there is provided an exposing method that exposes a substrate by exposure light via a first liquid between an emitting surface of an optical member and the substrate, the exposure method including: forming a liquid immersion space of a liquid on the substrate movable below the optical member by using a liquid immersion member that includes a first member which is disposed at at least a portion of surrounding of the optical member and a second member which is capable of being opposite to the object and is movable outside an optical path of the exposure light, in which the first member includes a wall part disposed between the optical member and the second member, the second member includes a second upper surface and a second lower surface which is capable of being opposite to a surface of the object, and a lowermost part of the wall part is disposed at a same height as the second upper surface or is disposed below the second upper surface; exposing the substrate by the exposure light emitted from the emitting surface via the liquid in the liquid immersion space; and moving the second member with respect to the first member in at least a part of an exposure of the substrate.

According to a thirteenth aspect of the present invention, there is provided an exposing method that exposes a substrate by exposure light via a first liquid between an emitting surface of an optical member and the substrate, the exposing method including: forming a liquid immersion space of a liquid on the substrate movable below the optical member by using a liquid immersion member that includes a first member which is disposed at at least a portion of surrounding of the optical member and a second member which is capable of being opposite to the object and is movable outside an optical path of the exposure light, in which the first member includes a wall part disposed between the optical member and the second member, the second member includes a second upper surface and a second lower surface which is capable of being opposite to a surface of the object, and a lowermost part of the wall part is disposed at a same height as the second lower surface or is disposed below the second lower surface; exposing the substrate by the exposure light emitted from the emitting surface via the liquid in the liquid immersion space; and moving the second member with respect to the first member in at least a part of an exposure of the substrate.

According to a fourteenth aspect of the present invention, there is provided an exposing method that exposes a substrate to exposure light via a first liquid between an emitting surface of an optical member and the substrate, the exposing method including: forming a liquid immersion space of a liquid on the substrate movable below the optical member by using a liquid immersion member that includes a first member which is disposed at at least a portion of surrounding of the optical member and a second member which is capable of being opposite to the object and is movable outside an optical path of the exposure light, in which the first member includes a wall part disposed between the optical member and the second member, the second member includes a second upper surface and a second lower surface which capable of being opposite to a surface of the object, a lowermost part of the wall part is disposed above the second upper surface of the second member, a gap is formed between the first member and the second upper surface outside the lowermost part with respect to the optical path, and a distance between the lowermost part and the second upper surface is smaller than a size of the gap in a direction parallel to the optical axis of the optical member; exposing the substrate by the exposure light emitted from the emitting surface via the liquid in the liquid immersion space; and moving the second member with respect to the first member in at least a part of an exposure of the substrate.

According to a fifteenth aspect of the present invention, there is provided an exposing method that exposes a substrate by exposure light via a first liquid between an emitting surface of an optical member and the substrate, including: forming a liquid immersion space of a liquid on the substrate movable below the optical member by using a liquid immersion member that includes a first member which is disposed at at least a portion of surrounding of an optical path of the exposure light and a second member which is capable of being opposite to the object and is movable outside the optical path, in which the first member includes a wall part disposed between the optical member and the second member, the wall part includes a first part nearest to the optical path, the second member includes a second part nearest to the optical path, and the second part is continuously disposed outside the first part with respect to the optical path in a movement period of the second member; exposing the substrate by the exposure light emitted from the emitting surface via the liquid in the liquid immersion space; and moving the second member with respect to the first member in at least a part of an exposure of the substrate.

According to a sixteenth aspect of the present invention, there is provided an exposing method that exposes a substrate by exposure light via a first liquid between an emitting surface of an optical member and the substrate, the exposing method including: forming a liquid immersion space of a liquid on the substrate movable below the optical member by using a liquid immersion member that includes a first member which is disposed at at least a portion of surrounding of the optical member and a second member which is capable of being opposite to the object and is movable outside an optical path of the exposure light emitted from the emitting surface, in which the first member includes a first lower surface in which at least a portion is capable of being opposite to the second member, and the first lower surface includes a first region, and a second region which is disposed outside the first region with respect to the optical path and is disposed above the first region; exposing the substrate by the exposure light emitted from the emitting surface via the liquid in the liquid immersion space; and moving the second member with respect to the first member in at least a part of an exposure of the substrate.

According to a seventeenth aspect of the present invention, there is provided an exposing method that exposes a substrate by exposure light via a first liquid between an emitting surface of an optical member and the substrate, the exposing method including: forming a liquid immersion space of a liquid on the substrate movable below the optical member by using a liquid immersion member that includes a first liquid supply part which is configured to supply the first liquid, a first member which is disposed at at least a portion of surrounding of the optical member, a second member which is capable of being opposite to the object and is movable outside an optical path of the exposure light, and a second liquid supply part which is configured to supply a second liquid, in which the second member is moved so that one of a first state and a second state is changed to the other state, the first state being a state in which the second member is opposite to the second liquid supply part and the second state being a state in which the second member is not opposite to the second supply part; exposing the substrate by the exposure light emitted from an emitting surface via the liquid in the liquid immersion space; and moving the second member with respect to the first member in at least a portion of the exposure of the substrate.

According to an eighteenth aspect of the present invention, there is provided an exposing method that exposes a substrate by exposure light via a first liquid between an emitting surface of an optical member and the substrate, the exposing method including: forming a liquid immersion space of a liquid on the substrate movable below the optical member by using a liquid immersion member that includes a first member which is disposed at at least a portion of surrounding of the optical member, and a second member which is capable of being opposite to the object and is movable outside an optical path of the exposure light; exposing the substrate by the exposure light emitted from the emitting surface via the liquid in the liquid immersion space; moving the second member with respect to the first member in at least a part of an exposure of the substrate; and decreasing a change of a pressure, which the optical member receives from the liquid in the liquid immersion space, by use of a protection part.

According to a nineteenth aspect of the present invention, there is provided a method of manufacturing a device including: exposing a substrate using the exposing method according to any one of the eleventh to the eighteenth aspects; and developing the exposed substrate.

According to a twentieth aspect of the present invention, there is provided a program that causes a computer to execute a control of a liquid immersion exposure apparatus which exposes a substrate by exposure light via a first liquid between an emitting surface of an optical member and the substrate, in which the program performs: forming a liquid immersion space of a liquid on the substrate movable below the optical member by using a liquid immersion member that includes a first member which is disposed at at least a portion of surrounding of the optical member, a second member which includes at least a portion disposed below the first member, which is capable of being opposite to the object, and which is movable outside an optical path of the exposure light, and a protection part which protects the optical member; exposing the substrate by the exposure light emitted from the emitting surface via the liquid in the liquid immersion space; moving the second member with respect to the first member in at least a part of an exposure of the substrate; and decreasing a change of a pressure, which the optical member receives from the liquid in the liquid immersion space, by use of the protection part.

According to a twenty-first aspect of the present invention, there is provided a program that causes a computer to execute a control of a liquid immersion exposure apparatus which exposes a substrate by exposure light via a first liquid between an emitting surface of an optical member and the substrate, in which the program performs: forming a liquid immersion space of a liquid on the substrate movable below the optical member by using a liquid immersion member that includes a first member which is disposed at at least a portion of surrounding of the optical member, and a second member which includes at least a portion disposed below the first member, which is capable of being opposite to the object, and which is movable outside an optical path of the exposure light, in which the first member includes a wall part disposed between the optical member and the second member, the second member includes a second upper surface and a second lower surface which is capable of being opposite to a surface of the object, and a lowermost part of the wall part is disposed at a same height as the second upper surface or is disposed below the second upper surface; exposing the substrate by the exposure light emitted from the emitting surface via the liquid in the liquid immersion space; and moving the second member with respect to the first member in at least a part of an exposure of the substrate.

According to a twenty-second aspect of the present invention, there is provided a program that causes a computer to execute a control of a liquid immersion exposure apparatus which exposes a substrate by exposure light via a first liquid between an emitting surface of an optical member and the substrate, in which the program performs: forming a liquid immersion space of a liquid on the substrate movable below the optical member by using a liquid immersion member that includes a first member which is disposed at at least a portion of surrounding of the optical member, and a second member which includes at least a portion disposed below the first member, which is capable of being opposite to the object, and which is movable outside an optical path of the exposure light, in which the first member includes a wall part disposed between the optical member and the second member, the second member includes a second upper surface and a second lower surface which is capable of being opposite to a surface of the object, and a lowermost part of the wall part is disposed at a same height as the second lower surface or is disposed below the second lower surface; exposing the substrate by the exposure light emitted from the emitting surface via the liquid in the liquid immersion space; and moving the second member with respect to the first member in at least a part of an exposure of the substrate.

According to a twenty-third aspect of the present invention, there is provided a program that causes a computer to execute a control of a liquid immersion exposure apparatus which exposes a substrate by exposure light via a first liquid between an emitting surface of an optical member and the substrate, in which the program performs: forming a liquid immersion space of a liquid on the substrate movable below the optical member by using a liquid immersion member that includes a first member which is disposed at at least a portion of surrounding of the optical member, and a second member which includes at least a portion disposed below the first member, which is capable of being opposite to the object, and which is movable outside an optical path of the exposure light, in which the first member includes a wall part disposed between the optical member and the second member, the second member includes a second upper surface and a second lower surface which is capable of being opposite to a surface of the object, a lowermost part of the wall part is disposed above the second upper surface of the second member, a gap is formed between the first member and the second upper surface outside the lowermost part with respect to the optical path, and a distance between the lowermost part and the second upper surface is smaller than a size of the gap in a direction parallel to the optical axis of the optical member; exposing the substrate by the exposure light emitted from the emitting surface via the liquid in the liquid immersion space; and moving the second member with respect to the first member in at least a part of an exposure of the substrate.

According to a twenty-fourth aspect of the present invention, there is provided a program that causes a computer to execute a control of a liquid immersion exposure apparatus which exposes a substrate by exposure light via a first liquid between an emitting surface of an optical member and the substrate, in which the program performs: forming a liquid immersion space of a liquid on the substrate movable below the optical member by using a liquid immersion member that includes a first member which is disposed at at least a portion of surrounding of an optical path of the exposure light, and a second member which includes at least a portion disposed below the first member, which is capable of being opposite to the object, and which is movable outside the optical path, in which the first member includes a wall part disposed between the optical member and the second member, the wall part includes a first part nearest to the optical path, the second member includes a second part nearest to the optical path, and the second part is continuously disposed outside the first part with respect to the optical path in a movement period of the second member; exposing the substrate by the exposure light emitted from the emitting surface via the liquid in the liquid immersion space; and moving the second member with respect to the first member in at least a part of an exposure of the substrate.

According to a twenty-fifth aspect of the present invention, there is provided a program that causes a computer to execute a control of a liquid immersion exposure apparatus which exposes a substrate by exposure light via a first liquid between an emitting surface of an optical member and the substrate, in which the program performs: forming a liquid immersion space of a liquid on the substrate movable below the optical member by using a liquid immersion member that includes a first member which is disposed at at least a portion of surrounding of the optical member, and a second member which includes at least a portion disposed below the first member, which is capable of being opposite to the object, and which is movable outside an optical path of the exposure light emitted from the emitting surface, in which the first member includes a first lower surface in which at least a portion is able to be opposite to the second member, and the first lower surface includes a first region, and a second region which is disposed outside the first region with respect to the optical path and which is disposed above the first region; exposing the substrate by the exposure light emitted from the emitting surface via the liquid in the liquid immersion space; and moving the second member with respect to the first member in at least a part of an exposure of the substrate.

According to a twenty-sixth aspect of the present invention, there is provided a program that causes a computer to execute a control of a liquid immersion exposure apparatus which exposes a substrate by exposure light via a first liquid between an emitting surface of an optical member and the substrate, in which the program performs: forming a liquid immersion space of a liquid on the substrate movable below the optical member by using a liquid immersion member that includes a first liquid supply part which is configured to supply the first liquid, a first member which is disposed a at least a portion of surrounding of the optical member, a second member which includes at least a portion disposed below the first member, which is capable of being opposite to the object, and which is movable outside an optical path of the exposure light, and a second liquid supply part which is configured to supply a second liquid, in which the second member is moved so that one of a first state and a second state is changed to the other state, the first state being a state in which the second member is opposite to the second liquid supply part and the second state being a state in which the second member is not opposite to the second supply part; exposing the substrate by the exposure light emitted from the emitting surface via the liquid in the liquid immersion space; and moving the second member with respect to the first member in at least a part of an exposure of the substrate.

According to a twenty-seventh aspect of the present invention, there is provided a program that causes a computer to execute a control of a liquid immersion exposure apparatus which exposes a substrate by exposure light via a first liquid between an emitting surface of an optical member and the substrate, in which the program performs: forming a liquid immersion space of a liquid on the substrate movable below the optical member by using a liquid immersion member that includes a first member which is disposed at at least a portion of surrounding of the optical member, and a second member which includes at least a portion disposed below the first member, which is capable of being opposite to the object, and which is movable outside an optical path of the exposure light; exposing the substrate by the exposure light emitted from the emitting surface via the liquid in the liquid immersion space; moving the second member with respect to the first member in at least a part of an exposure of the substrate; and decreasing a change of a pressure, which the optical member receives from the liquid in the liquid immersion space, by use of a protection part.

According to a twenty-eighth aspect of the present invention, there is provided a computer-readable recording medium on which the program according to any one of the twentieth to twenty-seventh aspects is recorded.

According to the aspects of the present invention, occurrences of exposure failure can be prevented. Moreover, according to the aspects of the present invention, occurrence of a defective device can be prevented.

BRIEF DESCRIPTION OF THE DRAWINGS

FIG. 40A is a side cross-sectional view showing a portion of the liquid immersion member.

FIG. 40B is a side cross-sectional view showing a portion of the liquid immersion member.

DESCRIPTION OF EMBODIMENTS

Hereinafter, embodiments of the present invention will be described with reference to the drawings. However, the present invention is not limited thereto. In the descriptions below, an XYZ rectangular coordinate system is set, and a positional relationship of each portion will be described with reference to the XYZ rectangular coordinate system. A predetermined direction in a horizontal surface is set to an X axis direction, a direction orthogonal to the X axis direction in the horizontal surface is set to a Y axis direction, and a direction (that is, a vertical direction) orthogonal to each of the X axis direction and the Y axis direction is set to a Z axis direction. Moreover, the rotation (inclination) directions around the X axis, the Y axis, and the Z axis are set to the θX direction, the θY direction, and the θZ direction.

First Embodiment

Figure 1:
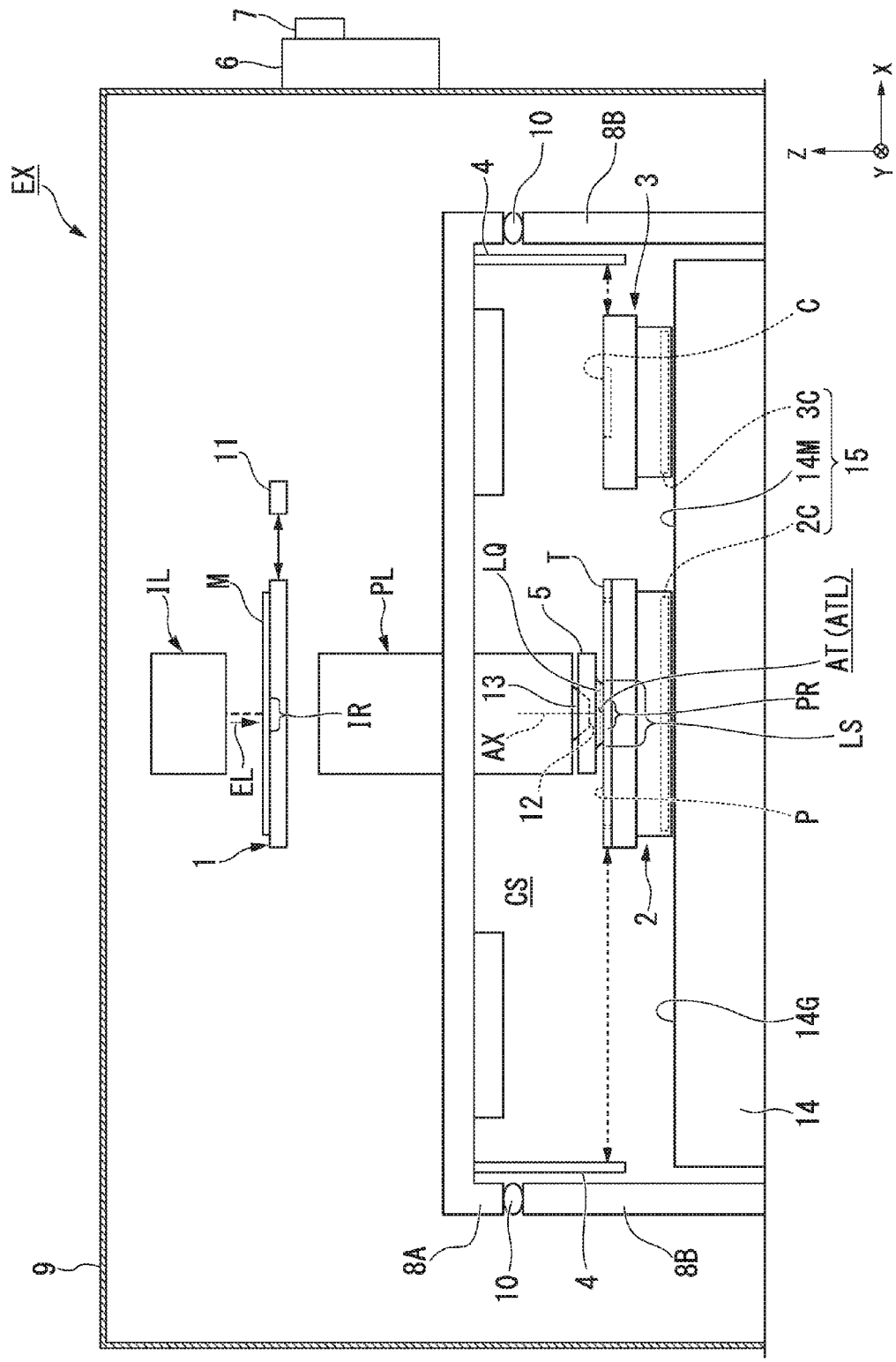
FIG. 1 is a view showing an example of an exposure apparatus according to a first embodiment.

A first embodiment will be described. FIG. 1 is a schematic configuration view showing an example of an exposure apparatus EX according to the first embodiment. The exposure apparatus EX of the present embodiment is a liquid immersion exposure apparatus which exposes a substrate P via a liquid LQ using exposure light EL. In the present embodiment, a liquid immersion space LS is formed so that an optical path ATL of the exposure light EL which is radiated to the substrate P is filled with the liquid LQ. The liquid immersion space LS means a portion (space or region) which is filled with the liquid. The substrate P is exposed by the exposure light EL via the liquid LQ in the liquid immersion space LS. In the present embodiment, water (pure water) is used as the liquid LQ.

For example, the exposure apparatus EX of the present embodiment is an exposure apparatus which includes a substrate stage and a measurement stage as disclosed in U.S. Pat. No. 6,897,963, European Patent Application, Publication No. 1713113, or the like.

In FIG. 1, the exposure apparatus EX includes: a mask stage 1 which is movable while holding a mask M; a substrate stage 2 which is movable while holding a substrate P; a measurement stage 3 which does not hold the substrate P, and which is movable while mounting a measurement member (measurement instrument) C which measures the exposure light EL; a measurement system 4 which measures positions of the substrate stage 2 and the measurement stage 3; an illumination system IL which illuminates the mask M with the exposure light EL; a projection optical system PL which projects an image of a pattern of the mask M which is illuminated with the exposure light EL to the substrate P; a liquid immersion member 5 which forms the liquid immersion space LS of a liquid LQ; a controller 6 which controls an operation of the entire exposure apparatus EX; and a storage apparatus 7 which is connected to the controller 6 and stores various information with respect to the exposure.

Moreover, the exposure apparatus EX includes a reference frame 8A which supports the projection optical system PL and various measurement systems including the measurement system 4, an apparatus frame 8B which supports the reference frame 8A, and a vibration isolator 10 which is disposed between the reference frame 8A and the apparatus frame 8B, and suppresses transmission of vibration from the apparatus frame 8B to the reference frame 8A. The vibration isolator 10 includes a spring apparatus or the like. In the present embodiment, the vibration isolator 10 includes a gas spring (for example, an air mount). In addition, either a detection system which detects an alignment mark of the substrate P or a detection system which detects the position of the surface of an object such as the substrate P, or both detection systems may be supported by the reference frame 8A.

Moreover, the exposure apparatus EX includes a chamber apparatus 9 which adjusts an environment (at least one of temperature, humidity, pressure, and a degree of cleanness) of a space CS to which the exposure light EL advances. At least the projection optical system PL, the liquid immersion member 5, the substrate stage 2, and the measurement stage 3 are disposed in the space CS. In the present embodiment, at least a portion of the mask stage 1 and the illumination system IL is also disposed in the space CS.

The mask M includes a reticle on which a device pattern projected to the substrate P is formed. For example, the mask M includes a transmission type mask which includes a transparent plate such as a glass plate, and a pattern formed on the transparent plate using a light-shielding material such as chromium. Moreover, a reflection type mask may be used as the mask M.

The substrate P is a substrate used to manufacture a device. For example, the substrate P includes a base material such as a semiconductor wafer and a photosensitive film which is formed on the base material. The photosensitive film is a film of a photosensitive material (photoresist). Moreover, the substrate P may include other films in addition to the photosensitive film. For example, the substrate P may include an antireflection film and a protective film (top coat film) which protects the photosensitive film.

The illumination system IL radiates the exposure light EL to an illumination region IR. The illumination region IR includes positions which can be radiated with the exposure light EL emitted from the illumination system IL. The illumination system IL illuminates at least a portion of the mask M disposed in the illumination region IR by the exposure light EL having a uniform illumination distribution. For example, as for the exposure light EL which is emitted from the illumination system IL, far-ultraviolet light (DUV light) such as a bright line (g-line, h-line, i-line) emitted from a mercury lamp and KrF excimer laser light (248 nm in wavelength), ArF excimer laser light (193 nm in wavelength), vacuum-ultraviolet light (VUV light) such as $F_2$ laser light (157 nm in wavelength), and the like are used. In the present embodiment, as for the exposure light EL, ArF excimer laser light, which is ultraviolet light (vacuum-ultraviolet light), is used.

The mask stage 1 is movable in a state where it holds the mask M. For example, the mask stage 1 is moved by an operation of a driving system 11 which includes a planar motor as disclosed in U.S. Pat. No. 6,452,292. In the present embodiment, the mask stage 1 is able to move in six directions of the X axis, the Y axis, the Z axis, the θX, θY, and the θZ by the operation of the driving system 11. Moreover, the driving system 11 may not include a planar motor. The driving system 11 may include a linear motor.

The projection optical system PL radiates the exposure light EL to a projection region PR. The projection region PR includes positions which can be radiated with the exposure light EL emitted from the projection optical system PL. The projection optical system PL projects the image of the pattern of the mask M on at least a portion of the substrate P disposed in the projection region PR by a predetermined projection magnification. In the present embodiment, the projection optical system PL is a reduction system. The projection magnification of the projection optical system PL is ¼. In addition, the projection magnification of the projection optical system PL may be ⅕, ⅛, or the like. Moreover, the projection optical system PL may be either an equal magnification system or an enlargement system. In the present embodiment, the optical axis of the projection optical system PL is parallel to the Z axis. The projection optical system PL may be any of a refraction system which does not include a reflective optical element, a reflection system which does not include a refractive optical element, or a reflective refraction system which includes the reflective optical element and the refractive optical element. The projection optical system PL may form either an inverted image or an erected image.

The projection optical system PL includes a terminal optical element 13 which includes an emitting surface 12 from which the exposure light EL is emitted. The emitting surface 12 emits the exposure light EL toward the image surface of the projection optical system PL. The terminal optical element 13 is an optical element nearest to the image surface of the projection optical system PL among the plurality of optical elements of the projection optical system PL. The projection region PR includes positions which can be radiated with the exposure light EL emitted from the emitting surface 12. In the present embodiment, the emitting surface 12 faces the −Z axis direction. The exposure light EL emitted from the emitting surface 12 advances in the −Z axis direction. The emitting surface 12 is parallel to the XY plane. Moreover, the emitting surface 12 facing the −Z axis direction may have a convex surface or a concave surface. In addition, the emitting surface 12 may be inclined with respect to the XY plane and may include a curved surface. In the present embodiment, the optical axis AX of the terminal optical element 13 is parallel to the Z axis.

With respect to the direction parallel to the optical axis AX of the terminal optical element 13, the emitting surface 12 side is at the −Z side, and the incident surface side is at the +Z side. With respect to the direction parallel to the optical axis of the projection optical system PL, the image surface side of the projection optical system PL is at the −Z side, and the object surface side of the projection optical system PL is at the +Z side.

The substrate stage 2 is able to move in the XY plane, which includes positions (projection region PR) which can be radiated with the exposure light EL from the emitting surface 12, in a state where the substrate stage holds the substrate P. The measurement stage 3 is able to move in the XY plane, which includes positions (projection region PR) which can be radiated with the exposure light EL from the emitting surface 12, in a state where a measurement member (measurement instrument) C is mounted on the measurement stage. Each of the substrate stage 2 and the measurement stage 3 is able to move on a guide surface 14G of a base member 14. The guide surface 14G and the XY plane are substantially parallel to each other.

The substrate stage 2 includes a first holding part which releasably holds the substrate P and a second holding part which is disposed at the surrounding of the first holding part and releasably holds a cover member T as disclosed in, for example, United States Patent Application, Publication No. 2007/0177125, United States Patent Application, Publication No. 2008/0049209, and the like. The first holding part holds the substrate P so that the surface (upper surface) of the substrate P and the XY plane are substantially parallel to each other. The upper surface of the substrate P held by the first holding part and the upper surface of the cover member T held by the second holding part are disposed in substantially the same plane. With respect to the Z axis direction, the distance between the emitting surface 12 and the upper surface of the substrate P held by the first holding part is substantially the same as the distance between the emitting surface 12 and the upper surface of the cover member T held by the second holding part.

Moreover, with respect to the Z axis direction, the distance between the emitting surface 12 and the upper surface of the substrate P being substantially the same as the distance between the emitting surface 12 and the upper surface of the cover member T includes a difference of the distance between the emitting surface 12 and the upper surface of the substrate P and the distance between the emitting surface 12 and the upper surface of the cover member T being within 10% of the distance (a so-called working distance) between the emitting surface 12 and the upper surface of the substrate P when the substrate P is exposed, for example.

In addition, the upper surface of the substrate P held by the first holding part and the upper surface of the cover member T held by the second holding part may not be disposed on substantially the same plane. For example, with respect to the Z axis direction, the position of the upper surface of the substrate P and the position of the upper surface of the cover member T may be different from each other. For example, there may be a step between the upper surface of the substrate P and the upper surface of the cover member T.

In addition, the upper surface of the cover member T may be inclined with respect to the upper surface of the substrate P. The upper surface of the cover member T may include a curved surface.

The substrate stage 2 and the measurement stage 3 are moved by an operation of a driving system 15 which includes a planar motor as disclosed in, for example, U.S. Pat. No. 6,452,292. The driving system 15 includes a mover 2C which is disposed at the substrate stage 2, a mover 3C which is disposed at the measurement stage 3, and a stator 14M which is disposed at the base member 14. Each of the substrate stage 2 and the measurement stage 3 is able to move on a guide surface 14G in six directions of the X axis, the Y axis, the Z axis, the θX, the θY, and the θZ axis directions by the operation of the driving system 15. Moreover, the driving system 15 may not include a planar motor. The driving system 15 may include a linear motor.

The measurement system 4 includes an interferometer system. The interferometer system includes a unit which radiates measurement light to a measurement mirror of the substrate stage 2 and a measurement mirror of the measurement stage 3 and measures the positions of the substrate stage 2 and the measurement stage 3.

In addition, for example, the measurement system may include an encoder system disclosed in United States Patent Application, Publication No. 2007/0288121. Moreover, the measurement system 4 may include only one of the interferometer system and the encoder system.

When exposure processing of the substrate P is performed, or when predetermined measurement processing is performed, the controller 6 performs position controls of the substrate stage 2 (substrate P) and the measurement stage 3 (measurement member C) based on the measurement results of the measurement system 4.

Figure 2:
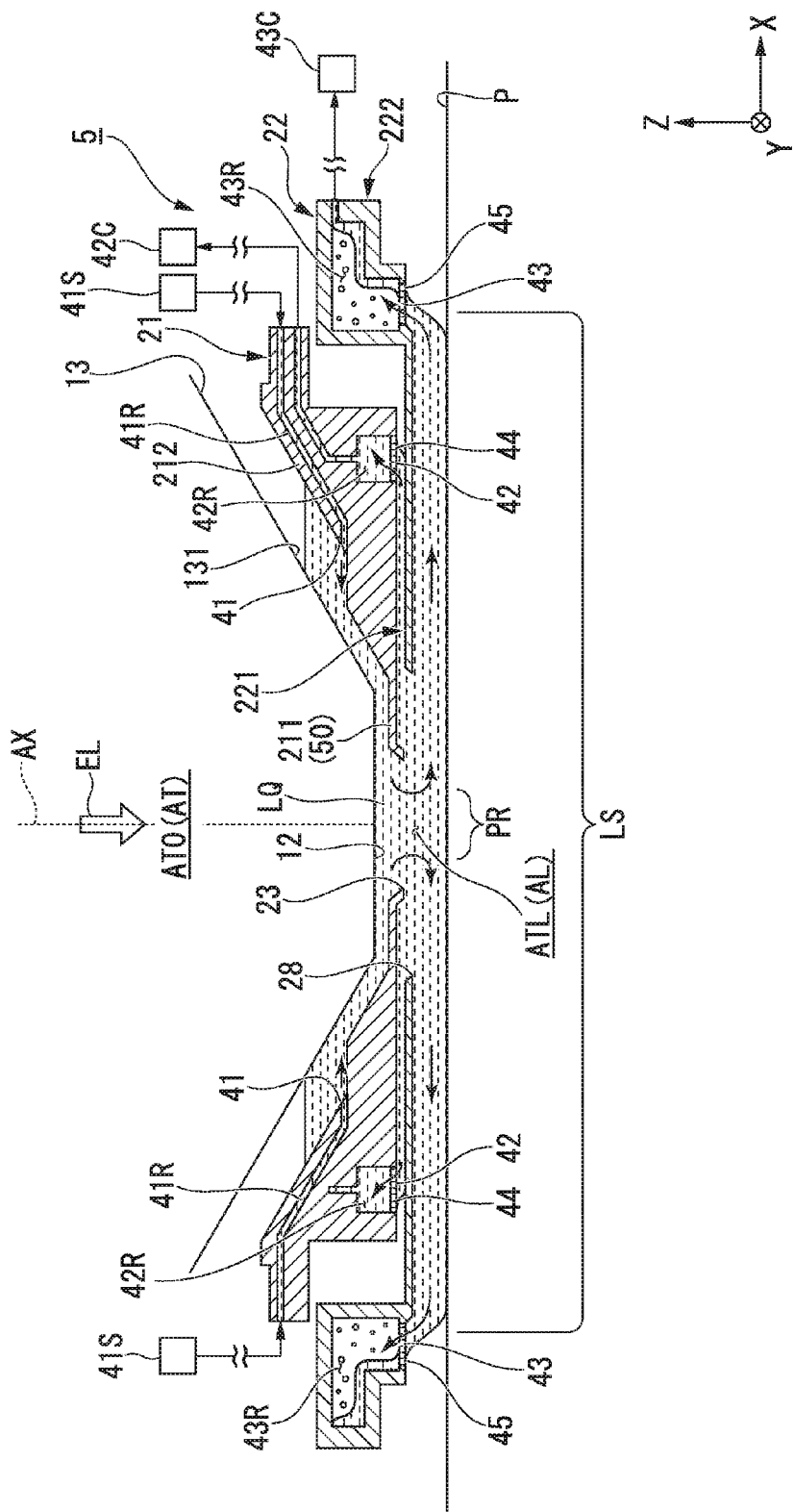
FIG. 2 is a side cross-sectional view showing an example of a liquid immersion member according to the first embodiment.
Figure 3:
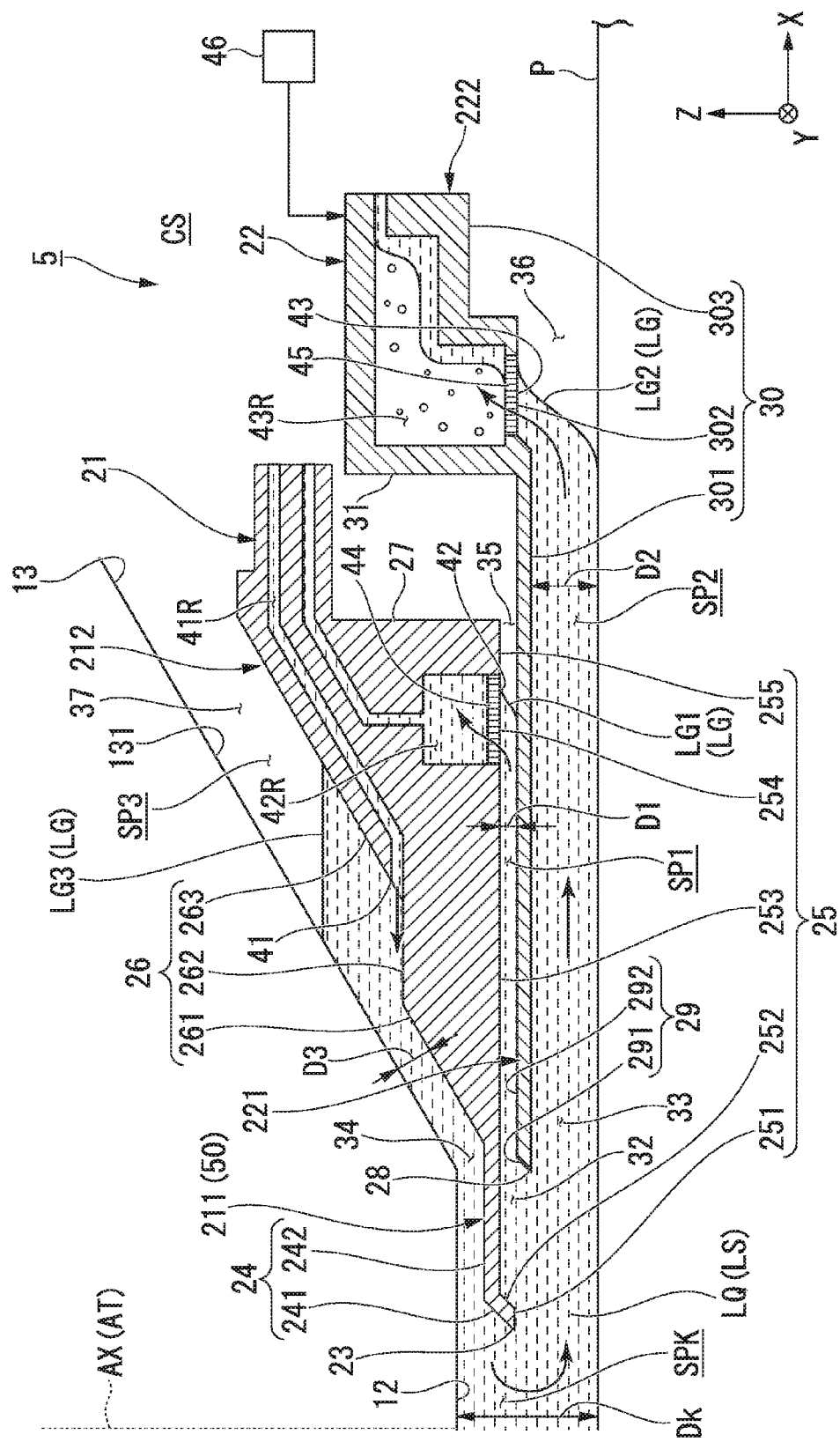
FIG. 3 is a side cross-sectional view showing a portion of the liquid immersion member according to the first embodiment.
Figure 4:
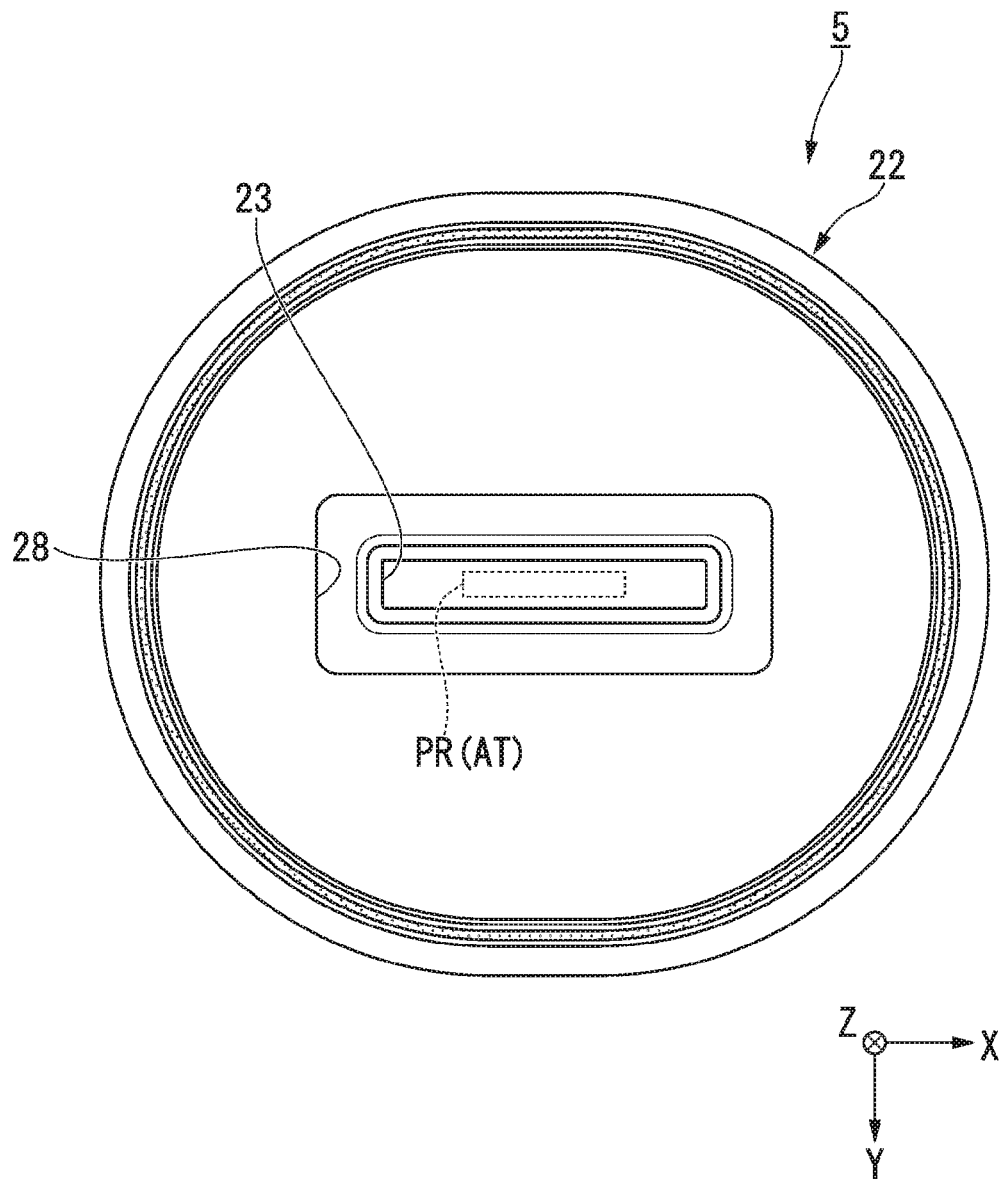
FIG. 4 is a view of the liquid immersion member according to the first embodiment as seen from below.

Next, the liquid immersion member 5 according to the present embodiment will be described. In addition, the liquid immersion member may also be referred to as a nozzle member. FIG. 2 is a cross-sectional view of the terminal optical element 13 and the liquid immersion member 5 parallel to the XZ plane. FIG. 3 is a view in which a portion of FIG. 2 is enlarged. FIG. 4 is a view of the liquid immersion member 5 as seen from below (-Z side).

The terminal optical element 13 includes the emitting surface 12 facing the -Z axis direction and an outer surface 131 which is disposed at the surrounding of the emitting surface 12. The exposure light EL is emitted from the emitting surface 12. The exposure light EL is not emitted from the outer surface 131. The exposure light EL passes through the emitting surface 12 and does not pass through the outer surface 131. The outer surface 131 is a non-emitting surface from which the exposure light EL is not emitted. In the present embodiment, the outer surface 131 is inclined upwardly and outwardly in a radial direction with respect to the optical path AX of the terminal optical element 13.

The liquid immersion member 5 forms a liquid immersion space LS of the liquid LQ above the object which is movable below the terminal optical element 13.

The object which is movable below the terminal optical element 13 is able to move in the XY plane which includes the position opposite to the emitting surface 12. The object is able to be opposite to the emitting surface 12 and is able to be disposed in the projection region PR. The object is able to move below the liquid immersion member 5 and is able to be opposite to the liquid immersion member 5.

In the present embodiment, the object includes at least one of at least a portion of the substrate stage 2 (for example, the cover member T of the substrate stage 2), the substrate P which is held by the substrate stage 2 (first holding part), and the measurement stage 3.

In the exposure of the substrate P, the liquid immersion space LS is formed so that the optical path ATL of the exposure light EL between the emitting surface 12 of the terminal optical element 13 and the substrate P is filled with the liquid LQ. When the exposure light EL is radiated to the substrate P, the liquid immersion space LS is formed so that only a portion of the surface region of the substrate P which includes the projection region PR is covered by the liquid LQ.

In the descriptions below, the object is defined as the substrate P. Moreover, as described above, the object may be at least one of the substrate stage 2 and the measurement stage 3, and the object may be one other than the substrate P, the substrate stage 2, and the measurement stage 3.

The liquid immersion space LS may be formed over two objects. For example, the liquid immersion space LS may be formed over the cover member T of the substrate stage 2 and the substrate P. The liquid immersion space LS may be formed over the substrate stage 2 and the measurement stage 3.

The liquid immersion space LS is formed so that the optical path ATL of the exposure light EL emitted from the emitting surface 12 of the terminal optical element 13 is filled with the liquid LQ. At least a portion of the liquid immersion space LS is formed in a space between the terminal optical element 13 and the substrate P (object). At least a portion of the liquid immersion space LS is formed in a space between the liquid immersion member 5 and the substrate P (object).

The liquid immersion member 5 includes a first member 21 disposed at at least a portion of the surrounding of the optical path AT of the exposure light EL, and a second member 22 disposed at at least a portion of the surrounding of the optical path AT of the exposure light EL. The second member 22 is a movable member which is able to move.

The optical path AT of the exposure light EL includes an optical path ATO (an optical path ATO of the exposure light EL passing through the terminal optical element 13) of the exposure light EL in the terminal optical element 13. Moreover, the optical path AT of the exposure light EL includes the optical path ATL of the exposure light EL which is emitted from the emitting surface 12. That is, in the present invention, the optical path AT of the exposure light EL may include the optical path ATO of the exposure light EL in the terminal optical element 13. The optical path AT of the exposure light EL may include the optical path ATL of the exposure light EL between the emitting surface 12 and the substrate P (object).

A portion of the first member 21 is disposed at at least a portion of the surrounding of the terminal optical element 13 (optical path ATO). A portion of the first member 21 is disposed at at least a portion of the surrounding of the optical path ATL.

A portion of the second member 22 is disposed at at least a portion of the surrounding of the terminal optical element 13 (optical path ATO) and the first member 21. A portion of the second member 22 is disposed at the surrounding of the optical path ATL.

At least a portion of the first member 21 is disposed below the terminal optical element 13. At least a portion of the terminal optical element 13 is disposed above the first member 21.

At least a portion of the second member 22 is disposed below the first member 21. At least a portion of the first member 21 is disposed above the second member 22. At least a portion of the second member 22 is movable below the first member 21. At least a portion of the second member 22 is movable below the terminal optical element 13 and the first member 21. At least a portion of the second member 22 is movable between the first member 21 and the substrate P (object).

The second member 22 is movable at the outside of the optical path AT of the exposure light EL. At least a portion of the second member 22 is movable at the outside of the optical path AT of the exposure light EL below the first member 21.

In the present embodiment, the terminal optical element 13 does not substantially move. The first member 21 also does not substantially move. The first member 21 does not substantially move with respect to the optical element 13.

The second member 22 is movable with respect to the terminal optical element 13. The second member 22 is movable with respect to the first member 21. A relative position between the terminal optical element 13 and the second member 22 is changed. A relative position between the first member 21 and the second member 22 is changed.

The first member 21 is disposed so as not to contact the terminal optical element 13. A gap is formed between the terminal optical element 13 and the first member 21. The second member 22 is disposed so as not to contact the terminal optical element 13 and the first member 21. A gap is formed between the first member 21 and the second member 22. The second member 22 moves so as not to contact the terminal optical element 13 and the first member 21.

The substrate P (object) is able to be opposite to at least a portion of the terminal optical element 13 via the gap. The substrate P (object) is able to be opposite to at least a portion of the first member 21 via the gap. The substrate P (object) is able to be opposite to at least a portion of the second member 22 via the gap.

The substrate P (object) is movable below the terminal optical element 13, the first member 21, and the second member 22.

At least a portion of the first member 21 is opposite to the terminal optical element 13 via the gap. In the present embodiment, a portion of the first member 21 is opposite to the emitting surface 12. A portion of the first member 21 is disposed below the emitting surface 12 via the gap. A portion of the first member 21 is opposite to the outer surface 131. A portion of the first member 21 is disposed at at least a portion of the surrounding of the outer surface 131 via the gap.

At least a portion of the second member 22 is opposite to the first member 21 via the gap. In the present embodiment, the second member 22 is not opposite to the terminal optical element 13. The first member 21 is disposed between the second member 22 and the terminal optical element 13. The first member 21 is disposed so that the terminal optical element 13 and the second member 22 are not opposite to each other.

The first member 21 includes a part 211 which is disposed at at least a portion of the surrounding of the optical path ATL, and a part 212 which is disposed at at least a portion of the surrounding of the terminal optical element 13 (optical path ATO). The part 212 is disposed above the part 211. In the present embodiment, the first member 21 is an annular member. The part 211 is disposed at the surrounding of the optical path ATL. The part 212 is disposed at the surrounding of the terminal optical element 13 (optical path ATO).

At least a portion of the part 211 of the first member 21 is disposed below the terminal optical element 13. At least a portion of the terminal optical element 13 is disposed above the part 211 of the first member 21. The terminal optical element 13 is disposed at a position further away from the substrate P (object) than the part 211 of the first member 21. At least a portion of the part 211 of the first member 21 is disposed between the terminal optical element 13 and the substrate P (object).

In the present embodiment, at least a portion of the part 211 of the first member 21 is able to be opposite to the emitting surface 12. That is, at least a portion of the part 211 of the first member 21 is disposed between the emitting surface 12 and the upper surface of the substrate P (object).

The first member 21 includes a first opening part 23 through which the exposure light EL emitted from the emitting surface 12 is able to pass, an upper surface 24, a lower surface 25 in which at least a portion is opposite to the second member 22, an inner surface 26 in which at least a portion is opposite to the outer surface 131 of the terminal optical element 13, and an outer surface 27 which faces outward in the radial direction with respect to the optical axis AX (optical path AT). At least a portion of the upper surface 24 faces the +Z axis direction. At least a portion of the lower surface 25 faces the −Z axis direction.

The first opening part 23 is formed to connect the upper surface 24 and the lower surface 25. The upper surface 24 is disposed at the surrounding of an upper end of the first opening part 23. The lower surface 25 is disposed at the surrounding of a lower end of the first opening part 23.

The upper surface 24 is able to be opposite to at least a portion of the emitting surface 12. The upper surface 24 is opposite to at least a portion of the emitting surface 12 via a gap. The part 211 includes the upper surface 24.

The surface (upper surface) of the substrate P (object) is able to be opposite to at least a portion of the emitting surface 12 and the lower surface 25. The surface (upper surface) of the substrate P (object) is able to be opposite to at least a portion of the emitting surface 12 and the lower surface 25 via a gap. At least a portion of the lower surface 25 is able to be opposite to the second member 22. The lower surface 25 is opposite to the second member 22 via a gap. The part 211 includes the lower surface 25.

At least a portion of the inner surface 26 is opposite to the outer surface 131. The inner surface 26 is opposite to the outer surface 131 via a gap. A portion (lower part) of the inner surface 26 is disposed at the surrounding of the optical path ATL. A portion (upper part) of the inner surface 26 is disposed at the surrounding of the terminal optical element 13 (optical path ATO). A lower end of the inner surface 26 is connected to an outer edge of the upper surface 24. The part 211 includes a portion (lower part) of the inner surface 26. The part 212 includes a portion (upper part) of the inner surface 26.

At least a portion of the outer surface 27 is opposite to the second member 22 via a gap. A lower end of the outer surface 27 is connected to an outer edge of the lower surface 25. The part 211 includes a portion (lower part) of the outer surface 27. The part 212 includes a portion (upper part) of the outer surface 27.

The second member 22 includes a part 221 in which at least a portion is disposed below the first member 21, and a part 222 in which at least a portion is disposed outside the first member 21 with respect to the optical path AT. The part 222 is disposed outside the part 221 with respect to the optical path AT. In the present embodiment, the second member 22 is an annular member. The part 221 is disposed at the surrounding of the optical path ATL below the first member 21. The part 222 is disposed at the surrounding of the terminal optical element 13 (optical path ATO) and the first member 21.

The first member 21 is disposed at a position further away from the substrate P (object) than the part 221 of the second member 22. The part 221 of the second member 22 is disposed between the first member 21 and the substrate P (object). The second member 22 is disposed so that the substrate P (object) is able to be opposite to the second member.

The second member 22 includes a second opening part 28 through which the exposure light EL emitted from the emitting surface 12 is able to pass, an upper surface 29 in which at least a portion is opposite to the first member 21, a lower surface 30 to which the substrate P (object) is able to be opposite, and an inner surface 31 in which at least a portion is opposite to the outer surface 27 of the first member 21. At least a portion of the upper surface 29 faces the +Z axis direction. At least a portion of the lower surface 30 faces the −Z axis direction.

The second opening part 28 is formed so as to connect the upper surface 29 and the lower surface 30. The upper surface 29 is disposed at the surrounding of an upper end of the second opening part 28. The lower surface 30 is disposed at the surrounding of a lower end of the second opening part 28.

The upper surface 29 is able to be opposite to at least a portion of the lower surface 25. The upper surface 29 is opposite to at least a portion of the lower surface 25 via a gap. The part 221 includes the upper surface 29.

The surface (upper surface) of the substrate P (object) is able to be opposite to the lower surface 30. The surface (upper surface) of the substrate P (object) is able to be opposite to the lower surface 30 via a gap. The part 221 includes the lower surface 30.

At least a portion of the inner surface 31 is opposite to the outer surface 27. The inner surface 31 is opposite to the outer surface 27 via a gap. A portion (lower part) of the inner surface 31 is disposed at the surrounding of the optical path ATL. A portion (upper part) of the inner surface 31 is disposed at the surrounding of the first member 21. A lower end of the inner surface 31 is connected to an outer edge of the upper surface 29. The part 222 includes the inner surface 31.

Figure 5:
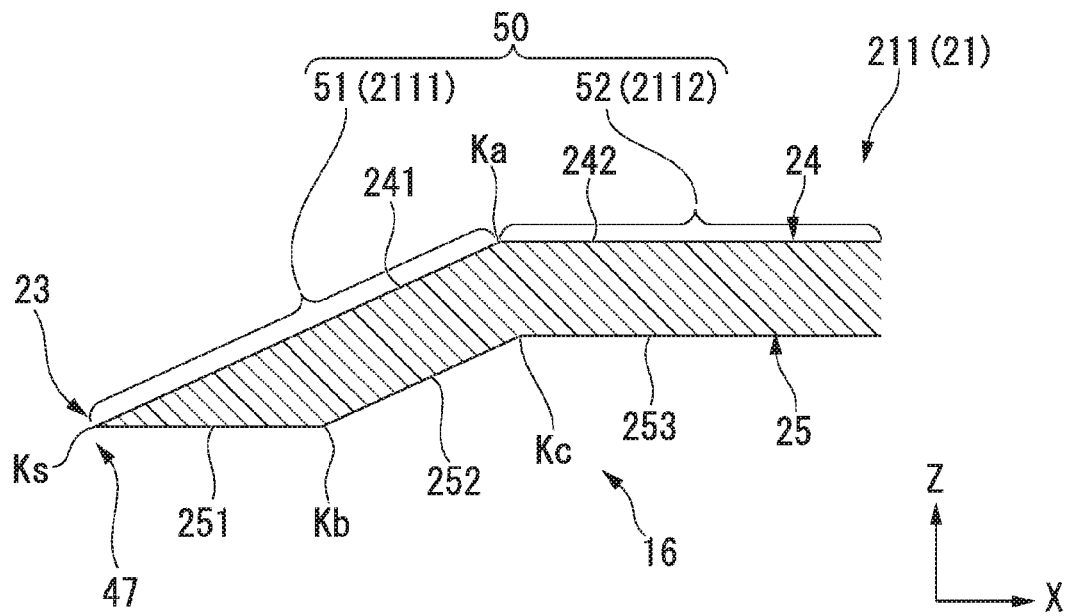
FIG. 5 is a side cross-sectional view showing a portion of a first member according to the first embodiment.

FIG. 5 is a cross-sectional view of the first member 21 (part 211) showing the vicinity of the first opening part 23.

As shown in FIGS. 3 and 5, the upper surface 24 includes a region 241, and a region 242 which is disposed outside the region 241 with respect to the optical path AT. At least a portion of the upper surface 24 is able to be opposite to the emitting surface 12.

The region 242 is disposed above the region 241.

An angle between the optical axis AX of the terminal optical element 13 and the region 241 is different from an angle between the optical axis AX and the region 242.

The region 241 is inclined with respect to the optical axis AX. The region 241 is upwardly and outwardly inclined in the radial direction with respect to the optical axis AX.

The region 242 is substantially perpendicular with respect to the optical axis AX. That is, the region 242 is substantially parallel to the XY plane.

A corner portion Ka is formed between the region 241 and the region 242.

A size of the region 242 is larger than a size of the region 241 in the radial direction with respect to the optical axis AX.

As shown in FIGS. 3 and 5, the lower surface 25 includes a region 251, a region 252 which is disposed outside the region 251 with respect to the optical path AT, a region 253 which is disposed outside the region 252 with respect to the optical path AT, a region 254 which is disposed outside the region 253 with respect to the optical path AT, and a region 255 which is disposed outside the region 254 with respect to the optical path AT. At least a portion of the lower surface 25 is able to be opposite to the upper surface 29 of the second member 22.

The region 252, the region 253, the region 254, and the region 255 are disposed above the region 251. The region 253, the region 254, and the region 255 are disposed above the region 252. With respect to the Z axis direction, the position (height) of the region 253, the position (height) of the region 254, and the position (height) of the region 255 are substantially the same.

The angle between the optical axis AX and the region 251 is different from the angle between the optical axis AX and the region 252. The angle between the optical axis AX and the region 252 is different from an angle between the optical axis AX and the region 253. The angle between the optical axis AX and the region 253 is substantially the same as an angle between the optical axis AX and the region 254. The angle between the optical axis AX and the region 254 is substantially the same as an angle between the optical axis AX and the region 255.

The region 252 is inclined with respect to the optical axis AX. The region 252 is upwardly and outwardly inclined in the radial direction with respect to the optical axis AX.

In the present embodiment, the region 251 is substantially perpendicular to the optical axis AX. That is, the region 251 is substantially parallel to the XY plane. The region 253 is substantially perpendicular to the optical axis AX. That is, the region 253 is substantially parallel to the XY plane. The region 252 is an inclined region which connects the region 251 and the region 253. A step is formed between the region 251 and the region 253.

A corner portion Kb is formed between the region 251 and the region 252. A corner portion Kc is formed between the region 252 and the region 253.

In the descriptions below, in the lower surface 25 of the first member 21, a part outside the region 251 with respect to the optical path AT (optical axis AX) is appropriately referred to as a recessed part 16. At least a portion of the region 252 and at least a portion of the region 253 are disposed inside the recessed part 16. The second member 22 is able to be opposite to the recessed part 16.

Each of the region 254 and the region 255 is substantially perpendicular to the optical axis AX. That is, each of the region 254 and the region 255 is substantially parallel to the XY plane.

A size of the region 253 is larger than a size of the region 251 in the radial direction with respect to the optical axis AX. The size of the region 253 is larger than a size of the region 252 in the radial direction with respect to the optical axis AX.

A corner portion Ks is formed between the region 241 and the region 251. The corner portion Ks includes an inner edge part of the region 251.

In the present embodiment, the region 251 is the lowermost part of the first member 21. The region 251 is a part nearest to the surface (upper surface) of the substrate P (object) in the first member 21.

Moreover, the region 251 includes a part nearest to the optical path AT (ATL) in the first member 21. In the present embodiment, the inner edge part of the region 251 is a part nearest to the optical path AT in the first member 21.

The inner edge part of the region 251 defines the first opening part 23. The inner edge part of the region 251 is disposed at the surrounding of the first opening part 23. The inner edge part of the region 251 defines at least a portion of the part of the surrounding of the first opening part 23.

Figure 6:
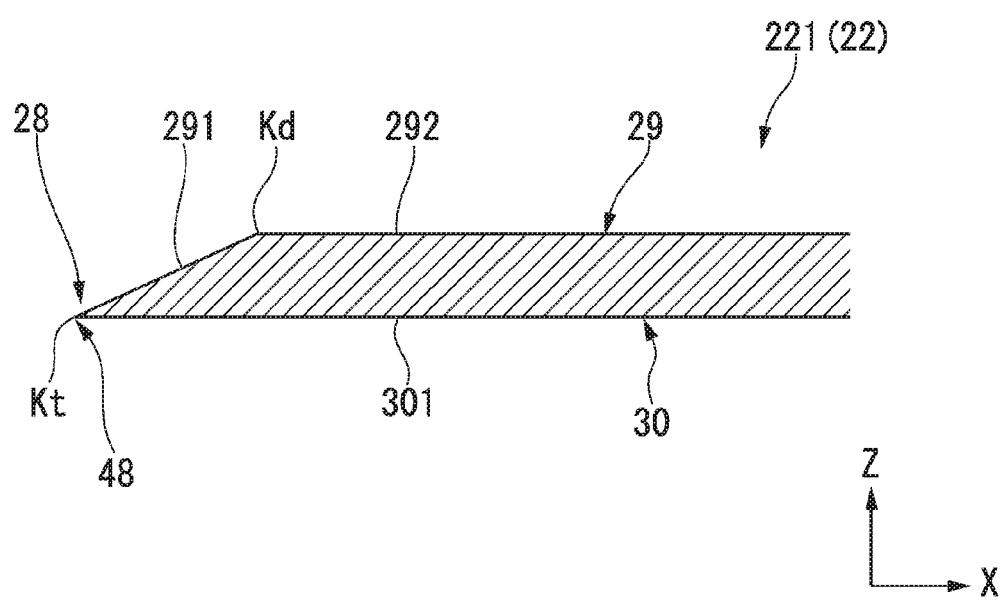
FIG. 6 is a side cross-sectional view showing a portion of a second member according to the first embodiment.

FIG. 6 is cross-sectional view of the second member 22 (part 221) showing the vicinity of the second opening part 28.

As shown in FIGS. 3 and 6, the upper surface 29 includes a region 291, and a region 292 which is disposed outside the region 291 with respect to the optical path AT. The upper surface 29 is able to be opposite to at least a portion of the lower surface 25.

The region 292 is disposed above the region 291.

An angle between the optical axis AX of the terminal optical element 13 and the region 291 is different from an angle between the optical axis AX and the region 292.

The region 291 is inclined with respect to the optical axis AX. The region 291 is upwardly and outwardly inclined in the radial direction with respect to the optical axis AX.

The region 292 is substantially perpendicular with respect to the optical axis AX. That is, the region 292 is substantially parallel to the XY plane.

A corner portion Kd is formed between the region 291 and the region 292.

A size of the region 292 is larger than a size of the region 291 in the radial direction with respect to the optical axis AX.

The region 291 faces the optical path AT (ATL). The region 291 may also be referred to as an end surface of the second member 22 facing the optical path AT.

As shown in FIGS. 3 and 6, the lower surface 30 includes a region 301, a region 302 which is disposed outside the region 301 with respect to the optical path AT, and a region 303 which is disposed outside the region 302 with respect to the optical path AT. The lower surface 30 is able to be opposite to the surface (upper surface) of the substrate P (object).

The region 302 and the region 303 are disposed above the region 301. Moreover, the region 303 is disposed above the region 302.

An angle between the optical axis AX and the region 301 is substantially the same as an angle between the optical axis AX and the region 302. The angle between the optical axis AX and the region 302 is substantially the same as an angle between the optical axis AX and the region 303.

Each of the region 301, the region 302, and the region 303 is substantially perpendicular to the optical axis AX. That is, each of the region 301, the region 302, and the region 303 is substantially parallel to the XY plane.

A corner portion Kt is formed between the region 291 and the region 301. The corner portion Kt includes an inner edge part of the region 301.

In the present embodiment, the region 301 is a lowermost part of the second member 22. The region 301 is a part nearest to the surface (upper surface) of the substrate P (object) in the second member 22.

Moreover, the region 301 includes a part nearest to the optical path AT (ATL) in the second member 22. In the present embodiment, the inner edge part of the region 301 is a part nearest to the optical path AT in the second member 22.

The inner edge part of the region 301 defines the second opening part 28. The inner edge part of the region 301 is disposed at the surrounding of the second opening part 28. The inner edge part of the region 301 defines at least a portion of the surrounding of the second opening part 28.

As shown in FIG. 3, the inner surface 26 is disposed above the upper surface 24. At least a portion of the inner surface 26 is upwardly and outwardly inclined in the radial direction with respect to the optical axis AX. In the present embodiment, the inner surface 26 includes a region 261 which is disposed outside the upper surface 24 with respect to the optical path AT, a region 262 which is disposed outside the region 261 with respect to the optical path AT, and a region 263 which is disposed outside the region 262 with respect to the optical path AT. At least a portion of the inner surface 26 is able to be opposite to the outer surface 131 of the terminal optical element 13. The size of a gap formed between the inner surface 26 and the outer surface 131 is D3.

The region 261 is connected to the outer edge of the upper surface 24. The region 261 is disposed above the upper surface 24. The region 262 is disposed above the region 261. The region 263 is disposed above the region 262.

An angle between the optical axis AX and the region 261 is different from an angle between the optical axis AX and the region 262. The angle between the optical axis AX and the region 262 is different from an angle between the optical axis AX and the region 263. The angle between the optical axis AX and the region 261 is substantially the same as the angle between the optical axis AX and the region 263.

The region 261 is inclined with respect to the optical axis AX. The region 261 is upwardly and outwardly inclined in the radial direction with respect to the optical axis AX. The region 263 is inclined with respect to the optical axis AX. The region 263 is upwardly and outwardly inclined in the radial direction with respect to the optical axis AX.

In the present embodiment, the region 262 is substantially perpendicular to the optical axis AX. That is, the region 262 is substantially parallel to the XY plane. A corner portion is formed between the region 261 and the region 262. A corner portion is formed between the region 262 and the region 263. A size of a gap formed between the region 261 and the outer surface 131 is D3. In the present embodiment, a size of a gap formed between the region 263 and the outer surface 131 may be larger than the size D3 or may be the same as the size D3. In this case, the region 262 may not be provided.

As shown in FIG. 3, the outer surface 27 and the inner surface 31 are substantially parallel to the optical axis AX. Moreover, at least a portion of the outer surface 27 may be upwardly and outwardly inclined in the radial direction with respect to the optical axis AX. At least a portion of the inner surface 31 may be upwardly and outwardly inclined in the radial direction with respect to the optical axis AX.

The upper surface 24 including the region 241 and the region 242 is a non-recovery region which is not able to recover the liquid LQ. At least a portion of the upper surface 24 is able to hold the liquid LQ between the upper surface 24 and the terminal optical element 13.

The region 251, the region 252, the region 253, and the region 255 of the lower surface 25 are non-recovery regions which are not able to recover the liquid LQ. The region 254 of the lower surface 25 is a recovery region which is able to recover the liquid LQ. At least a portion of the lower surface 25 is able to hold the liquid LQ between the substrate P (object) and the second member 22.

The inner surface 26 including the region 261, the region 262, and the region 263 is a non-recovery region which is not able to recover the liquid LQ. At least a portion of the inner surface 26 is able to hold the liquid LQ between the inner surface 26 and the terminal optical element 13.

The upper surface 29 including the region 291 and the region 292 is a non-recovery region which is not able to recover the liquid LQ. At least a portion of the upper surface 29 is able to hold the liquid LQ between the upper surface 29 and the first member 21.

The region 301 and the region 303 of the lower surface 30 are non-recovery regions which are not able to recover the liquid LQ. The region 302 of the lower surface 30 is a recovery region which is able to recover the liquid LQ. At least a portion of the lower surface 30 is able to hold the liquid LQ between the lower surface 30 and the substrate P (object).

As shown in FIGS. 2, 4, or the like, a size of the second opening part 28 is larger than a size of the first opening part 23 in the X axis direction. The size of the second opening part 28 is larger than the size of the first opening part 23 in the Y axis direction. The second opening part 28 is larger than the first opening part 23 in the XY plane. At least a portion of the optical path AT (ATL) and the first member 21 is disposed inside the second opening part 28 in the XY plane. The optical path AT (ATL) is disposed inside the first opening part 23. As shown in FIG. 4, in the XY plane, the first opening part 23 has a square shape (rectangular shape) which is long in the X axis direction. The second opening part 28 also has a square shape (rectangular shape) which is long in the X axis direction.

As shown in FIGS. 2, 3, or the like, in the present embodiment, the first member 21 is disposed so that the optical axis AX of the terminal optical element 13 and a center of the first opening part 23 substantially coincide with each other. When the second member 22 is disposed at an origin point in which the optical axis AX of the terminal optical element 13 and the center of the first opening part 28 substantially coincide with each other, the center of the first opening part 23 and the center of the second opening part 28 substantially coincide with each other. When the second member 22 is disposed at the origin point, an inner edge of the second member 22 (inner edge of the lower surface 30, inner edge of the region 301) defining the second opening part 28 is positioned outside an inner edge of the first member 21 (inner edge of the lower surface 25, inner edge of the region 251) defining the first opening part 23 with respect to the optical path AT. When the second member 22 is disposed at the origin point, the upper surface 29 of the second member 22 is opposite to the first member 21 and is not opposite to the terminal optical element 13.

Figure 7:
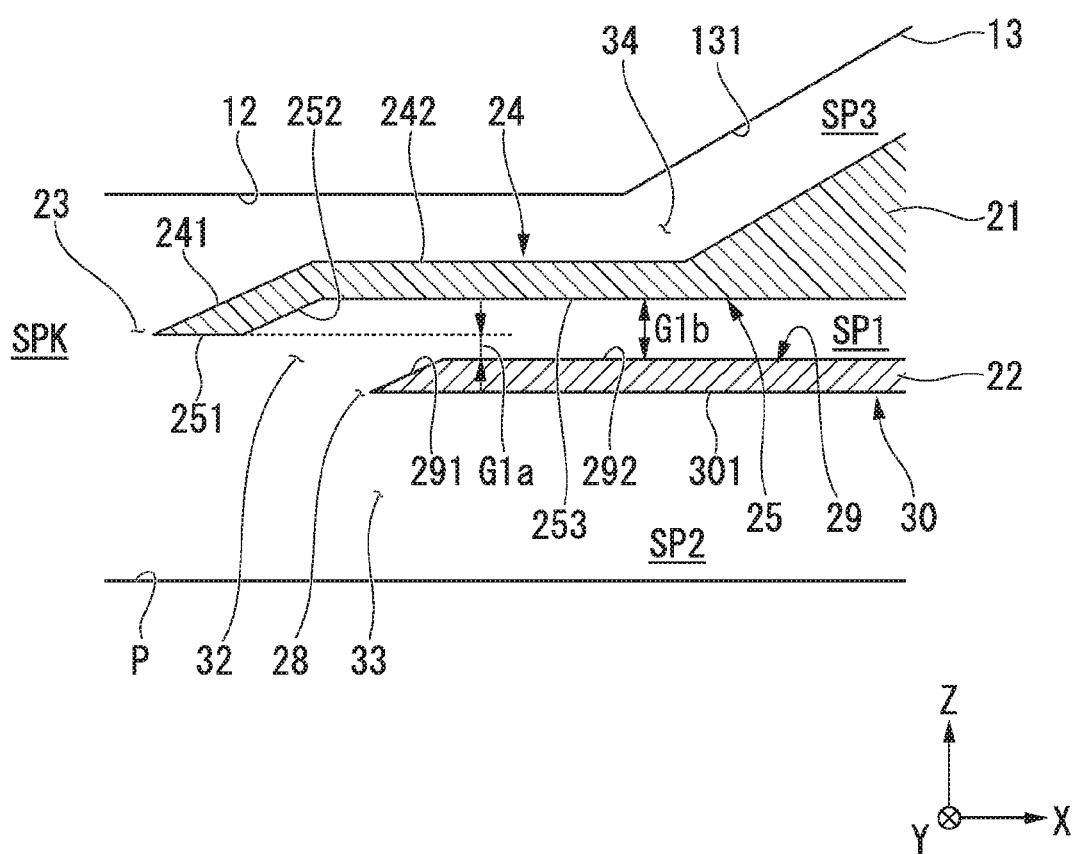
FIG. 7 is a side cross-sectional view showing a portion of the liquid immersion member according to the first embodiment.

FIG. 7 is a view showing the emitting surface 12, the upper surface 24, the lower surface 25, the upper surface 29, and the lower surface 30.

As shown in FIGS. 3 and 7, in the present embodiment, the upper surface 24 is disposed below the emitting surface 12. The lower surface 25 is disposed below the emitting surface 12 and the upper surface 24. The upper surface 29 is disposed below the emitting surface 12, the upper surface 24, and the lower surface 25. The lower surface 30 is disposed below the emitting surface 12, the upper surface 24, the lower surface 25, and the upper surface 29.

In the descriptions below, a space including the optical path ATL between the emitting surface 12 and the substrate P (object) is appropriately referred to as an optical path space SPK. The optical path space SPK includes a space between the emitting surface 12 and the substrate P (object) and a space between the emitting surface 12 and the upper surface 24.

Moreover, a space between the lower surface 25 and the upper surface 29 is appropriately referred to as a first space SP1.

Moreover, a space between the lower surface 30 and the upper surface of the substrate P (object) is appropriately referred to as a second space SP2.

In addition, a space between the outer surface 131 and the inner surface 26 is appropriately referred to as a third space SP3.

With respect to the Z axis direction, the size (the size of the gap between the emitting surface 12 and the upper surface of the substrate P) Dk of the optical path space SPK is larger than the size (the size of the gap between the lower surface 30 and the upper surface of the substrate P) D2 of the second space SP2.

With respect to the Z axis direction, the size (the size of the gap between the lower surface 25 and the upper surface 29) D1 of the first space SP1 is smaller than the size D2 of the second space SP2.

With respect to the Z axis direction, the size D1 of the first space SP1 may be substantially the same as the size D2 of the second space SP2 and may be larger than the size D2 of the second space SP2.

The region 251 is disposed above (at the +Z side of) the upper surface 29. The region 252 is disposed above (at the +Z side of) the upper surface 29 and the region 251. With the Z axis direction parallel to the optical axis AX of the terminal optical element 13, a distance G1$a$ between the region 251 and the upper surface 29 is smaller than a distance G1$b$ between the region 252 and the upper surface 29.

In the present embodiment, the space (the space between the emitting surface 12 and the upper surface 24) of the upper surface 24 side and the space (the space between the lower surface 25 and the upper surface of the substrate P) of the lower surface 25 side are connected to each other via the first opening part 23. The liquid LQ is able to circulate from one of the space on the upper surface 24 side and the space on the lower surface 25 side to the other space via the first opening part 23.

The optical path space SPK and the first space SP1 are connected to each other via an opening 32 (second opening part 28) between the inner edge of the lower surface 25 and the inner edge of the upper surface 29. The liquid LQ is able to circulate from one of the optical path space SPK and the first space SP1 to the other space via the opening 32.

The optical path space SPK and the second space SP2 are connected to each other via an opening 33 between the inner edge of the lower surface 25 and the upper surface of the substrate P. The liquid LQ is able to circulate from one of the optical path space SPK and the second space SP2 to the other space via the opening 33.

The optical path space SPK and the third space SP3 are connected to each other via an opening 34 between the lower end of the outer surface 131 and the lower end of the inner surface 26. The liquid LQ is able to circulate from one of the optical path space SPK and the third space SP3 to the other space via the opening 34.

The first space SP1 and the second space SP2 are connected to each other via the second opening part 28 (opening 32). The liquid LQ is able to circulate from one of the first space SP1 and the second space SP2 to the other space via the second opening part 28.

One end of the optical path AT side of the first space SP1 is connected to the optical path space SPK via the opening 32. The other end of the first space SP1 away from the optical path AT is connected to the space CS of the surrounding of the liquid immersion member 5 via the opening 35 between the outer edge of the lower surface 25 and the upper surface 29 and the gap between the outer surface 27 and the inner surface 31. The first space SP1 is opened to the outside space (atmosphere) CS of the liquid immersion member 5 via the opening 35, and the gap between the outer surface 27 and the inner surface 31. When the space CS is at the atmospheric pressure, the first space SP1 is opened to the atmosphere.

One end of the optical path AT side of the second space SP2 is connected to the optical path space SPK via the opening 33. The other end of the second space SP2 away from the optical path AT is connected to the space CS of the surrounding of the liquid immersion member 5 via an opening 36 between the outer edge of the lower surface 30 and the upper surface of the substrate P (object). The second space SP2 is opened to the outside space (atmosphere) CS of the liquid immersion member 5 via the opening 36. When the space CS is at the atmospheric pressure, the second space SP2 is opened to the atmosphere.

One end (lower end) of the optical path AT side of the third space SP3 is connected to the optical path space SPK via the opening 34. The other end (upper end) of the third space SP3 away from the optical path AT is connected to the space CS of the surrounding of the liquid immersion member 5 via an opening 37 between the outer surface 131 and the upper end of the inner surface 26. The third space SP3 is opened to the outside space (atmosphere) CS of the liquid immersion member 5 via the opening 37. When the space CS is at the atmospheric pressure, the third space SP3 is opened to the atmosphere.

In the present embodiment, movement of the liquid LQ from one of the first space SP1 at the upper surface 29 side and the second space SP2 at the lower surface 30 side to the other space without passing through the second opening part 28 is prevented. The first space SP1 and the second space SP2 are partitioned by the second member 22. The liquid LQ in the first space SP1 is able to move to the second space SP2 via the second opening part 28. The liquid LQ in the first space SP1 is not able to move to the second space SP2 without going through the second opening part 28. The liquid LQ, which exists in the first space SP1 outside the second opening part 28 with respect to the optical path AT, is not able to move to the second space SP2. The liquid LQ in the second space SP2 is able to move to the first space SP1 via the second opening part 28. The liquid LQ in the second space SP2 is not able to move the first space SP1 without going through the second opening part 28. The liquid LQ, which exists in the second space SP2 outside the second opening part 28 with respect to the optical path AT, is not able to move to the first space SP1. That is, in the present embodiment, the liquid immersion member 5 does not include a channel, which fluidly connects the first space SP1 and the second space SP2, except for the second opening part 28.

In the present embodiment, a portion of an interface LG of the liquid LQ in the liquid immersion space LS is formed between the second member 22 and the substrate P (object). A portion of the interface LG of the liquid LQ in the liquid immersion space LS is formed between the first member 21 and the second member 22. A portion of the interface LG of the liquid LQ in the liquid immersion space LS is formed between the terminal optical element 13 and the first member 21.

In the descriptions below, the interface LG of the liquid LQ which is formed between the first member 21 and the second member 22 is appropriately referred to as a first interface LG1. The interface LG which is formed between the second member 22 and the substrate P (object) is appropriately referred to as a second interface LG2. The interface LG which is formed between the terminal optical element 13 and the first member 21 is appropriately referred to as a third interface LG3.

The liquid immersion member 5 includes a liquid supply part 41 which is able to supply the liquid LQ for forming the liquid immersion space LS.

The liquid supply part 41 is disposed above the part 221 of the second member 22.

The liquid supply part 41 is disposed at the first member 21. The liquid supply part 41 faces the third space SP3. The liquid supply part 41 is disposed at the inner surface 26 of the first member 21 to face the third space SP3.

The liquid supply part 41 includes an opening (liquid supply port) which is disposed at the inner surface 26 of the first member 21. The liquid supply part 41 is disposed to be opposite to the outer surface 131. The liquid supply part 41 supplies the liquid LQ to the third space SP3 between the outer surface 131 and the inner surface 26.

In the present embodiment, the liquid supply part 41 is disposed at each of the +X side and the −X side with respect to the optical path AT (terminal optical element 13).

In addition, the liquid supply part 41 may be disposed in the Y axis direction with respect to the optical path AT (terminal optical element 13), and a plurality of the liquid supply parts 41 may be disposed at the surrounding of the optical path AT (terminal optical element 13) including the X axis direction and the Y axis direction. One liquid supply part 41 may be provided.

Moreover, the liquid supply part 41 is disposed at the first member 21 to face the optical path space SPK. For example, the liquid supply part 41 may be provided at the lower end of the region 261 of the inner surface 26.

The liquid supply part (liquid supply port) 41 is connected to a liquid supply apparatus 41S via a supply channel 41R which is formed in the inner portion of the first member 21. The liquid supply apparatus 41S is able to supply the cleaned liquid LQ, in which the temperature is adjusted, to the liquid supply part 41. The liquid supply part 41 supplies the liquid LQ from the liquid supply apparatus 41S to form the liquid immersion space LS.

At least a portion of the liquid LQ, which is supplied from the liquid supply part 41 to the third space SP3, is supplied to the optical path space SPK via the opening 34. Accordingly, the optical path ATL is filled with the liquid LQ. In addition, at least a portion of the liquid LQ, which is supplied from the liquid supply part 41 to the optical path space SPK, is supplied to the first space SP1 via the opening 32. Moreover, at least a portion of the liquid LQ, which is supplied from the liquid supply part 41 to the optical path space SPK, is supplied to the second space SP2 via the opening 33.

The liquid immersion member 5 includes a liquid recovery part 42 which is able to recover the liquid LQ, and a liquid recovery part 43 which is able to recover the liquid LQ. Moreover, the liquid recovery part 43 may also be referred to as a fluid recovery part 43.

The liquid recovery part 42 is disposed outside the liquid supply part 41 in the radial direction with respect to the optical axis AX (optical path AT).

The liquid recovery part 42 is disposed at the first member 21. The liquid recovery part 42 faces the first space SP1. The liquid recovery part 42 is disposed at the lower surface 25 of the first member 21 in order to face the first space SP1. The liquid recovery part 42 is disposed at the first member 21 so that the second member 22 is opposite to the liquid recovery part 42.

The liquid recovery part 42 includes an opening (liquid recovery port) which is disposed at the lower surface 25 of the first member 21. The liquid recovery part 42 is disposed at the first member 21 to be opposite to the upper surface 29 of the second member 22. The liquid recovery part 42 recovers at least a portion of the liquid LQ in the first space SP1 between the lower surface 25 and the upper surface 29.

The liquid recovery part 42 is disposed at the region (recovery region) 254 of the lower surface 25. The liquid recovery part 42 is disposed at the surrounding of the optical path AT of the exposure light EL. The liquid recovery part 42 is disposed to surround the optical path AT.

In addition, a plurality of the liquid recovery parts 42 may be disposed at the surrounding of the optical path AT of the exposure light EL. The plurality of liquid recovery parts 42 may be disposed with intervals in the surrounding of the optical path AT.

In the present embodiment, the liquid recovery part 42 recovers at least a portion of the liquid LQ in the first space SP1, and does not recover the liquid LQ in the second space SP2.

The liquid recovery part 42 (liquid recovery port) is connected to a liquid recovery apparatus 42C via a recovery channel (space) 42R formed inside the first member 21. The liquid recovery apparatus 42C is able to connect the liquid recovery part 42 and a vacuum system (not shown). The liquid recovery part 42 is able to recover at least a portion of the liquid LQ in the first space SP1. At least a portion of the liquid LQ in the first space SP1 is able to flow into the recovery channel 42R via the liquid recovery part 42 (liquid recovery port). Moreover, the liquid recovery part 42 may recover the liquid LQ, which has flowed onto the upper surface 29 of the second member 22 from the third space SP3 via a space between the outer surface 27 of the first member 21 and the inner surface 31 of the second member 22 and through the upper surface of the first member 21. That is, the liquid recovery part 24 may be used as a recovery part which recovers the liquid LQ on the upper surface 25 of the second member 22 which comes from the space SP3 without going through the opening part 23. Of course, the recovery part which recovers the liquid LQ from the space SP3 may be provided at the upper surface of the first member 21, and may be provided at at least one of the upper surface 29 and the inner surface 31 of the second member 22.

Moreover, at least one of the channel which connects the space between the lower surface 25 (253 or the like) of the first member 21 and the upper surface 221 of the second member 22, and the third space SP3, and the channel which connects the space between the outer surface 27 of the first member 21 and the inner surface 31 of the second member 22, and the third space SP3, may be provided at the first member 21, and via which the liquid LQ may flow to the space between the first member 21 and the second member 22 from the third space SP3.

In the present embodiment, the liquid recovery part 42 includes a porous member 44. The liquid recovery port includes holes of the porous member 44. In the present embodiment, the porous member 44 includes a mesh plate. The porous member 44 includes a lower surface to which the upper surface 29 is able to be opposite, an upper surface which faces the recovery channel 42R, and a plurality of holes which connect the lower surface and the upper surface. The liquid recovery part 42 recovers the liquid LQ via holes of the porous member 44. In the present embodiment, the region (recovery region) 254 of the lower surface 25 includes the lower surface of the porous member 44. The liquid LQ in the first space SP1 recovered from the liquid recovery part 42 (the holes of the porous member 44) flows into the recovery channel 42R, flows through the recovery channel 42R, and is recovered by the liquid recovery apparatus 42C.

In the present embodiment, only the liquid LQ is substantially recovered via the liquid recovery part 42, and the recovery of gas is limited. The controller 6 adjusts a difference between a pressure (pressure in first space SP1) at the lower surface side of the porous member 44 and a pressure (pressure in recovery channel 42R) at the upper surface side so that the liquid LQ in the first space SP1 passes through the holes of the porous member 44 to flow into the recovery channel 42R, and the gas does not pass through the holes. In the present embodiment, the first space SP1 is connected to the space CS. The controller 6 controls the chamber apparatus 9, and is able to adjust the pressure in the first space SP1. The controller 6 controls the liquid recovery apparatus 42C, and is able to adjust the pressure of the recovery channel 42R. Moreover, for example, an example of the technology, which recovers only the liquid via the porous member, is disclosed in U.S. Pat. No. 7,292,313 or the like.

In addition, both of the liquid LQ and the gas may be recovered (suctioned) via the porous member 44. That is, the liquid recovery part 42 may recover the liquid LQ along with the gas. Moreover, when the liquid LQ does not exist below the liquid recovery part 42, only the gas may be recovered from the liquid recovery part 42. In addition, the porous member 44 may not be provided at the first member 21. That is, a fluid (one or both of the liquid LQ and the gas G) in the first space SP1 may be recovered without going through the porous member.

The liquid recovery part 43 is disposed outside the liquid supply part 41 in the radial direction with respect to the optical axis AX (optical path AT).

The liquid recovery part 43 is disposed at the second member 22. The liquid recovery part 43 faces the second space SP2. The liquid recovery part 43 is disposed at the lower surface 30 of the second member 22 to face the second space SP2. The liquid recovery part 43 is disposed at the second member 22 so that the substrate P (object) is opposite to the liquid recovery part 43.

The liquid recovery part 43 includes an opening (liquid recovery port) which is disposed at the lower surface 30 of the second member 22. The liquid recovery part 43 is disposed at the second member 22 to be opposite to the upper surface of the substrate P (object). The liquid recovery part 43 recovers at least a portion of the liquid LQ in the second space SP2 between the lower surface 30 and the upper surface of the substrate P (object).

The liquid recovery part 43 is disposed at the region (recovery region) 302 of the lower surface 30. The liquid recovery part 43 is disposed at the surrounding of the optical path AT of the exposure light EL. The liquid recovery part 43 is disposed to surround the optical path AT.

In addition, a plurality of the liquid recovery parts 43 may be disposed at the surrounding of the optical path AT of the exposure light EL. The plurality of liquid recovery parts 43 may be disposed with intervals in the surrounding of the optical path AT.

In the present embodiment, the liquid recovery part 43 recovers at least a portion of the liquid LQ in the second space SP2, and does not recover the liquid LQ in the first space SP1.

The liquid recovery part 43 (liquid recovery port) is connected to a liquid recovery apparatus 43C via a recovery channel (space) 43R formed inside the second member 22. The liquid recovery apparatus 43C is able to connect the liquid recovery part 43 and the vacuum system (not shown). The liquid recovery part 43 is able to recover at least a portion of the liquid LQ in the second space SP2. At least a portion of the liquid LQ in the second space SP2 is able to flow into the recovery channel 43R via the liquid recovery part 43 (liquid recovery port).

In the present embodiment, the liquid recovery part 43 includes a porous member 45. The liquid recovery port includes holes of the porous member 45. In the present embodiment, the porous member 45 includes a mesh plate. The porous member 45 includes a lower surface to which the upper surface of the substrate P (object) is able to be opposite, an upper surface which faces the recovery channel 43R, and a plurality of holes which connect the lower surface and the upper surface. The liquid recovery part 43 recovers the liquid LQ via holes of the porous member 45. In the present embodiment, the region (recovery region) 302 of the lower surface 30 includes the lower surface of the porous member 45. The liquid LQ in the second space SP2 recovered from the liquid recovery part 43 (the holes of the porous member 45) flows into the recovery channel 43R, flows through the recovery channel 43R, and is recovered by the liquid recovery apparatus 43C.

In the present embodiment, the gas is recovered along with the liquid LQ via the liquid recovery part 43. In order words, the liquid recovery part 43 performs a gas-liquid mixture recovery with respect to the fluid (one or both of the liquid LQ and the gas) which exists in the second space SP2. Moreover, only the liquid LQ may be recovered via the porous member 45, and the recovery of the gas may be limited. In addition, the porous member 45 may not be provided at the second member 22. That is, the fluid (one or both of the liquid LQ and the gas) in the second space SP2 may be recovered without going through the porous member.

In the present embodiment, the lower surface of the fluid recovery part 43 includes the lower surface of the porous member 45. The lower surface of the fluid recovery part 43 is disposed at the surrounding of the lower surface 30. In the present embodiment, the lower surface of the fluid recovery part 43 is substantially parallel to the XY plane. In the present embodiment, the lower surface of the fluid recovery part 43 is positioned at more the +Z side than the lower surface 30.

In addition, the lower surface of the fluid recovery part 43 and the lower surface 30 may be disposed in the same plane (may be flush with each other). The lower surface of the fluid recovery part 43 may be disposed at more −Z side than the lower surface 30. Moreover, the lower surface of the fluid recovery part 43 may be inclined with respect to the lower surface 30, and may include a curved surface. For example, the lower surface of the fluid recovery part 43 (porous member 45) may be upwardly and outwardly inclined in the radial direction with respect to the optical path AT (optical axis AX). Moreover, the heights (positions in the Z axis direction) of the lower surface of the fluid recovery part 43 (porous member 45) may not be the same as the entire circumference of the surrounding of the second opening part 28. For example, a portion of the lower surface of the fluid recovery part 43 (porous member 45) positioned at both sides in the Y axis direction of the second opening part 28 may be lower than a portion of the lower surface of the fluid recovery part 43 (porous member 45) positioned at both sides in the X axis direction of the second opening part 28. For example, when the lower surface of the fluid recovery part 43 (porous member 45) of the second member 22 is opposite to the surface of the substrate P, the shape of the lower surface of the fluid recovery part 43 (porous member 45) may be determined so that a size (the distance in the Z axis direction) of a gap formed at one side in the Y axis direction with respect to the optical path K of the exposure light and is formed between the lower surface of the fluid recovery part 43 (porous member 45) and the surface of the substrate P is smaller than the size (the distance in the Z axis direction) of a gap which is formed at one side in the X axis direction with respect to the optical path K of the exposure light and is formed between the lower surface of the fluid recovery part 43 (porous member 45) and the surface of the substrate P.

In the present embodiment, the recovery channel 43R is disposed outside the inner surface 31 with respect to the optical path AT (optical axis AX). The recovery channel 43R is disposed above the liquid recovery part 43. By moving the second member 22, the fluid recovery part 43 and the recovery channel 43R of the second member 22 move outside the outer surface 27 of the first member 21.

In the present embodiment, the recovery operation of the liquid LQ from the liquid recovery part 43 is performed in parallel with the supply operation of the liquid LQ from the liquid supply part 41, and thus, the liquid immersion space LS is formed by the liquid LQ between the terminal optical element 13 and the liquid immersion member 5 at one side and the substrate P (object) at the other side.

Moreover, in the present embodiment, the recovery operation of the liquid LQ from the liquid recovery part 42 is performed in parallel with the supply operation of the liquid LQ from the liquid supply part 41, and the recovery part of the liquid LQ from the liquid recovery part 43.

In the present embodiment, the first interface LG1 is formed between the liquid recovery part 42 and the upper surface 29. The second interface LG2 is formed between the liquid recovery part 43 and the upper surface of the substrate P (object).

In the present embodiment, the first interface LG1 is formed between the liquid recovery part 42 and the upper surface 29, and the liquid LQ in the first space SP1 is prevented from moving to the space (for example, the space between the outer surface 27 and the inner surface 31) outside the liquid recovery part 42. The liquid LQ does not exist in the space between the outer surface 27 and the inner surface 31. The space between the outer surface 27 and the inner surface 31 is a gas space. Accordingly, the second member 22 is able to move smoothly.

Moreover, in the present embodiment, even when the liquid LQ moves (flows) outside the first space SP1 (outside the outer surface 27) with respect to the optical path AT, due to the inner surface 31, the liquid LQ is prevented from moving (flowing out) to substrate P (second space SP2).

In the present embodiment, the second member 22 is moved by an operation of a driving apparatus 46. For example, the driving apparatus 46 includes a motor. The driving apparatus 46 is able to move the second member 22 using Lorentz force. The driving apparatus 46 is able to move the second member 22 in six directions of the X axis, the Y axis, the Z axis, the θX, the θY, and the θZ directions. The driving apparatus 46 is able to move the second member 22 with respect to the terminal optical element 13 and the first member 21. The driving apparatus 46 is controlled by the controller 6.

The second member 22 is movable in at least one direction of the X axis, the Y axis, the Z axis, the θX, the θY, and the θZ directions.

In the present embodiment, the second member 22 is movable in at least the XY plane perpendicular to the optical axis AX (Z axis) of the terminal optical element 13. The second member 22 is able to move substantially parallel with the XY plane.

In the present embodiment, the second member 22 is movable in at least the X axis direction substantially perpendicular to the optical axis AX of the terminal optical element 13. In the descriptions below, the second member 22 moves in only the direction parallel to the X axis among six directions of the X axis, the Y axis, the Z axis, the θX, the θY, and the θZ directions.

In the present embodiment, the first member 21 is disposed in order to protect the terminal optical element 13. The first member 21 is disposed at the surrounding of the optical path AT in order to protect the terminal optical element 13. The first member 21 functions as a protection member which protects the terminal optical element 13.

At least a portion of the first member 21 functions as a protection which protects the terminal optical element 13. In the present embodiment, each of the parts 211 and 212 of the first member 21 functions as the protection part which protects the terminal optical element 13.

The part 211 of the first member 21 is disposed at the surrounding of the optical path ATL to protect the emitting surface 12 of the terminal optical element 13. At least a portion of the part 211 is disposed below the emitting surface 12 via a gap to protect the emitting surface 12.

The part 212 of the first member 21 is disposed at the surrounding of the optical path ATO (terminal optical element 13) to protect the outer surface 131 of the terminal optical element 13. At least a portion of the part 212 is disposed at the surrounding of the outer surface 131 via a gap to protect the outer surface 131.

In the descriptions below, the part 211 of the first member 21 is appropriately referred to as a protection part 211, and the part 212 is appropriately referred to as a protection part 212.

Each of the protection part 211 and the protection part 212 is disposed between the terminal optical element 13 and the second member 22 outside the optical path AT.

The first member 21 protects the terminal optical element 13 from the second member 22. The first member 21 prevents contact (collision) between the movable second member 22 and the terminal optical element 13.

At least a portion of the first member 21 decreases a change in pressure in which the terminal optical element 13 receives from the liquid LQ in the liquid immersion space LS. At least a portion of the first member 21 reduces the change in the pressure in which the terminal optical element 13 receives from the liquid LQ in the liquid immersion space LS. At least a portion of the first member 21 is able to remove the change in the pressure in which the terminal optical element 13 receives from the liquid LQ in the liquid immersion space LS.

The second member 22 moves in a state where the liquid immersion space LS is formed, and thus, the pressure of the liquid LQ acting on the terminal optical element 13 may be changed. In order words, the second member 22 moves in a state where at least a portion of the second member 22 is immersed into the liquid LQ in the liquid immersion space LS, and thus, the pressure of the liquid LQ acting on the terminal optical element 13 may be changed. At least a portion of the first member 21 decreases the change in the pressure in which the terminal optical element 13 receives from the liquid LQ in the liquid immersion space LS due to the movement of the second member 22.

In the present embodiment, at least a portion of the part 221 of the second member 22 moves in the state where the portion is immersed into the liquid LQ in the liquid immersion space LS. The part (protection part) 211 of the first member 21, which is disposed between the terminal optical element 13 and the part 221 of the second member 22, decreases the change in the pressure in which the terminal optical element 13 receives from the liquid LQ in the liquid immersion space LS.

The part (protection part) 211 forms a wall part 50 which is disposed between the terminal optical element 13 and the second member 22 (part 221). The wall part 50 partitions the space between the terminal optical element 13 and the first member 21 (part 211), and the space between the first member 211 (part 211) and the second member 22 (part 221).

As shown in FIG. 5, in the descriptions below, a portion of the wall part 50 including the region 241, the region 251, and the region 252 is appropriately referred to as a first wall part 51. The region including the region 242 and the region 253 is appropriately referred to as a second wall part 52. The first wall part 51 is a part closer to the optical path AT (ATL) than the corner portion Ka and the corner portion Kc. The first wall part 51 is a part closer to the optical path AT (ATL) than the second wall part 52. The first wall part 51 is disposed below the second wall part 52.

Moreover, in the descriptions below, in the protection part 211, the part corresponding to the first wall part 51 is appropriately referred to as a first protection part 2111, and the part corresponding to the second wall part 52 is appropriately referred to as a second protection part 2112.

In the present embodiment, the protection part 211 (wall part 50) includes the first opening part 23 through which the exposure light EL is able to pass.

The protection part 211 includes a part 47 nearest to the optical path AT (ATL) in the first member 21. In the present embodiment, the inner edge part (corner portion Ks) of the region 251 is the part 47 nearest to the optical path AT in the first member 21.

In the present embodiment, the part 47 is the lowermost part of the protection part 211. The part 47 is a part nearest to the surface (upper surface) of the substrate P (object) in the protection part 211.

The part 47 is disposed below the emitting surface 12 via a gap. The part 47 is disposed between the emitting surface 12 and the substrate P (object).

The part 47 defines the first opening part 23. The part 47 is disposed at the surrounding of the first opening part 23. The part 47 defines at least a portion of the part of the surrounding of the first opening part 23.

As shown in FIG. 6, the part 221 includes the second opening part 28 through which the exposure light EL is able to pass.

The part 221 includes a part 48 nearest to the optical path AT (ATL) in the second member 22. In the present embodiment, the inner edge part (corner portion Kt) of the region 301 is the part 48 nearest to the optical path AT in the second member 22.

In the present embodiment, the part 48 is the lowermost part of the protection part 221. The part 48 is a part nearest to the surface (upper surface) of the substrate P (object) in the part 221.

The part 48 is disposed below the lower surface 25 via a gap. The part 48 is disposed between the lower surface 25 and the substrate P (object).

The part 48 defines the second opening part 28. The part 48 is disposed at the surrounding of the second opening part 28. The part 48 defines at least a portion of the part of the surrounding of the second opening part 28.

With respect to the movement direction (X axis direction) of the second member 22, a size of the second opening part 28 is larger than the size of the first opening part 23. In the state where the second member 22 is disposed at the origin point, the part 48 of the second member 22 is disposed outside the part 47 of the first member 21 with respect to the optical path AT (ATL).

Figure 8:
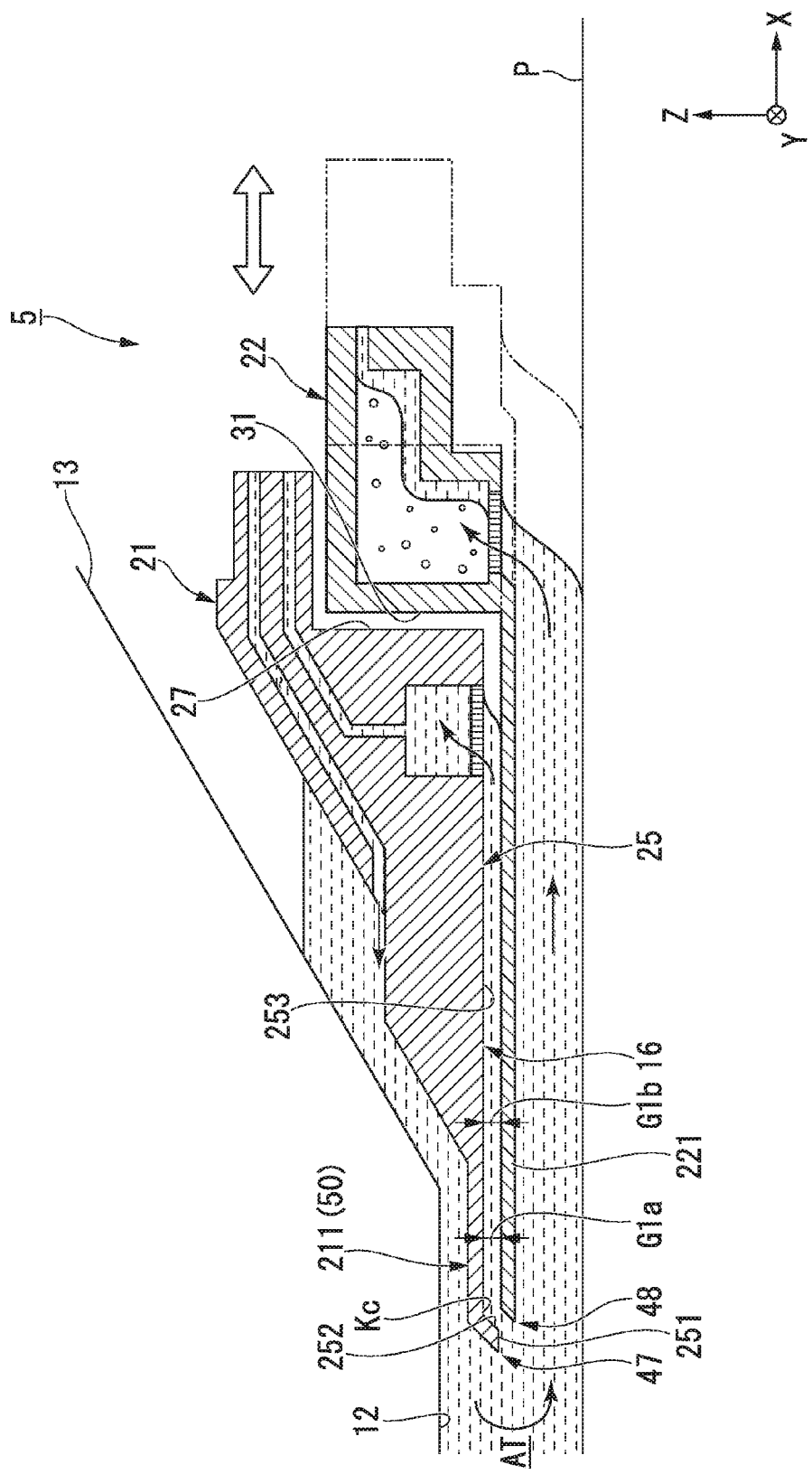
FIG. 8 is a view showing an example of an operation of the liquid immersion member according to the first embodiment.

FIG. 8 is a view showing an example of the operation of the second member 22. The second member 22 is movable within a movable range which is determined in the XY plane. In the present embodiment, the second member 22 moves within the movable range which is determined in the X axis direction. FIG. 8 shows a state where the second member 22 moves to the furthest −X side within the movable range.

The second member 22 moves, and thus, the size of the gap between the outer surface 27 of the first member 21 and the inner surface 31 of the second member 22 is changed. In order words, the second member 22 moves, and the size of the space between the outer surface 27 and the inner surface 31 is changed.

In the example shown in FIG. 8, the second member 22 moves in the −X axis direction, and thus, the size of the gap between the outer surface 27 and the inner surface 31 in the +X side with respect to the terminal optical element 13 is decreased (the space between the outer surface 27 and the inner surface 31 is decreased). The second member 22 moves in the −X axis direction, and thus, the size of the gap between the outer surface 27 and the inner surface 31 in the −X side with respect to the terminal optical element 13 is increased (the space between the outer surface 27 and the inner surface 31 is increased).

The second member 22 moves in the +X axis direction, and thus, the size of the gap between the outer surface 27 and the inner surface 31 in the +X side with respect to the terminal optical element 13 is increased (the space between the outer surface 27 and the inner surface 31 is increased). The second member 22 moves at the +X axis direction, and thus, the size of the gap between the outer surface 27 and the inner surface 31 at the −X side with respect to the terminal optical element 13 is decreased (the space between the outer surface 27 and the inner surface 31 is decreased).

For example, the movable range of the second member 22 may be determined so that the first member 21 (outer surface 29) and the second member 22 (inner surface 30) do not contact each other.

In the present embodiment, the part 48 of the second member 22 is continuously disposed outside the part 47 of the first member 21 with respect to the optical path AT (ATL).

In the present embodiment, even when the second member 22 moves with respect to the first member 21, the part 48 of the second member 22 is continuously disposed outside the part 47 of the first member 21 with respect to the optical path AT (ATL). In a movement period in which the second member 22 moves within the movable range, the part 48 of the second member 22 is continuously disposed outside the part 47 of the first member 21 with respect to the optical path AT (ATL).

For example, the movable range of the second member 22 may be determined so that the part 48 of the second member 22 is continuously disposed outside the part 47 of the first member 21 with respect to the optical path AT (ATL).

Based on the movable range of the second member 22 which is determined so that the first member 21 and the second member 22 do not contact each other in order to continuously dispose the part 48 of the second member 22 outside the part 47 of the first member 21 with respect to the optical path AT (ATL), one or both of the size of the first opening part 23 and the size of the second opening part 28 in the movement direction (X axis direction) of the second member 22 may be determined.

The movable range of the second member 22 may be determined to not contact the first member 21 and the second member 22 to each other, based on one or both of the size of the first opening part 23 and the size of the second opening part 28 in the movement direction (X axis direction) of the second member 22 so that the part 48 of the second member 22 is continuously disposed outside the part 47 of the first member 21 with respect to the optical path AT (ATL).

As shown in FIG. 8, in the state where the second member 22 moves to the furthest −X side in the movable range, the part 48 of the second member 22 is disposed outside the part 47 of the first member 21 at the +X side with respect to the optical path AT (optical axis AX). Moreover, in the state where the second member 22 moves to the furthest −X side in the movable range, the part 48 of the second member 22 is disposed outside the part 47 of the first member 21 at the −X side with respect to the optical path AT (optical axis AX).

Moreover, in a state where the second member 22 moves to the furthest +X side in the movable range, the part 48 of the second member 22 is disposed outside the part 47 of the first member 21 at the −X side with respect to the optical path AT (optical axis AX). In addition, in the state where the second member 22 moves to the furthest +X side in the movable range, the part 48 of the second member 22 is disposed outside the part 47 of the first member 21 at the +X side with respect to the optical path AT (optical axis AX).

In the movement period of the second member 22 which moves within the movable range, the protection part 211 (wall part 50) is disposed between the terminal optical element 13 and the second member 22 so that the terminal optical element 13 and the second member 22 (part 221) are not opposite to each other. In order words, in the movement period in which the second member 22 moves within the movable range, the protection part 211 is always disposed between the terminal optical element 13 and the second member 22 (part 221). The protection part 211 prevents the terminal optical element 13 and the second member 22 (part 221) from being opposite to each other.

In the present embodiment, the second member 22 (part 221) moves below the region 253 of the lower surface 25. That is, the part 48 of the second member 22 moves below the lower surface 25 so that the part 48 of the second member 22 does not move inside the inner edge (corner portion Kc) of the region 253 in the radial direction with respect to the optical axis AX. In order words, the second member 22 (the part 48 of the second member 22) moves outside the region 251 and the region 252 with respect to the optical path AT (ATL).

Moreover, the second member 22 (part 221) may move below the region 252 and the region 253 of the lower surface 25. That is, the part 48 of the second member 22 moves below the lower surface 25 so that the part 48 of the second member 22 does not move inside the inner edge (corner portion Kb) of the region 252 in the radial direction with respect to the optical axis AX. In order words, the second member 22 (the part 48 of the second member 22) may move outside the region 251 with respect to the optical path AT (ATL).

That is, the second member 22 may move below the recessed part 16 of the first member 21.

As shown in FIGS. 7 and 8, the part 47 of the lowermost part of the protection part 211 (wall part 50) is disposed above the upper surface 29 of the second member 22. A gap is formed between the first member 21 and the upper surface 29 outside the part 47 with respect to the optical path AT (ATL). The size (distance) $G1a$ of the gap between the part 47 and the upper surface 29 is smaller than the size (distance) $G1b$ of the gap between the first member 21 and the upper surface 29 with respect to the z axis direction parallel to the optical axis AX of the terminal optical element 13.

The size $G1a$ is the distance between the part 47 and the region 292 in the Z axis direction. The size $G1b$ is the distance between the region 252 or the region 253 and the region 292 in the Z axis direction.

The size $G1a$ may be the distance between the part 47 and the region 291 in the Z axis direction. The size $G1b$ may be the distance between the region 252 or the region 253 and the region 291 in the Z axis direction.

Next, an example of the operation of the second member 22 will be described.

The second member 22 is movable in cooperation with the movement of the substrate P (object). The second member 22 is movable independent from the substrate P (object). The second member 22 is movable in parallel with at least a portion of the movement of the substrate P (object).

The second member 22 may move in parallel with at least a part of a period in which the substrate P (object) moves. The second member 22 may move in a movement direction of the substrate P (object). For example, in at least a part of the period in which the substrate P moves, the second member 22 is movable in the movement direction of the substrate P. For example, when the substrate P moves in one direction (for example, +X axis direction) in the XY plane, the second member 22 is movable in one direction (the +X axis direction) in the XY plane in synchronization with the movement of the substrate P.

The second member 22 is movable in a state where the liquid immersion space LS is formed. The second member 22 is movable in a state where the second member 22 contacts the liquid LQ in the liquid immersion space LS. The second member 22 is movable in a state where the liquid LQ exists in the first space SP1 and the second space SP2.

The second member 22 is movable in parallel with the supply of the liquid LQ from the liquid supply part 41.

The second member 22 is movable in parallel with the recovery of the liquid LQ from the liquid recovery part 42. The second member 22 is movable in parallel with the recovery of the liquid LQ from the liquid recovery part 43.

The second member 22 is movable in parallel with the supply of the liquid LQ from the liquid supply part 41 and the recovery of the liquid LQ from the liquid recovery part 42 (liquid recovery part 43).

The second member 22 is movable in at least a part of a period in which the exposure light EL is emitted from the emitting surface 12.

The second member 22 is movable in parallel with at least a part of a period in which the substrate P (object) moves in the state where the liquid immersion space LS is formed.

The second member 22 is movable in at least a part of a period in which the exposure light EL is emitted from the emitting surface 12 in the state where the liquid immersion space LS is formed.

The second member 22 may move in a state where the second member 22 and the substrate P (object) are not opposite to each other. For example, the second member 22 may move in a state where the object does not exist below the second member 22.

The second member 22 may move in the state where the liquid LQ does not exist in the space between the second member 22 and the substrate P (object). For example, the second member 22 may move in the state where the liquid immersion space LS is not formed.

In the present embodiment, for example, the second member 22 moves based on movement conditions of the substrate P (object). For example, the controller 6 moves the second member 22 in parallel with at least a portion of the movement of the substrate P (object) based on the movement conditions of the substrate P (object).

The controller 6 moves the second member 22 while performing the supply of the liquid LQ from the liquid supply part 41, the recovery of the liquid LQ from the liquid recovery part 42, and the recovery of the liquid LQ from the liquid recovery part 43 so that the liquid immersion space LS is continuously formed.

In the present embodiment, the second member 22 is movable so that a relative movement between the second member 22 and the substrate P (object) is decreased. In addition, the second member 22 is movable so that the relative movement between the second member 22 and the substrate P (object) is smaller than the relative movement between the first member 21 and the substrate P (object). The relative movement includes at least one of a relative speed and a relative acceleration.

For example, the second member 22 may move in synchronization with the substrate P (object). The second member 22 may move to follow the substrate P (object).

The second member 22 is movable so that the relative speed between the second member 22 and the substrate P (object) is decreased. For example, in the state where the liquid immersion space LS is formed, that is, in a state where the liquid LQ exists in the second space SP2, the second member 22 may move so that the relative speed between the second member 22 and the substrate P (object) is decreased.

In addition, the second member 22 is movable so that the relative acceleration between the second member 22 and the substrate P (object) is decreased. For example, in the state where the liquid immersion space LS is formed, that is, in a state where the liquid LQ exists in the second space SP2, the second member 22 may move so that the relative acceleration between the second member 22 and the substrate P (object) is decreased.

In addition, the second member 22 is movable so that the relative speed between the second member 22 and the substrate P (object) is smaller than the relative speed between the first member 21 and the substrate P (object). For example, in the state where the liquid immersion space LS is formed, that is, in a state where the liquid LQ exists in the second space SP2, the second member 22 may move so that the relative speed between the second member 22 and the substrate P (object) is smaller than the relative speed between the first member 21 and the substrate P (object).

In addition, the second member 22 is movable so that the relative acceleration between the second member 22 and the substrate P (object) is smaller than the relative acceleration between the first member 21 and the substrate P (object). For example, in the state where the liquid immersion space LS is formed, that is, in the state where the liquid LQ exists in the second space SP2, the second member 22 may move so that the relative acceleration between the second member 22 and the substrate P (object) is smaller than the relative acceleration between the first member 21 and the substrate P (object).

For example, the second member 22 is movable in the movement direction of the substrate P (object). For example, when the substrate P (object) moves in the +X axis direction, the second member 22 is movable in the +X axis direction. When the substrate P (object) moves in the −X axis direction, the second member 22 is movable in the −X axis direction. In addition, when the substrate P (object) moves in the +Y axis direction (or the −Y axis direction) while moving in the +X axis direction, the second member 22 is movable in the +X axis direction. Moreover, when the substrate P (object) moves in the +Y axis direction (or the −Y axis direction) while moving in the −X axis direction, the second member 22 is movable in the −X axis direction.

That is, in the present embodiment, when the substrate P (object) moves in the direction which includes the component of the X axis direction, the second member 22 moves in the X axis direction. For example, the second member 22 may move in the X axis direction in parallel with at least a portion of the movement of the substrate P (object) in the direction including the component in the X axis direction.

Moreover, the second member 22 is movable in the Y axis direction. When the substrate P (object) moves in the direction including the component in the Y axis direction, the second member 22 may move in the Y axis direction. For example, the second member 22 may move in the Y axis direction so that the differences of the relative speeds between the second member 22 and the substrate P (object) are decreased in parallel with at least a portion of the movement of the substrate P (object) in the direction including the component in the Y axis direction.

Next, a method of exposing the substrate P using the above-described exposure apparatus EX will be described.

In the description below, in order to form the liquid immersion space LS, the liquid LQ is supplied from the liquid supply part 41, and the liquid LQ is recovered from each of the liquid recovery part 42 and the liquid recovery part 43.

In addition, in order to form the liquid immersion space LS, for example, the liquid LQ is supplied from the liquid supply part 41, the liquid LQ is recovered from the liquid recovery part 43, and the liquid LQ may not be recovered from the liquid recovery part 42.

In a substrate exchange position away from the liquid immersion member 5, processing which carries (loads) the substrate P before the exposure to the substrate stage 2 (first holding part) is performed. In at least a portion of a period in which the substrate stage 2 is away from the liquid immersion member 5, the measurement stage 3 is disposed to be opposite to the terminal optical element 13 and the liquid immersion member 5. The controller 6 performs the supply of the liquid LQ from the liquid supply part 41, the recovery of the liquid LQ from the liquid recovery part 42, and the recovery of the liquid LQ from the liquid recovery part 43, and thus, forms the liquid immersion space LS on the measurement stage 3.

After the substrate P before the exposure is loaded on the substrate stage 2 and the measurement processing using the measurement stage 3 is terminated, the controller 6 moves the substrate stage 2 so that the terminal optical element 13 and the liquid immersion member 5 are opposite to the substrate stage 2 (substrate P). In the state where the terminal optical element 13 and the liquid immersion member 5 are opposite to the substrate stage 2 (substrate P), the recovery of the liquid LQ from the liquid recovery part 42 and the recovery of the liquid LQ from the liquid recovery part 43 are performed in parallel with the supply of the liquid LQ from the liquid supply part 41, and thus, the liquid immersion space LS is formed between the terminal optical element 13 and the liquid immersion member 5, and the substrate stage 2 (substrate P) so that the optical path ATL is filled with the liquid LQ.

The controller 6 starts the exposure processing of the substrate P. In the state where the liquid immersion space LS is formed on the substrate P, the controller 6 emits the exposure light EL from the illumination system IL. The illumination system IL illuminates the mask M with the exposure light EL. The exposure light EL from the mask M is radiated to the substrate P via the liquid LQ in the liquid immersion space LS between the projection optical system PL and the emitting surface 12, and the substrate P. Accordingly, the substrate P is exposed by the exposure light EL which is emitted from the emitting surface 12 via the liquid LQ in the liquid immersion space LS between the emitting surface 12 of the terminal optical element 13 and the substrate P, and the image of the pattern of the mask M is projected to the substrate P.

The exposure apparatus EX of the present embodiment is a scanning type exposure apparatus (a so-called scanning stepper) in which the mask M and the substrate P synchronously move in a predetermined scanning direction and the image of the pattern of the mask M is projected to the substrate P. In the present embodiment, the scanning direction of the substrate P (synchronous movement direction) is set to the Y axis direction, and the scanning direction (synchronous movement direction) of the mask M is also set to the Y axis direction. The controller 6 radiates the exposure light EL to the substrate P via the projection optical system PL and the liquid LQ in the liquid immersion space LS on the substrate P while moving the substrate P in the Y axis direction with respect to the projection region PR of the projection optical system PL and moving the mask M in the Y axis direction with respect to the illumination region IR of the illumination system IL in synchronization with the movement in the Y axis direction of the substrate P.

Figure 9:
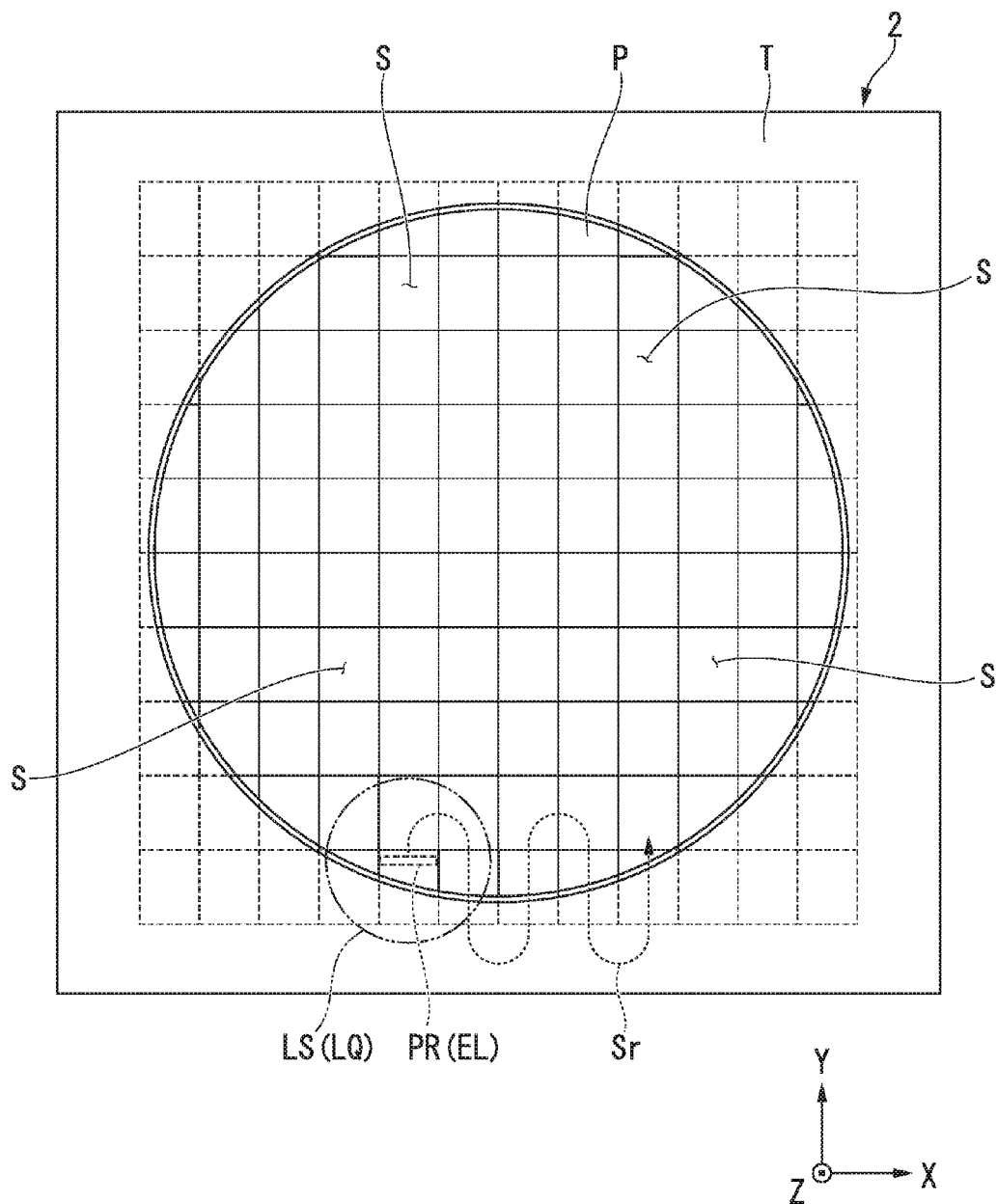
FIG. 9 is a view for explaining an example of an operation of the exposure apparatus according to the first embodiment.

FIG. 9 is a view showing an example of the substrate P which is held by the substrate stage 2. In the present embodiment, a plurality of shot regions S, which are regions to be exposed on the substrate P, are arranged in a matrix form. The controller 6 sequentially exposes the plurality of shot regions S of the substrate P by the exposure light EL emitted from the emitting surface 12 via the liquid LQ in the liquid immersion space LS between the emitting surface 12 and the substrate P while moving the substrate P held in the first holding part in the Y axis direction (scanning direction) with respect to the exposure light EL emitted from the emitting surface 12 of the terminal optical element 13.

For example, in order to expose one shot region S of the substrate P, in the state where the liquid immersion space LS is formed, the controller 6 radiates the exposure light EL to the shot region S via the projection optical system PL and the liquid LQ in the liquid immersion space LS on the substrate P while moving the substrate P in the Y axis direction with respect to the exposure light EL emitted from the emitting surface 12 (the projection region PR of the projection optical system PL), and moving the mask M in the Y axis direction with respect to the illumination region IR of the illumination system IL in synchronization with the movement in the Y axis direction of the substrate P. Accordingly, the image of the pattern of the mask M is projected to the shot region S, and the shot region S is exposed by the exposure light EL which is emitted from the emitting surface 12.

After the exposure of the shot region S is terminated, in order to start the exposure of a next shot region S, in the state where the liquid immersion space LS is formed, the controller 6 moves the substrate P in the direction (for example, X axis direction, directions which are inclined in the X axis direction and Y axis direction in the XY plane, or the like) which intersects the Y axis in the XY plane, and moves the next shot region S to an exposure starting position. Thereafter, the controller 6 starts the exposure of the shot region S.

The controller 6 repeats the operation which exposes the shot region while moving the shot region in the Y axis direction with respect to the position (projection region PR) radiated with the exposure light EL from the emitting surface 12 in the state where the liquid immersion space LS is formed above the substrate P (substrate stage 2), and after the exposure of the shot region, the operation which moves the substrate P in the direction (for example, X axis direction, directions which are inclined in the X axis direction and Y axis direction in the XY plane, or the like) which intersects the Y axis direction in the XY plane so that the next shot region is disposed at the exposure starting position in the state where the liquid immersion space LS is formed on the substrate P (substrate stage 2), and the controller sequentially exposes the plurality of shot regions of the substrate P.

In the descriptions below, the operation, which moves the substrate P (shot region) in the Y axis direction with respect to the position (projection region PR) radiated with the exposure light EL from the emitting surface 12 in the state where the liquid immersion space LS is formed above the substrate P (substrate stage 2) in order to expose the shot region, is appropriately referred to as a scan movement operation. Moreover, the operation, which moves the substrate P in the XY plane before the exposure of the next shot region starts in the state where the liquid immersion space LS is formed on the substrate P (substrate stage 2) after the exposure of a predetermined shot region is terminated, is appropriately referred to as a step movement operation.

In the present embodiment, the scan movement operation includes an operation in which the substrate P moves in the Y axis direction from a state where a predetermined shot region S is disposed at the exposure starting position to a state where the predetermined shot region is disposed at the exposure termination position. The step movement operation includes an operation in which the substrate P moves in a direction intersecting the Y axis direction in the XY plane from a state where a predetermined shot region S is disposed at the exposure termination position to a state where the next shot region S is disposed at the exposure starting position.

The exposure starting position includes a position of the substrate P when one end in the Y axis direction of a predetermined shot region S passes through the projection region PR in order to expose the shot region S. The exposure termination position includes a position of the substrate P when the other end in the Y axis direction of the shot region S radiated by the exposure light EL passes through the projection region PR.

The exposure starting position of the shot region S includes a starting position of the scan movement operation in order to expose the shot region S. The exposure starting position of the shot region S includes a termination position of the step movement operation in order to dispose the shot region S at the exposure starting position.

The exposure termination position of the shot region S includes a termination position of the scan movement operation in order to expose the shot region S. The exposure termination position of the shot region S includes a starting position of the step movement operation in order to dispose the next shot region S at the exposure starting position after the exposure of the shot region S is terminated.

In the descriptions below, a period, in which the scan movement operation is performed in order to expose a predetermined shot region S, is appropriately referred to as a scan movement period. In the descriptions below, a period, in which the step movement operation is performed in order to start the exposure of the next shot region S after the exposure termination of a predetermined shot region S, is appropriately referred to as a step movement period.

The scan movement period includes the exposure period from the exposure start of a predetermined shot region S to the exposure termination. The step movement period includes a movement period of the substrate P from the exposure termination of a predetermined shot region S to the exposure start of the next shot region S.

In the scan movement operation, the exposure light EL is emitted from the emitting surface 12. In the scan movement operation, the exposure light EL is radiated to the substrate P (object). In the step movement operation, the exposure light EL is not emitted from the emitting surface 12. In the step movement operation, the exposure light EL is not radiated to the substrate P (object).

The controller 6 sequentially exposes the plurality of shot regions S of the substrate P while repeating the scan movement operation and the step movement operation. Moreover, the scan movement operation is an equal speed movement mainly in the Y axis direction. The step movement operation includes acceleration and deceleration movements. For example, the step movement operation from the exposure termination of a predetermined shot region S to the exposure start of the next shot region S includes one or both of the acceleration and deceleration movement in the Y axis direction and the acceleration and deceleration movement in the X axis direction.

Moreover, there is a case where at least a portion of the liquid immersion space LS may be formed above the substrate stage 2 (cover member T) in at least a portion of the scan movement operation and the step movement operation. There is a case where the liquid immersion space LS may be formed over the substrate P and the substrate stage 2 (cover member T) in at least a portion of the scan movement operation and the step movement operation. When the exposure of the substrate P is performed in a state where the substrate stage 2 and the measurement stage 3 approach or contact each other, there is a case where the liquid immersion space LS may be formed over the substrate stage 2 (cover member T) and the measurement stage 3 in at least a portion of the scan movement operation and the step movement operation.

The controller 6 controls the driving system 15 based on exposure conditions of the plurality of shot regions S on the substrate P and moves the substrate P (substrate stage 2). For example, the exposure conditions of the plurality of shot regions S are defined by exposure control information referred to as an exposure recipe. The exposure control information is stored in the storage apparatus 7.

The exposure conditions (exposure control information) include arrangement information of the plurality of shot region S (the position of each of the plurality of shot regions S in the substrate P). Moreover, the exposure conditions (exposure control information) include size information (size information with respect to the Y axis direction) of each of the plurality of shot regions S.

The controller 6 sequentially exposes the plurality of shot regions S while moving the substrate P by a predetermined movement condition based on the exposure conditions (exposure control information) stored in the storage apparatus 7. The movement conditions of the substrate P (object) include at least one of the movement speed, the acceleration, the movement distance, the movement direction, and the movement locus in the XY plane.

As an example, when the plurality of shot regions S are sequentially exposed, the controller 6 radiates the exposure light EL to the projection region PR while moving substrate stage 2 so that the projection region PR of the projection optical system PL and the substrate P are relatively moved along the movement locus shown by an arrow Sr in FIG. 9, and sequentially exposes the plurality of shot regions S via the liquid LQ by the exposure light EL. The controller 6 sequentially exposes the plurality of shot regions S while repeating the scan movement operation and the step movement operation.

In the present embodiment, the second member 22 moves in at least a portion of the exposure processing of the substrate P. For example, the second member 22 moves in parallel with at least a portion of the step movement operation of the substrate P (substrate stage 2) in the state where the liquid immersion space LS is formed. For example, the second member 22 moves in parallel with at least a portion of the scan movement operation of the substrate P (substrate stage 2) in the state where the liquid immersion space LS is formed. The exposure light EL is emitted from the emitting surface 12 in parallel with the movement of the second member 22.

For example, the second member 22 may move so that the relative movement (relative speed, relative acceleration) between the second member 22 and the substrate P (substrate stage 2) is smaller than the relative movement (relative speed, relative acceleration) between the first member 21 and the substrate P (substrate stage 2) when the substrate P (substrate stage 2) performs the step movement operation.

Moreover, the second member 22 may move so that the relative movement (relative speed, relative acceleration) between the second member 22 and the substrate P (substrate stage 2) is smaller than the relative movement (relative speed, relative acceleration) between the first member 21 and the substrate P (substrate stage 2) when the substrate P (substrate stage 2) performs the scan movement operation.

In addition, the second member 22 may not move during the scan movement operation. That is, the second member 22 may not move in parallel with the emission of the exposure light EL from the emitting surface 12.

Figure 10:
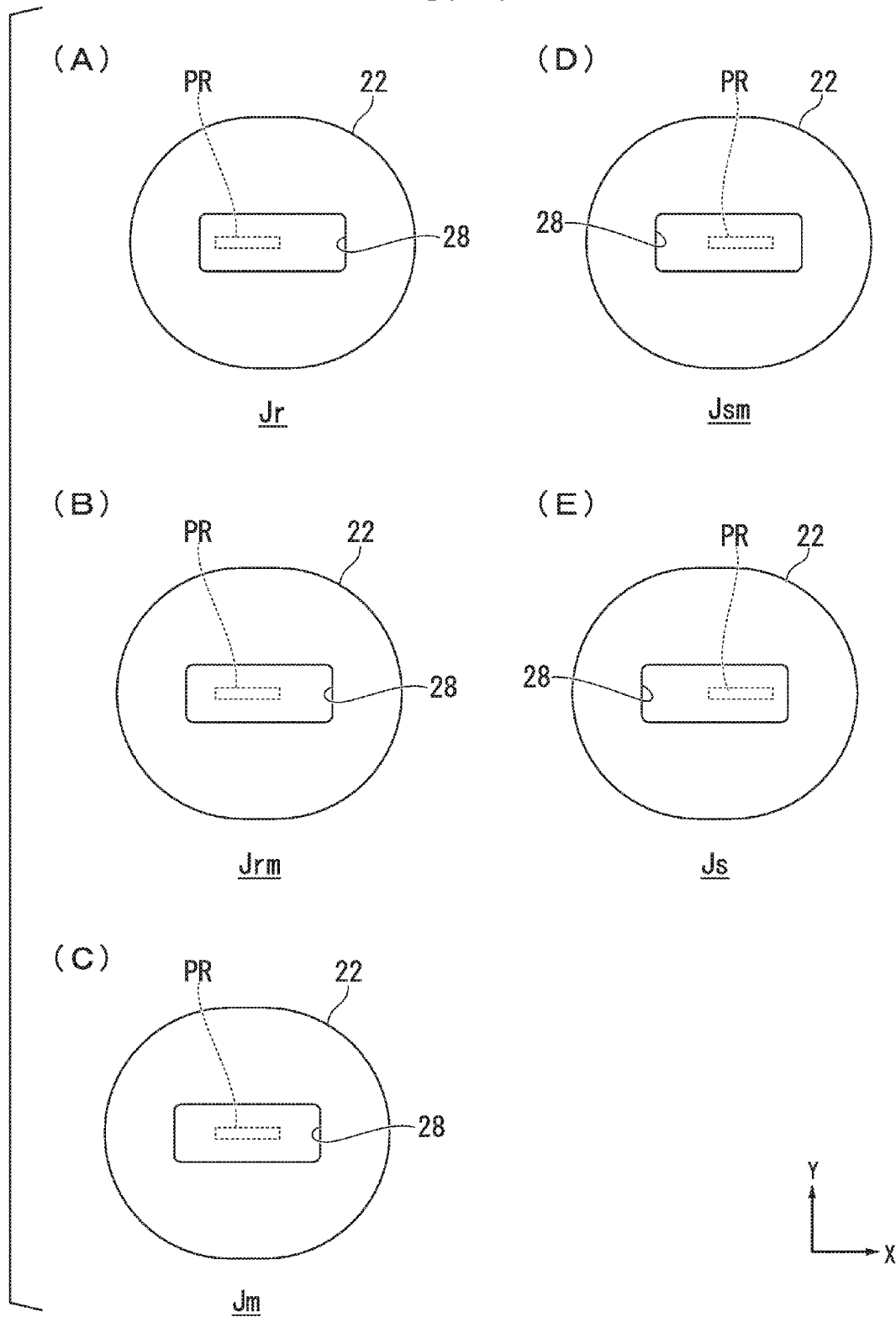
FIG. 10 is a view for explaining an example of the operation of the liquid immersion member according to the first embodiment.

FIG. 10 is a schematic view showing an example of the operation of the second member 22. FIG. 10 is a view of the second member 22 as seen from the upper side.

In the present embodiment, the second member 22 moves in the X axis direction. Moreover, as described above, the second member 22 may move in the Y axis direction, and may move in an arbitrary direction in the XY plane including the components in the X axis direction (or Y axis direction).

The second member 22 moves within the movable range which is defined in the X axis direction. The movable range of the second member 22 is determined so that the exposure light EL from the emitting surface 12 passes through the first opening part 23 and the second opening part 28 and the second member 22 does not contact the first member 21.

In at least a portion of the period in which the substrate P (object) moves, as shown in FIGS. 10(A) to 10(E), the second member 22 moves in the X axis direction. FIG. 10(A) shows a state where the second member 22 is disposed at a position Jr which is the further +X side end in the movable range. FIG. 10(C) shows a state where the second member 22 is disposed at a center position Jm in the movable range. FIG. 10(E) shows a state where the second member 22 is disposed at a position Js which is the further −X side end in the movable range.

In the descriptions below, the position Jr of the second member 22 shown in FIG. 10(A) is appropriately referred to as a first end position Jr. The position Jm of the second member 22 shown in FIG. 10(C) is appropriately referred to as a center position Jm. The position Js of the second member 22 shown in FIG. 10(E) is appropriately referred to as a second end position Js.

In addition, FIG. 10(B) shows a state where the second member 22 is disposed at a position Jrm between the first end position Jr and the center position Jm. FIG. 10(D) shows a state where the second member 22 is disposed at a position Jsm between the second end position Js and the center position Jm.

Moreover, in the present embodiment, the state where the second member 22 is disposed at the center position Jm includes a state where the center of the second opening part 28 of the second member 22 substantially coincides with the optical axis AX of the terminal optical element 13. The position of the second member 22, in which the center of the second opening part 28 coincides with the optical axis AX, may also be referred to as an origin point.

The size of the movable range of the second member 22 includes the distance between the first end position Jr and the second end position Js in the X axis direction.

The controller 6 is able to make the positions of the second member 22 with respect to the terminal optical element 13 (projection region PR) be different to each other. The controller 6 is able to move the second member 22 between two positions which are selected from the position Jr, the position Jrm, the position Jm, the position Jsm, and the position Js. The controller 6 is able to stop the second member 22 in at least one of the position Jr, the position Jrm, the position Jm, the position Jsm, and the position Js. The controller 6 may stop the second member 22 at arbitrary positions, which are not limited to the position Jr, the position Jrm, the position Jm, the position Jsm, and the position Js.

The movement distance of the second member 22 between the position Jr and the position Jm is longer than the movement distance of the second member 22 between the position Jrm and the position Jm. The movement distance of the second member 22 between the position Js and the position Jm is longer than the movement distance of the second member 22 between the position Jsm and the Jm.

The controller 6 is able to move the second member 22 according to determined movement conditions. The movement conditions of the second member 22 include at least one of the movement direction, the movement speed, the acceleration, and the movement distance. The controller 6 is able to control at least one of the movement direction, the movement speed, the acceleration, and the movement distance of the second member 22.

In the present embodiment, in the state where the second member 22 is disposed at the first end position Jr, the part 48 of the second member 22 is disposed outside the part 47 of the first member 21 with respect to the optical path AT. In the state where the second member 22 is disposed at the second end position Js, the part 48 of the second member 22 is disposed outside the part 47 of the first member 21 with respect to the optical path AT.

In the present embodiment, even in a state where the second member 22 is disposed at at least one of the position Jr, the position Jrm, the position Jm, the position Jsm, and the position Js, the part 48 of the second member 22 is continuously disposed outside the part 47 of the first member 21 with respect to the optical path AT.

Figure 11:
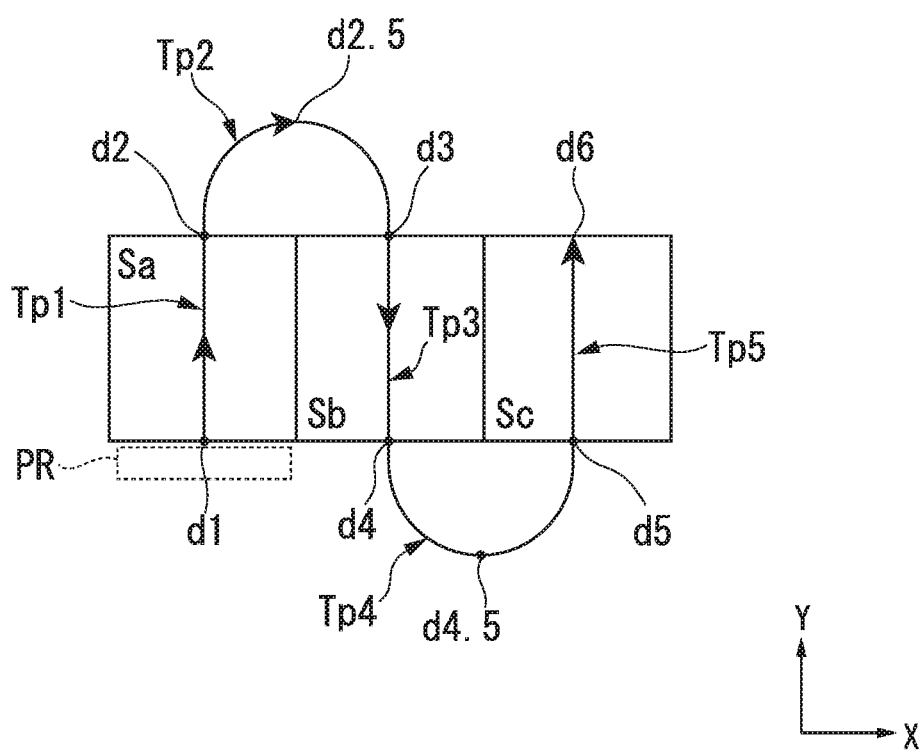
FIG. 11 is a view for explaining an example of the operation of the exposure apparatus according to the first embodiment.

FIG. 11 is a view schematically showing an example of the movement locus of the substrate P when sequentially exposing a shot region Sa, a shot region Sb, and a shot region Sc while performing the step movement which includes the components in the +X axis direction on the substrate P. The shot regions Sa, Sb, and Sc are disposed in the X axis direction.

As shown in FIG. 11, when the shot regions Sa, Sb, and Sc are exposed, the substrate P sequentially moves a pathway Tp1 from a state where the projection region PR is disposed at a position d1 of the substrate P to a state where the projection region PR is disposed at a position d2 adjacent at the +Y side with respect to the position d1, a pathway Tp2 from the state where the projection region PR is disposed at the position d2 to a state where the projection region PR is disposed at a position d3 adjacent at the +X side with respect to the position d2, a pathway Tp3 from the state where the projection region PR is disposed at the position d3 to a state where the projection region PR is disposed at a position d4 adjacent at the −Y side with respect to the position d3, a pathway Tp4 from the state where the projection region PR is disposed at the position d4 to a state where the projection region is disposed at a position d5 adjacent at the +X side with respect to the position d4, and a pathway Tp5 from the state where the projection region PR is disposed at the position d5 to a state where the projection region PR is disposed at a position d6 adjacent at the +Y side with respect to the position d5, under the terminal optical element 13. The positions d1, d2, d3, d4, d5, and d6 are positions in the XY plane.

At least a portion of the pathway Tp1 is a straight line parallel to the Y axis. At least a portion of the pathway Tp3 is a straight line parallel to the Y axis. At least a portion of the pathway Tp5 is a straight line parallel to the Y axis. The pathway Tp2 includes a curved line passing through a position d2.5. The pathway Tp4 includes a curved line passing through a position d4.5. The position d1 includes the start point of the pathway Tp1, and the position d2 includes the end point of the pathway Tp1. The position d2 includes the start point of the pathway Tp2, and the position d3 includes the end point of the pathway Tp2. The position d3 includes the start point of the pathway Tp3, and the position d4 includes the end point of the pathway Tp3. The position d4 includes the start point of the pathway Tp4, and the position d5 includes the end point of the pathway Tp4. The position d5 includes the start point of the pathway Tp5, and the position d6 includes the end point of the pathway Tp5. The pathway Tp1 is a pathway on which the substrate P moves in the −Y axis direction. The pathway Tp3 is a pathway on which the substrate P moves in the +Y axis direction. The pathway Tp5 is a pathway on which the substrate P moves in the −Y axis direction. The pathway Tp2 and the pathway Tp4 are pathways on which the substrate P moves in the direction which has the −X axis direction as the main component.

When the substrate P moves the pathway Tp1 in the state where the liquid immersion space LS is formed, the exposure light EL is radiated to the shot region Sa via the liquid LQ. When the substrate P moves the pathway Tp3 in the state where the liquid immersion space LS is formed, the exposure light EL is radiated to the shot region Sb via the liquid LQ. When the substrate P moves the pathway Tp5 in the state where the liquid immersion space LS is formed, the exposure light EL is radiated to the shot region Sc via the liquid LQ. When the substrate P moves the pathway Tp2 and the pathway Tp4, the exposure light EL is not radiated.

The operation in which the substrate P moves the pathway Tp1, the operation in which the substrate P moves the pathway Tp3, and the operation in which the substrate P moves the pathway Tp5 each include the scan movement operation. Moreover, the operation in which the substrate P moves the pathway Tp2 and the operation in which the substrate P moves the pathway Tp4 each include the step movement operation.

That is, the period in which the substrate P moves the pathway Tp1, the period in which the substrate P moves the pathway Tp3, and the period in which the substrate P moves the pathway Tp5 each include the scan movement period (exposure period). The period in which the substrate P moves the pathway Tp2 and the period in which the substrate P moves the pathway Tp4 each include the step movement period.

Figure 12:
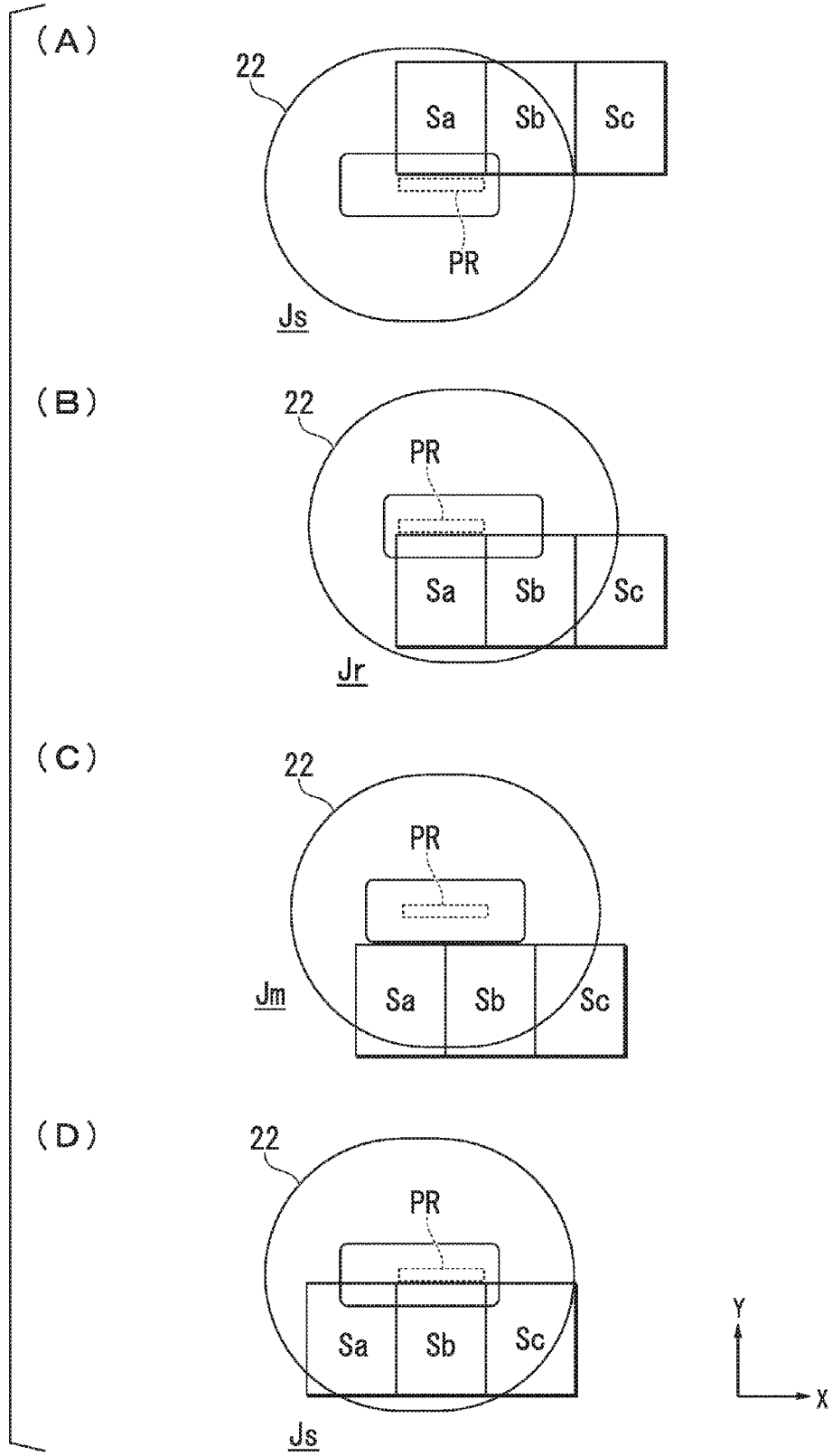
FIG. 12 is a view for explaining an example of the operation of the liquid immersion member according to the first embodiment.
Figure 13:
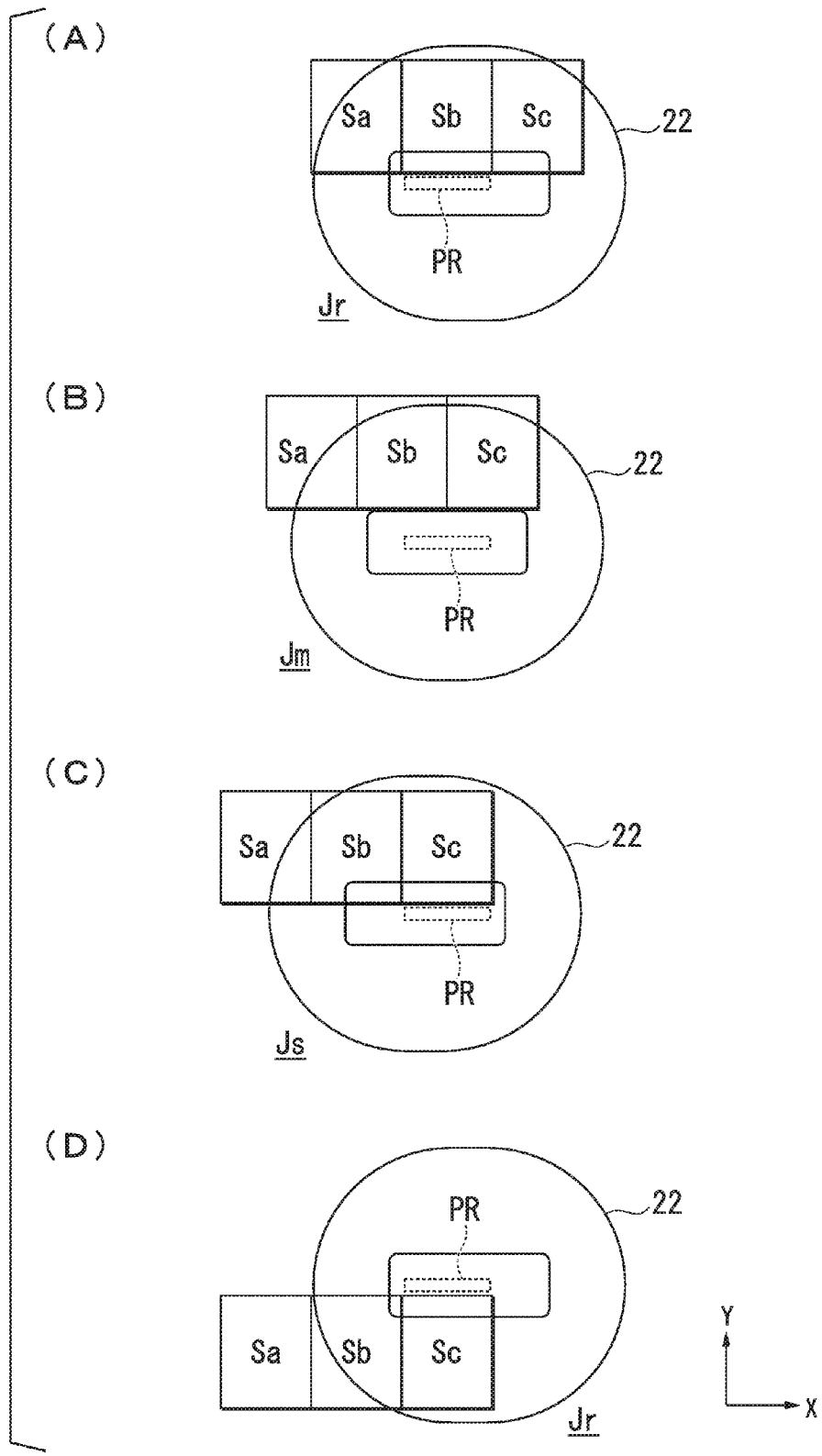
FIG. 13 is a view for explaining an example of the operation of the exposure apparatus according to the first embodiment.

FIGS. 12 and 13 are schematic views showing an example of the operation of the second member 22 when the shot regions Sa, Sb, and Sc are exposed. FIGS. 12 and 13 are view of the second member 22 as seen from the upper side.

When the substrate P is positioned at the position d1, as shown in FIG. 12(A), the second member 22 is positioned at the position Js with respect to the projection region PR (the optical path AT of the exposure light EL).

When the substrate P is positioned at the position d2, as shown in FIG. 12(B), the second member 22 is positioned at the position Jr with respect to the projection region PR (the optical path AT of the exposure light EL). That is, during the scan movement operation of the substrate P from the position d1 to the position d2, the second member 22 moves in the +X axis direction reverse to the direction (−X axis direction) of the step movement of the substrate P. During the scan movement operation of the substrate P from the position d1 to the position d2, the second member 22 moves from the position Js to the position Jr via the position Jsm, the position Jm, and the position Jrm. In order words, when the substrate P moves the pathway Tp1, the second member 22 moves in the +X axis direction so that the second member 22 is changed from the state shown in FIG. 12(A) to the state shown in FIG. 12(B).

When the substrate P is positioned at the position d2.5, as shown in FIG. 12(C), the second member 22 is positioned at the position Jm with respect to the projection region PR (the optical path AT of the exposure light EL).

When the substrate P is positioned at the position d3, as shown in FIG. 12(D), the second member 22 is disposed at the position Js with respect to the projection region PR (the optical path AT of the exposure light EL). That is, during the step movement operation of the substrate P from the position d2 to the position d3, the second member 22 moves in the −X axis direction which is the same as the direction (−X axis direction) of the step movement of the substrate P. During the step movement operation of the substrate P from the position d2 to the position d3, the second member 22 moves from the position Jr to the position Jm via the position Jrm, the position Jm, and the position Jsm. In other words, when the substrate P moves the pathway Tp2, the second member 22 moves in the −X axis direction so that the second member 22 is changed from the state shown in FIG. 12(B) to the state shown in FIG. 12(D) via the state shown in FIG. 12(C).

When the substrate P is positioned at the position d4, as shown in FIG. 13(A), the second member 22 is disposed at the position Jr with respect to the projection region PR (the optical path AT of the exposure light EL). That is, during the scan movement operation of the substrate P from the position d3 to the position d4, the second member 22 moves in the +X axis direction reverse to the direction (−X axis direction) of the step movement of the substrate P. During the scan movement operation of the substrate P from the position d3 to the position d4, the second member 22 moves from the position Js to the position Jr via the position Jsm, the position Jm, and the position Jrm. In other words, when the substrate P moves the pathway Tp3, the second member 22 moves in the +X axis direction so that the second member 22 is changed from the state shown in FIG. 12(D) to the state shown in FIG. 13(A).

When the substrate P is positioned at the position d4.5, as shown in FIG. 13(B), the second member 22 is positioned at the position Jm with respect to the projection region PR (the optical path AT of the exposure light EL).

When the substrate P is positioned at the position d5, as shown in FIG. 13(C), the second member 22 is disposed at the position Js with respect to the projection region PR (the optical path AT of the exposure light EL). That is, during the step movement operation of the substrate P from the position d4 to the position d5, the second member 22 moves in the −X axis direction which is the same as the direction (−X axis direction) of the step movement of the substrate P. During the step movement operation of the substrate P from the position d4 to the position d5, the second member 22 moves from the position Jr to the position Jm via the position Jrm, the position Jm, and the position Jsm. In other words, when the substrate P moves the pathway Tp4, the second member 22 moves in the −X axis direction so that the second member 22 is changed from the state shown in FIG. 13(A) to the state shown in FIG. 13(C) via the state shown in FIG. 13(B).

When the substrate P is positioned at the position d6, as shown in FIG. 13(D), the second member 22 is disposed at the position Jr with respect to the projection region PR (the optical path AT of the exposure light EL). That is, during the scan operation movement of the substrate P from the position d5 to the position d6, the second member 22 moves in the +X axis direction reverse to the direction (−X axis direction) of the step movement of the substrate P. During the scan movement operation of the substrate P from the position d5 to the position d6, the second member 22 moves from the position Js to the position Jr via the position Jsm, the position Jm, and the position Jrm. In other words, when the substrate P moves the pathway Tp5, the second member 22 moves in the +X axis direction so that the second member 22 is changed from the state shown in FIG. 13(C) to the state shown in FIG. 13(D).

That is, in the present embodiment, in at least a part of the period in which the substrate P moves along the pathway Tp2, the second member 22 moves in the −X axis direction so that the relative speed between the second member 22 and the substrate P is decreased. In other words, in at least a part of the period of the step movement operation in which the substrate P includes the component in the −X axis direction, the second member 22 moves in the −X axis direction so that the relative speed between the second member 22 and the substrate P in the X axis direction is decreased. Similarly, in at least a part of the period in which the substrate P moves along the pathway Tp4, the second member 22 moves in the −X axis direction so that the relative speed between the second member 22 and the substrate P in the X axis direction is decreased.

In addition, in the present embodiment, the second member 22 moves in the +X axis direction in at least of a part of the period in which the substrate P moves along the pathway Tp3. Accordingly, after the substrate P moves the pathway Tp3, during the movement of the pathway Tp4, even when the second member 22 moves in the −X axis direction, the exposure light EL is able to pass through the first and second opening parts 23 and 30, and the contact between the first member 21 and the second member 22 is able to be prevented. The case where the substrate P moves the pathways Tp1 and Tp5 is also similar to the above-described case.

That is, when the substrate P repeats the scan movement operation and the step movement operation including the component in the −X axis direction, during the step movement operation, the second member 22 moves in the −X axis direction from the position Jr to the position Js so that the relative speed between the second member 22 and the substrate P is decreased, and during the scan movement operation, the second member 22 returns from the position Js to the position Jr so that the second member 22 moves in the −X axis direction again in the next step movement operation. That is, since the second member 22 moves in the +X axis direction in at least a portion of the period in which the substrate P performs the scan movement operation, the size of the second opening part 28 is able to be reduced to the required minimum, and the contact between the first member 21 and the second member 22 is prevented.

Moreover, in the embodiment, even when the second member 22 is disposed at the first end position Jr (second end position Js), at least a portion of the fluid recovery part 43 is continuously opposite to the substrate P (object). Accordingly, for example, in the step movement operation, the fluid recovery part 43 is able to recover the liquid LQ on the substrate P (object).

Moreover, in the example described using FIGS. 12 and 13, when the substrate P is positioned at the positions d1, d3, and d5, the second member 22 is disposed at the second end position Js. When the substrate P is positioned at the positions d1, d3, and d5, the second member 22 may be disposed at the center position Jm, and may be disposed at the position Jsm between the center position Jm and the second end position Js.

In addition, in the example described using FIGS. 12 and 13, when the substrate P is positioned at the positions d2, d4, and d6, the second member 22 is disposed at the first end position Jr. When the substrate P is positioned at the positions d2, d4, and d6, the second member 22 may be disposed at the center position Jm and may be disposed at the position Jrm between the center position Jm and the first end position Jr.

Moreover, when the substrate P is positioned at the positions d2.5 and d4.5, the second member 22 may be disposed at positions different from the center position Jm. That is, when the substrate P is positioned at the positions d2.5 and d4.5, for example, the second member 22 may be disposed at the position Jsm between the center position Jm and the second end position Js, and may be disposed at the position Jrm between the center position Jm and the first end position Jr.

In addition, in at least a part of the scan movement period of the substrate P, the second member 22 may stop, and may move in the −X axis direction which is the same as the direction (−X axis direction) of the step movement of the substrate P.

Moreover, in at least a part of the step movement period of the substrate P, the second member 22 may stop, and may move in the +X axis direction reverse to the direction (−X axis direction) of the step movement of the substrate P.

That is, in a portion of the movement period (scan movement period and step movement period) of the substrate P, the second member 22 moves so that the relative speed between the second member 22 and the substrate P (object) is smaller than the relative speed between the first member 21 and the substrate P (object), and in a portion of the movement period of the substrate P, the second member 22 may stop or may move so that the relative speed between the second member 22 and the substrate is larger than the relative speed between the first member and the substrate.

As described above, according to the present embodiment, since the second member 22 which is movable with respect to the first member 21 is provided, even when the object such as the substrate P moves in the XY plane in the state where the liquid immersion space LS is formed, for example, the liquid LQ is prevented from flowing out from the space between the liquid immersion member 5 and the object or from remaining on the object.

That is, when the object such as the substrate P moves in the XY plane at a high speed in the state where the liquid immersion space LS is formed, if the member (liquid immersion member or the like) opposite to the object is stopped, there is possibility that the liquid LQ may flow out, the liquid LQ may remain on the substrate P (object), or bubbles may occur in the liquid LQ.

In the present embodiment, for example, the second member 22 is movable so that the relative movement (relative speed and relative acceleration) between the second member 22 and the object such as the substrate P is decreased. Accordingly, even when the object moves at a high speed in the state where the liquid immersion space LS is formed, the liquid LQ is prevented from flowing out, the liquid LQ is prevented from remaining on the substrate P (object), or the bubbles are prevented from occurring in the liquid LQ.

Moreover, in the present embodiment, the liquid immersion member 5 includes the protection part 211 (wall part 50) which protects the terminal optical element 13. Accordingly, for example, even when the pressure of the liquid LQ in the liquid immersion space LS is changed or the liquid LQ in the liquid immersion space LS flows at a high speed due to the movement of the second member 22, the change of the pressure, in which the terminal optical element 13 receives from the liquid LQ in the liquid immersion space LS, is able to be decreased.

Moreover, due to the movement of the substrate P (object), the pressure of the liquid LQ in the liquid immersion space LS may be changed or the liquid LQ in the liquid immersion space LS may flow at a high speed. In addition, due to reasons other than the movement of the second member 22 and the movement of the substrate P (object), the pressure of the liquid LQ in the liquid immersion space LS may be changed or the liquid LQ in the liquid immersion space LS may flow at a high speed. Also in this case, the change of the pressure, in which the terminal optical element 13 receives from the liquid LQ in the liquid immersion space LS, is able to be decreased by the protection part 211 (wall part 50).

Accordingly, the movement of the terminal optical element 13, deformation of the terminal optical element 13, and changes in optical characteristics of the terminal optical element 13 are suppressed. Therefore, occurrences of exposure failure, and occurrences of a defective device are suppressed.

Moreover, in the present embodiment, the protection part 211 is disposed at at least a portion of the surrounding of the optical path AT. Accordingly, it is possible to decrease the change of the pressure, in which the terminal optical element 13 receives from the liquid LQ in the liquid immersion space LS, while securing the path (optical path) of the exposure light EL.

Moreover, in the present embodiment, the protection part 211 is disposed between the terminal optical element 13 and the second member 22. Accordingly, it is possible to decrease the change of the pressure, in which the terminal optical element 13 receives from the liquid LQ in the liquid immersion space LS, due to the movement of the second member 22.

In addition, in the present embodiment, the protection part 211 (wall part 50) is disposed between the terminal optical element 13 and the second member 22 so that the terminal optical element 13 and the second member 22 are not opposite to the each other in the movement period of the second member 22. Accordingly, it is possible to effectively decrease the change of the pressure, in which the terminal optical element 13 receives from the liquid LQ in the liquid immersion space LS, due to the movement of the second member 22.

In addition, in the present embodiment, the part 48 of the second member 22 is continuously disposed outside the part 47 of the first member 21 with respect to the optical path AT. Accordingly, even when the second member 22 moves, it is possible to effectively decrease the change in the pressure in which the terminal optical element 13 receives from the liquid LQ inside the second opening part 28.

Moreover, in the present embodiment, the region 291 of the second member 22 facing the optical path AT (ATL) is upwardly and outwardly inclined in the radial direction with respect to the optical axis AX. Accordingly, in the state where the region 291 (the end surface of the second member 22 facing the optical path AT) of the second member 22 is disposed in the liquid immersion space LS, the second member 22 is able to move smoothly. Moreover, even when the second member 22 moves in the state where the region 291 of the second member 22 is disposed in the liquid immersion space LS, the change of the pressure of the liquid LQ in the liquid immersion space LS is suppressed.

Second Embodiment

A second embodiment will be described. In the descriptions below, the same reference numerals are assigned to the same or similar components as those of the above-described embodiment, and descriptions thereof are simplified or omitted here.

Figure 14:
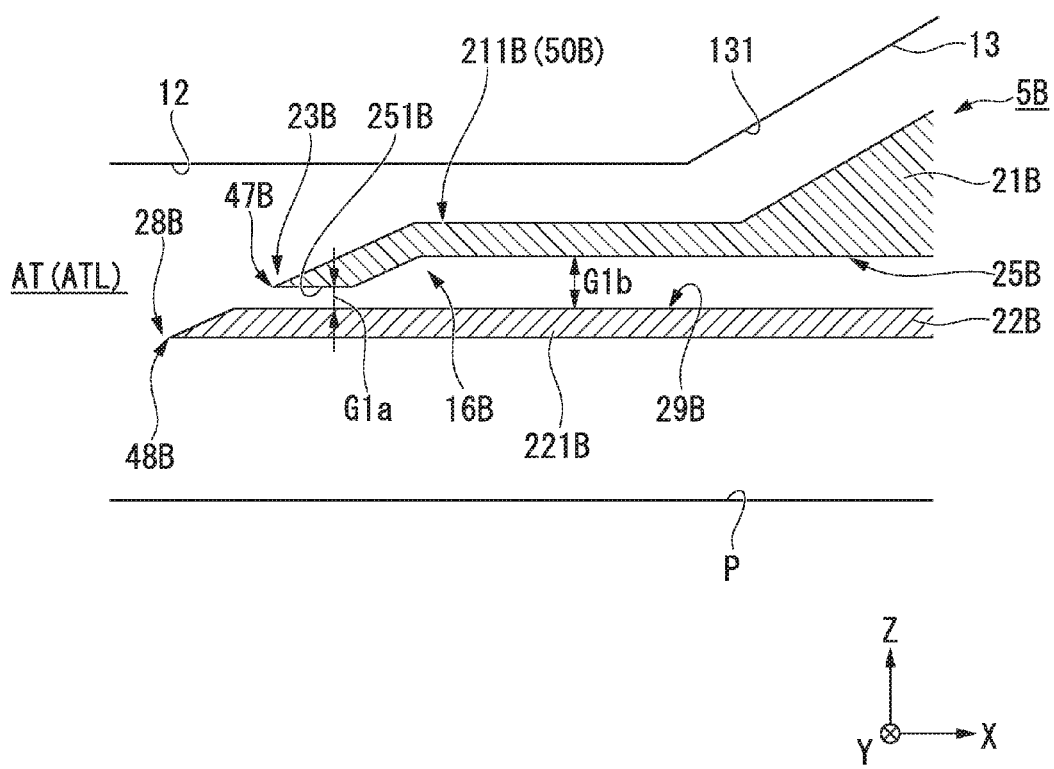
FIG. 14 is a side cross-sectional view showing a portion of a liquid immersion member according to a second embodiment.

FIG. 14 is a view showing an example of a liquid immersion member 5B according to the present embodiment. The liquid immersion member 5B includes a first member 21B which includes the protection part 211, and a second member 22B which includes a part 221B in which at least a portion is opposite to a protection part 211B. The protection part 211B includes a wall part 50B which is disposed between the terminal optical element 13 and the second member 22B. The protection part 211B includes a region 251B which is nearest to the optical path AT in the lower surface 25B of the first member 21B. The protection part 211B includes a part 47B which is nearest to the optical path AT. The part 47B is the lowermost part of the protection part 211B. The part (lowermost part) 47B is a part which is nearest to the upper surface of the substrate P (object) in the first member 21B.

The first member 21B includes a recessed part 16B to which the second member 22B is able to be opposite. At least a portion of the second member 22B is movable below the recessed part 16B of the first member 21B.

As shown in FIG. 14, at least a portion of the second member 22B may move below the region 251B. At least a portion of the second member 22B may move below the part 47B of the first member 21B. The second member 22B may move so that the part 48B of the second member 22B nearest to the optical path AT is disposed to be closer to the optical path AT side than the part 47B of the first member 21B.

The second member 22B may move so that the part 48B of the second member 22B, which includes a second opening part 28B having a larger size than the size of a first opening part 23B in the movement direction of the second member 22B, is disposed to be closer to the optical path AT side than the part 47B of the first member 21B.

The size of the second opening part 28B may be smaller than the size of the first opening part 23B in the movement direction of the second member 22B so that the part 48B of the second member 22B is disposed to be closer to the optical path AT side than the part 47B of the first member 21B.

At least a portion of the second member 22B including the part 48B may be disposed between the emitting surface 12 of the terminal optical element 13 and the upper surface of the substrate P (object).

A gap is formed between the first member 21B and an upper surface 29B of the second member 22B outside the part (the lowermost part) 47B of the first member 21B with respect to the optical path AT. With respect to the Z axis direction parallel to the optical axis AX of the terminal optical element 13, the distance G1$a$ between the part 47B and the upper surface 29B is smaller than the size G1$b$ of the gap between the first member 21B and the upper surface 29B of the second member 22B.

Also in the present embodiment, the change of the pressure, in which the terminal optical element 13 receives from the liquid LQ in the liquid immersion space LS, is decreased.

Third Embodiment

A third embodiment will be described. In the descriptions below, the same reference numerals are assigned to the same or similar components as those of the above-described embodiments, and descriptions thereof are simplified or omitted here.

Figure 15:
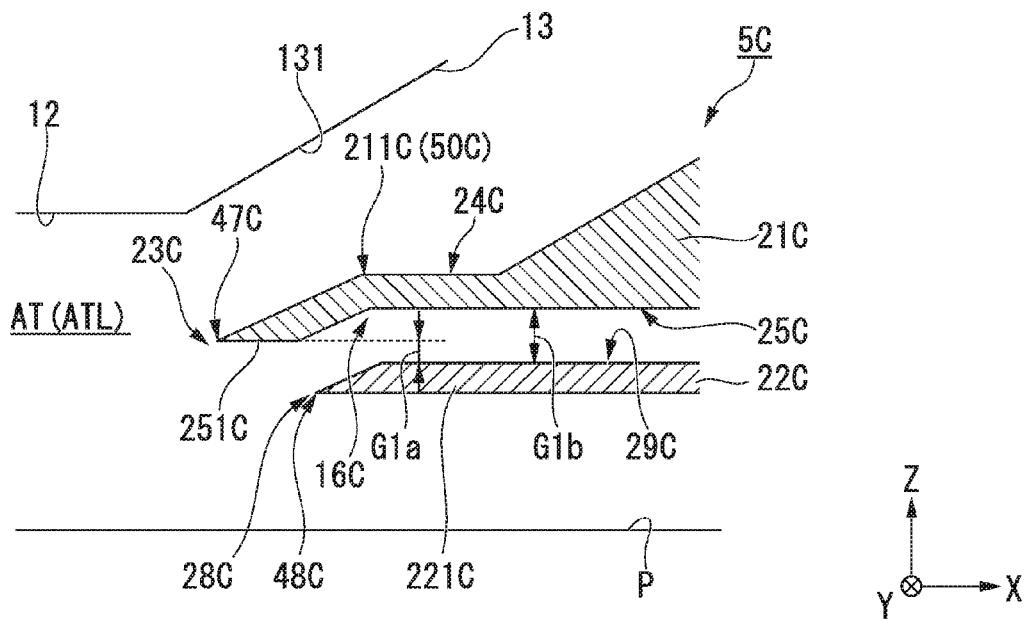
FIG. 15 is a side cross-sectional view showing a portion of a liquid immersion member according to a third embodiment.

FIG. 15 is a view showing an example of a liquid immersion member 5C according to the present embodiment. The liquid immersion member 5C includes a first member 21C which includes a protection part 211C (wall part 50C), and a second member 22C which includes a part 221C in which at least a portion is opposite to the protection part 211C. The protection part 211C includes a region 251C which is nearest to the optical path AT in the lower surface 25C of the first member 21C. The protection part 211C includes a part 47C which is nearest to the optical path AT. The part 47C is the lowermost part of the protection part 211C. The part (lowermost part) 47C is a part which is nearest to the upper surface of the substrate P (object) in the first member 21C.

In the present embodiment, the part 47C is disposed outside the emitting surface 12 in the radial direction with respect to the optical axis AX. The part 47C is disposed outside a space between the emitting surface 12 and the upper surface of the substrate P (object). The part 47C is not disposed between the emitting surface 12 and the upper surface of the substrate P (object).

The part 47C is disposed below the emitting surface 12 in the Z axis direction. The protection part 211C (an upper surface 24C of the protection part 211C) is disposed below the emitting surface 12 in the Z axis direction.

The second member 22C (part 221C) is disposed to be opposite to the first member 21C (protection part 211C) via a gap below the first member 21C (protection part 211C). The protection part 211C is disposed between the terminal optical element 13 and the second member 22C (part 221C).

The first member 21C includes a recessed part 16C to which the second member 22C is able to be opposite. At least a portion of the second member 22C is movable below the recessed part 16C of the first member 21C.

The part 48C of the second member 22C nearest to the optical path AT is disposed outside the part 47C of the first member 21C with respect to the optical path AT. In the movement period of the second member 22C, the part 48C is continuously disposed outside the part 47C with respect to the optical path AT.

A gap is formed between the first member 21C and an upper surface 29C of the second member 22C outside the part (the lowermost part) 47C of the first member 21C with respect to the optical path AT. With respect to the Z axis direction parallel to the optical axis AX of the terminal optical element 13, the distance G1$a$ between the part 47C and the upper surface 29C is smaller than the size G1$b$ of the gap between the first member 21C and the upper surface 29C of the second member 22C.

Also in the present embodiment, the change of the pressure, in which the terminal optical element 13 receives from the liquid LQ in the liquid immersion space LS, is decreased.

Moreover, in the present embodiment, at least a portion of the second member 22C may move below the region 251C. At least a portion of the second member 22C may move below the part 47C of the first member 21C. The second member 22C may move so that the part 48C of the second member 22C nearest to the optical path AT is disposed to be closer to the optical path AT side than the part 47C of the first member 21C.

In addition, in the present embodiment, the size of the second opening part 28C may be smaller than the size of the first opening part 23C in the movement direction of the second member 22C so that the part 48C of the second member 22C is disposed to be closer to the optical path AT side than the part 47C of the first member 21C.

Moreover, in the present embodiment, the first member 21C (protection part 211C) is not disposed between the emitting surface 12 and the upper surface of the substrate P (object), and at least a portion of the second member 22C including the part 48C may be disposed between the emitting surface 12 and the upper surface of the substrate P (object).

Fourth Embodiment

A fourth embodiment will be described. In the descriptions below, the same reference numerals are assigned to the same or similar components as those of the above-described embodiments, and descriptions thereof are simplified or omitted here.

Figure 16:
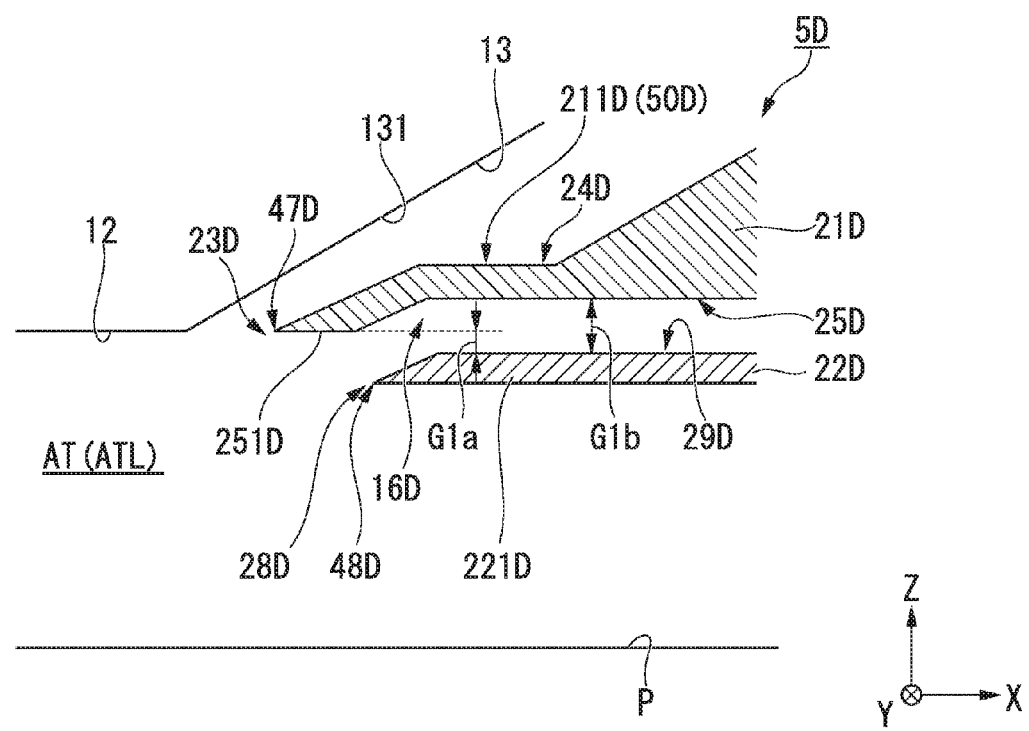
FIG. 16 is a side cross-sectional view showing a portion of a liquid immersion member according to a fourth embodiment.

FIG. 16 is a view showing an example of a liquid immersion member 5D according to the present embodiment. The liquid immersion member 5D includes a first member 21D which includes a protection part 211D (wall part 50D), and a second member 22D which includes a part 221D in which at least a portion is opposite to the protection part 211D. The protection part 211D includes a region 251D which is nearest to the optical path AT in the lower surface 25D of the first member 21D. The protection part 211D includes a part 47D which is nearest to the optical path AT. The part 47D is the lowermost part of the protection part 211D. The part (lowermost part) 47D is a part which is nearest to the upper surface of the substrate P (object) in the first member 21D.

In the present embodiment, the part 47D is disposed outside the emitting surface 12 in the radial direction with respect to the optical axis AX. The part 47D is disposed above the emitting surface 12 in the Z axis direction. The part 47D is disposed at the surrounding of the outer surface 131. The protection part 211D (an upper surface 24D of the protection part 211D) is disposed above the emitting surface 12 in the Z axis direction.

The second member 22D (part 221D) is disposed to be opposite to the first member 21D (protection part 211D) via a gap below the first member 21D (protection part 211D).

The protection part 211D is disposed between the terminal optical element 13 and the second member 22D (part 221D).

The first member 21D includes a recessed part 16D to which the second member 22D is able to be opposite. At least a portion of the second member 22D is movable below the recessed part 16D of the first member 21D.

The part 48D of the second member 22D nearest to the optical path AT is disposed outside the part 47D of the first member 21D with respect to the optical path AT. In the movement period of the second member 22D, the part 48D is continuously disposed outside the part 47D with respect to the optical path AT.

A gap is formed between the first member 21D and an upper surface 29D of the second member 22D outside the part (the lowermost part) 47D of the first member 21D with respect to the optical path AT. With respect to the Z axis direction parallel to the optical axis AX of the terminal optical element 13, the distance G1a between the part 47D and the upper surface 29D is smaller than the size G1b of the gap between the first member 21D and the upper surface 29D of the second member 22D.

Also in the present embodiment, the change of the pressure, in which the terminal optical element 13 receives from the liquid LQ in the liquid immersion space LS, is decreased.

Moreover, in the present embodiment, at least a portion of the second member 22D may move below the region 251D. At least a portion of the second member 22D may move below the part 47D of the first member 21D. The second member 22D may move so that the part 48D of the second member 22D nearest to the optical path AT is disposed to be closer to the optical path AT side than the part 47D of the first member 21D.

In addition, in the present embodiment, the size of the second opening part 28D may be smaller than the size of the first opening part 23D in the movement direction of the second member 22D so that the part 48D of the second member 22D is disposed to be closer to the optical path AT side than the part 47D of the first member 21D.

Moreover, in the present embodiment, the first member 21D (protection part 211D) is disposed above the emitting surface 12, and at least a portion of the second member 22D including the part 48D may be disposed between the emitting surface 12 and the upper surface of the substrate P (object).

Fifth Embodiment

A fifth embodiment will be described. In the descriptions below, the same reference numerals are assigned to the same or similar components as those of the above-described embodiments, and descriptions thereof are simplified or omitted here.

Figure 17:
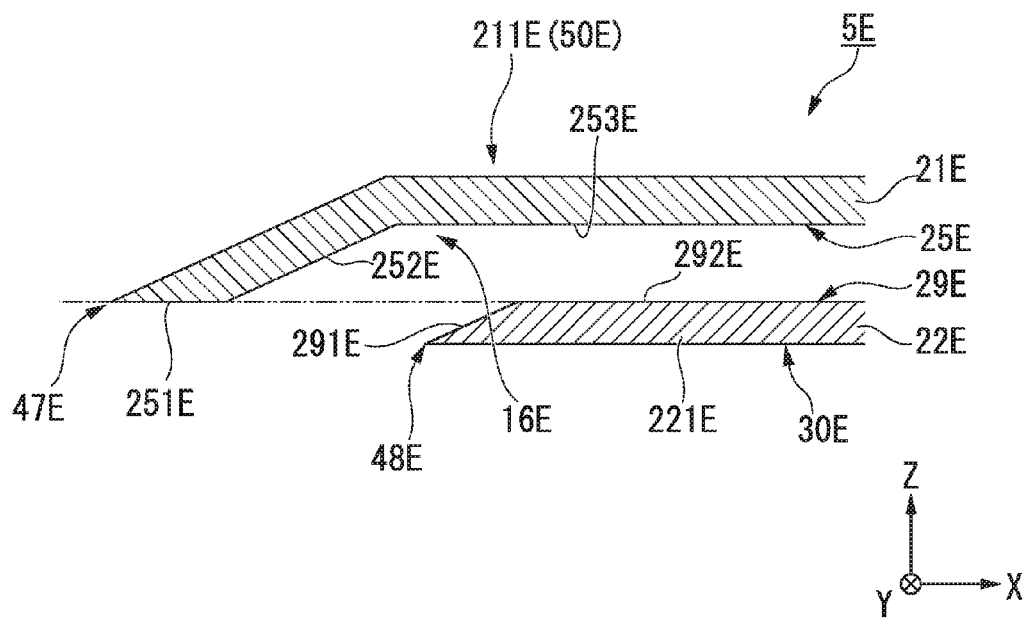
FIG. 17 is a side cross-sectional view showing a portion of a liquid immersion member according to a fifth embodiment.

FIG. 17 is a view showing an example of a liquid immersion member 5E according to the present embodiment. The liquid immersion member 5E includes a first member 21E which includes a protection part 211E (wall part 50E), and a second member 22E which includes a part 221E in which at least a portion is opposite to the protection part 211E. The protection part 211E (wall part 50E) is disposed between the terminal optical element 13 and the second member 22E.

The protection part 211E includes a lower surface 25E to which at least a portion of the second member 22E is able to be opposite. The lower surface 25E includes a region 251E which is nearest to the optical path AT, a region 252E which is disposed outside the region 251E with respect to the optical path AT, and a region 253E which is disposed outside the region 252E with respect to the optical path AT.

The region 251E is substantially perpendicular to the optical axis AX of the terminal optical element 13. The region 252E is upwardly and outwardly inclined in the radial direction with respect to the optical axis AX of the terminal optical element 13. The region 253E is substantially perpendicular to the optical axis AX of the terminal optical element 13.

The protection part 211E includes a part 47E which is nearest to the optical path AT. The part 47E is the lowermost part of the protection part 211E. The part (lowermost part) 47E is a part which is nearest to the upper surface of the substrate P (object) in the first member 21E.

The second member 22E (part 221E) is disposed to be opposite to the first member 21E (protection part 211E) via a gap below the first member 21E (protection part 211E). The second member 22E includes an upper surface 29E in which at least a portion is opposite to the first member 21E, and a lower surface 30E to which the upper surface of the substrate P (object) is able to be opposite.

The upper surface 29E includes a region 291E which is nearest to the optical path AT, and a region 292E which is disposed outside the region 291E with respect to the optical path AT. The region 291E is upwardly and outwardly inclined in the radial direction with respect to the optical axis AX of the terminal optical element 13. The region 292E is substantially perpendicular to the optical axis AX of the terminal optical element 13.

The lower surface 30E is substantially perpendicular to the optical axis AX of the terminal optical element 13.

In the present embodiment, the height of the part (lowermost part) 47E of the protection part 211E (wall part 50E) is substantially the same as the height of the upper surface 29E of the second member 22E. In other words, the position of the part 47E is substantially the same as the position of the upper surface 29E in the Z axis direction. In the example shown in FIG. 17, the height of the part 47E is substantially the same as the height of the region 292E of the upper surface 29E. Moreover, the height of the part 47E may be substantially the same as the height of the region 291E of the upper surface 29E.

The first member 21E includes a recessed part 16E to which the second member 22E is able to be opposite. The region 252E and the region 253E are disposed inside the recessed part 16E. At least a portion of the second member 22E (part 221E) moves below the recessed part 16E. At least a portion of the second member 22E (part 221E) moves below the region 252E and the region 253E.

The part 48E of the second member 22E nearest to the optical path AT is disposed outside the part 47E of the first member 21E with respect to the optical path AT. In the movement period of the second member 22E, the part 48E is disposed outside the part 47E with respect to the optical path AT.

In the present embodiment, in the movement period of the second member 22E, the part 48E is continuously disposed outside the region 251E with respect to the optical path AT. In addition, the part 48E may move below the region 251E.

Also in the present embodiment, the change of the pressure, in which the terminal optical element 13 receives from the liquid LQ in the liquid immersion space LS, is decreased.

Sixth Embodiment

A sixth embodiment will be described. In the descriptions below, the same reference numerals are assigned to the same or similar components as those of the above-described embodiments, and descriptions thereof are simplified or omitted here.

Figure 18:
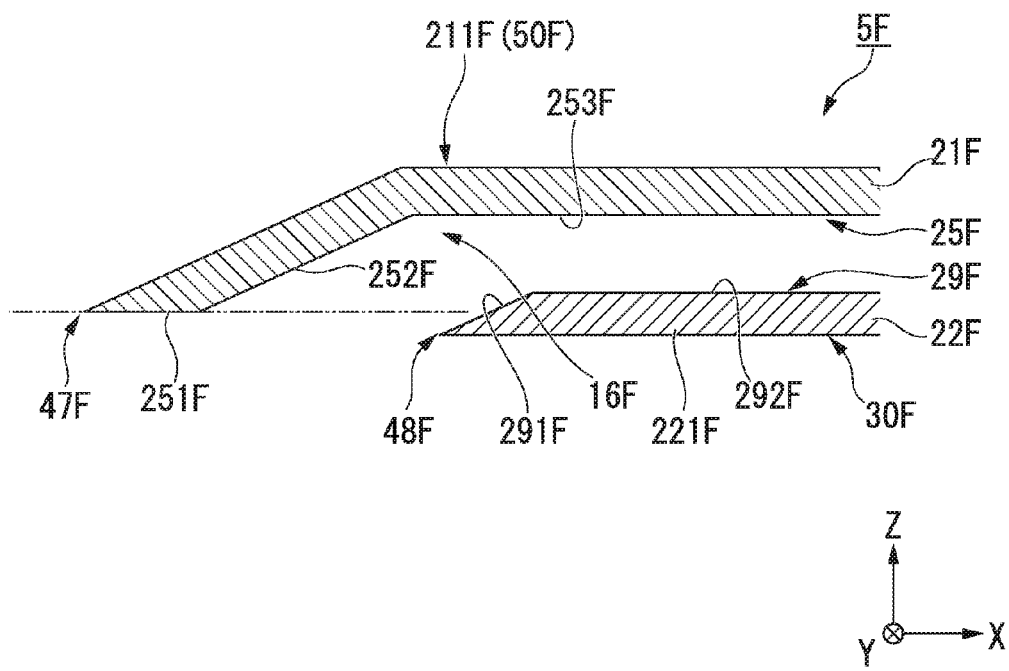
FIG. 18 is a side cross-sectional view showing a portion of a liquid immersion member according to a sixth embodiment.

FIG. 18 is a view showing an example of a liquid immersion member 5F according to the present embodiment. The liquid immersion member 5F includes a first member 21F which includes a protection part 211F (wall part 50F), and a second member 22F which includes a part 221F in which at least a portion is opposite to the protection part 211F. The protection part 211F (wall part 50F) is disposed between the terminal optical element 13 and the second member 22F.

The protection part 211F includes a lower surface 25F to which at least a portion of the second member 22F is able to be opposite. The lower surface 25F includes a region 251F which is nearest to the optical path AT, a region 252F which is disposed outside the region 251F with respect to the optical path AT, and a region 253F which is disposed outside the region 252F with respect to the optical path AT.

The region 251F is substantially perpendicular to the optical axis AX of the terminal optical element 13. The region 252F is upwardly and outwardly inclined in the radial direction with respect to the optical axis AX of the terminal optical element 13. The region 253F is substantially perpendicular to the optical axis AX of the terminal optical element 13.

The protection part 211F includes a part 47F which is nearest to the optical path AT. The part 47F is the lowermost part of the protection part 211F. The part (lowermost part) 47F is a part which is nearest to the upper surface of the substrate P (object) in the first member 21F.

The second member 22F (part 221F) is disposed to be opposite to the first member 21F (protection part 211F) via a gap below the first member 21F (protection part 211F). The second member 22F includes an upper surface 29F in which at least a portion is opposite to the first member 21F, and a lower surface 30F to which the upper surface of the substrate P (object) is able to be opposite.

The upper surface 29F includes a region 291F which is nearest to the optical path AT, and a region 292F which is disposed outside the region 291F with respect to the optical path AT. The region 291F is upwardly and outwardly inclined in the radial direction with respect to the optical axis AX of the terminal optical element 13. The region 292F is substantially perpendicular to the optical axis AX of the terminal optical element 13.

The lower surface 30F is substantially perpendicular to the optical axis AX of the terminal optical element 13.

In the present embodiment, the part (lowermost part) 47F of the protection part 211F (wall part 50F) is disposed below the upper surface 29F of the second member 22F. In order words, the position of the part 47F is positioned to be closer to the −Z side (object side) than the position of the upper surface 29F in the Z axis direction. That is, the upper surface 29F is disposed above the part 47F and the region 251F.

In the present embodiment, the part (lowermost part) 47F of the protection part 211F (wall part 50F) is disposed above the lower surface 30F of the second member 22F. In order words, the position of the part 47F is disposed to be closer to the +Z side (substrate P side) than the position of the lower surface 30F in the Z axis direction. That is, the lower surface 30F is disposed below the part 47F and the region 251F.

The first member 21F includes a recessed part 16F to which the second member 22F is able to be opposite. The region 252F and the region 253F are disposed inside the recessed part 16F. At least a portion of the second member 22F (part 221F) moves below the recessed part 16F. At least a portion of the second member 22F (part 221F) moves below the region 252F and the region 253F.

In the present embodiment, at least a portion of the second member 22F (part 221F) moves inside the recessed part 16F.

The part 48F of the second member 22F nearest to the optical path AT is disposed outside the part 47F of the first member 21F with respect to the optical path AT. In the movement period of the second member 22F, the part 48F is disposed outside the part 47F with respect to the optical path AT.

In the present embodiment, during the movement period of the second member 22F, the part 48F is continuously disposed outside the region 251F with respect to the optical path AT. In addition, the part 48F may move below the region 251F.

Also in the present embodiment, the change of the pressure, in which the terminal optical element 13 receives from the liquid LQ in the liquid immersion space LS, is decreased.

Seventh Embodiment

A seventh embodiment will be described. In the descriptions below, the same reference numerals are assigned to the same or similar components as those of the above-described embodiments, and descriptions thereof are simplified or omitted here.

Figure 19:
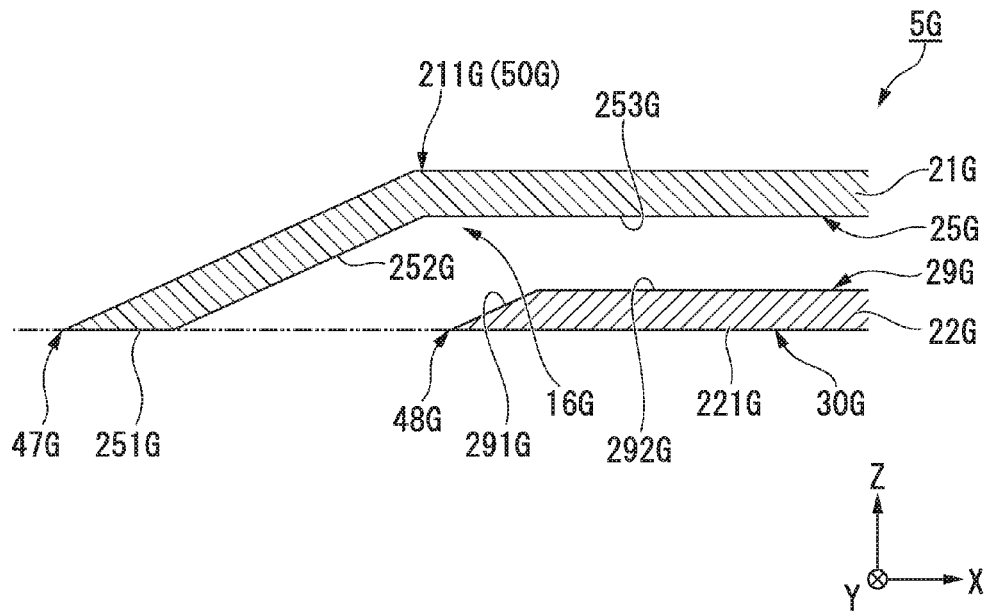
FIG. 19 is a side cross-sectional view showing a portion of a liquid immersion member according to a seventh embodiment.

FIG. 19 is a view showing an example of a liquid immersion member 5G according to the present embodiment. The liquid immersion member 5G includes a first member 21G which includes a protection part 211G (wall part 50G), and a second member 22G which includes a part 221G in which at least a portion is opposite to the protection part 211G The protection part 211G (wall part 50G) is disposed between the terminal optical element 13 and the second member 22G.

The protection part 211G includes a lower surface 25G to which at least a portion of the second member 22G is able to be opposite. The lower surface 25G includes a region 251G which is nearest to the optical path AT, a region 252G which is disposed outside the region 251G with respect to the optical path AT, and a region 253G which is disposed outside the region 252G with respect to the optical path AT.

The region 251G is substantially perpendicular to the optical axis AX of the terminal optical element 13. The region 252G is upwardly and outwardly inclined in the radial direction with respect to the optical axis AX of the terminal optical element 13. The region 253G is substantially perpendicular to the optical axis AX of the terminal optical element 13.

The protection part 211G includes a part 47G which is nearest to the optical path AT. The part 47G is the lowermost part of the protection part 211G The part (lowermost part) 47G is a part which is nearest to the upper surface of the substrate P (object) in the first member 21G.

The second member 22G (part 221G) is disposed to be opposite to the first member 21G (protection part 211G) via a gap below the first member 21G (protection part 211G). The second member 22G includes an upper surface 29G in which at least a portion is opposite to the first member 21G, and a lower surface 30G to which the upper surface of the substrate P (object) is able to be opposite.

The upper surface 29G includes a region 291G which is nearest to the optical path AT, and a region 292G which is disposed outside the region 291G with respect to the optical path AT. The region 291G is upwardly and outwardly inclined in the radial direction with respect to the optical axis AX of the terminal optical element 13. The region 292G is substantially perpendicular to the optical axis AX of the terminal optical element 13.

The lower surface 30G is substantially perpendicular to the optical axis AX of the terminal optical element 13.

In the present embodiment, the height of the part (lowermost part) 47G of the protection part 211G (wall part 50G) is substantially the same as the height of the lower surface 30G of the second member 22G In other words, the position of the part 47G is substantially the same as the position of the lower surface 30G in the Z axis direction.

The first member 21G includes a recessed part 16G to which the second member 22G is able to be opposite. The region 252G and the region 253G are disposed inside the recessed part 16G At least a portion of the second member 22G (part 221G) moves inside the recessed part 16G At least a portion of the second member 22G (part 221G) moves below the region 252G and the region 253G.

The part 48G of the second member 22G nearest to the optical path AT is disposed outside the part 47G (region 251G) of the first member 21G with respect to the optical path AT. In the movement period of the second member 22G, the part 48G is kept outside the part 47G (region 251G) with respect to the optical path AT.

Also in the present embodiment, the change of the pressure, in which the terminal optical element 13 receives from the liquid LQ in the liquid immersion space LS, is decreased.

Eighth Embodiment

An eighth embodiment will be described. In the descriptions below, the same reference numerals are assigned to the same or similar components as those of the above-described embodiments, and descriptions thereof are simplified or omitted here.

Figure 20:
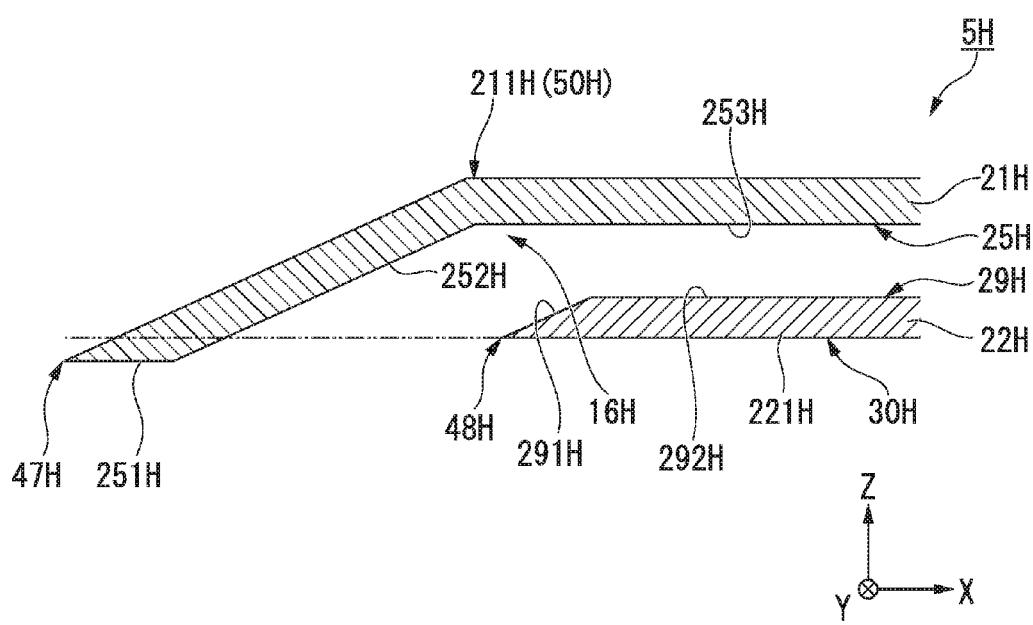
FIG. 20 is a side cross-sectional view showing a portion of a liquid immersion member according to an eighth embodiment.

FIG. 20 is a view showing an example of a liquid immersion member 5H according to the present embodiment. The liquid immersion member 5H includes a first member 21H which includes a protection part 211H (wall part 50H), and a second member 22H which includes a part 221H in which at least a portion is opposite to the protection part 211H. The protection part 211H (wall part 50H) is disposed between the terminal optical element 13 and the second member 22H.

The protection part 211H includes a lower surface 25H to which at least a portion of the second member 22H is able to be opposite. The lower surface 25H includes a region 251H which is nearest to the optical path AT, a region 252H which is disposed outside the region 251H with respect to the optical path AT, and a region 253H which is disposed outside the region 252H with respect to the optical path AT.

The region 251H is substantially perpendicular to the optical axis AX of the terminal optical element 13. The region 252H is upwardly and outwardly inclined in the radial direction with respect to the optical axis AX of the terminal optical element 13. The region 253H is substantially perpendicular to the optical axis AX of the terminal optical element 13.

The protection part 211H includes a part 47H which is nearest to the optical path AT. The part 47H is the lowermost part of the protection part 211H. The part (lowermost part) 47H is a part which is nearest to the upper surface of the substrate P (object) in the first member 21H.

The second member 22H (part 221H) is disposed to be opposite to the first member 21H (protection part 211H) via a gap below the first member 21H (protection part 211H). The second member 22H includes an upper surface 29H in which at least a portion is opposite to the first member 21H, and a lower surface 30H to which the upper surface of the substrate P (object) is able to be opposite.

The upper surface 29H includes a region 291H which is nearest to the optical path AT, and a region 292H which is disposed outside the region 291H with respect to the optical path AT. The region 291H is upwardly and outwardly inclined in the radial direction with respect to the optical axis AX of the terminal optical element 13. The region 292H is substantially perpendicular to the optical axis AX of the terminal optical element 13.

The lower surface 30H is substantially perpendicular to the optical axis AX of the terminal optical element 13.

In the present embodiment, the part (lowermost part) 47H of the protection part 211H (wall part 50H) is disposed below the lower surface 30H of the second member 22H. In order words, the position of the part 47H is positioned to be closer to the −Z side (substrate side) than the position of the lower surface 30H in the Z axis direction. That is, the lower surface 30H is disposed above the part 47H and the region 251H.

The first member 21H includes a recessed part 16H to which the second member 22H is able to be opposite. The region 252H and the region 253H are disposed inside the recessed part 16H. At least a portion of the second member 22H (part 221H) moves inside the recessed part 16H. At least a portion of the second member 22H (part 221H) moves below the region 252H and the region 253H.

The part 48H of the second member 22H nearest to the optical path AT is disposed outside the part 47H (region 251H) of the first member 21H with respect to the optical path AT. In the movement period of the second member 22H, the part 48H is disposed outside the part 47H (region 251H) with respect to the optical path AT.

Also in the present embodiment, the change of the pressure, in which the terminal optical element 13 receives from the liquid LQ in the liquid immersion space LS, is decreased.

Ninth Embodiment

A ninth embodiment will be described. In the descriptions below, the same reference numerals are assigned to the same or similar components as those of the above-described embodiments, and descriptions thereof are simplified or omitted here.

Figure 21:
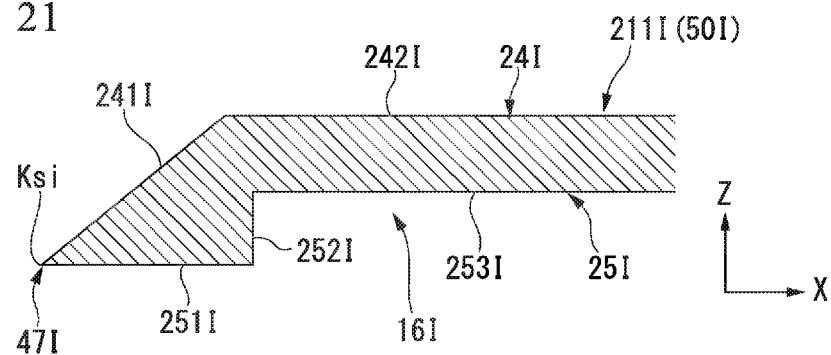
FIG. 21 is a side cross-sectional view showing a portion of a first member according to a ninth embodiment.

FIG. 21 is a view showing an example of a protection part 211I (wall part 50I) according to the present embodiment. The protection part 211I includes an upper surface 24I, and a lower surface 25I in which at least a portion is able to be opposite to the second member (22 or the like).

The upper surface 24I includes a region 241I which is nearest to the optical path AT, and a region 242I which is disposed outside the region 241I with respect to the optical path AT.

The region 241I is upwardly and outwardly inclined in the radial direction with respect to the optical axis AX of the terminal optical element 13. The region 242I is substantially perpendicular to the optical axis AX of the terminal optical element 13.

The lower surface 25I includes a region 251I which is nearest to the optical path AT, a region 252I which is disposed outside the region 251I with respect to the optical path AT, and a region 253I which is disposed outside the region 252I with respect to the optical path AT.

The region 251I is substantially perpendicular to the optical axis AX of the terminal optical element 13. The region 252I is substantially parallel to the optical axis AX of the terminal optical element 13. The region 253I is substantially perpendicular to the optical axis AX of the terminal optical element 13. The region 253I is disposed above the region 251I. The lower surface 25I includes a step between the region 251I and the region 253I.

The protection part 211I (wall part 50I) includes a recessed part 16I to which the second member (22 or the like) is able to be opposite. The region 252I and the region 253I are disposed inside the recessed part 16I.

In the present embodiment, a part 47I, which is nearest to the optical path AT in the protection part 211I, includes a corner portion Ksi which is formed between the region 241I and the region 251I. The corner portion Ksi is the lowermost part of the protection part 211I. In the present embodiment, the lowermost part of the protection part 211I includes the corner portion Ksi and the region 251I.

The second member (22 or the like) may move below the recessed part 16I, and may move inside the recessed part 16I.

Also in the present embodiment, the change of the pressure, in which the terminal optical element 13 receives from the liquid LQ in the liquid immersion space LS, is decreased.

Tenth Embodiment

A tenth embodiment will be described. In the descriptions below, the same reference numerals are assigned to the same or similar components as those of the above-described embodiments, and descriptions thereof are simplified or omitted here.

Figure 22:
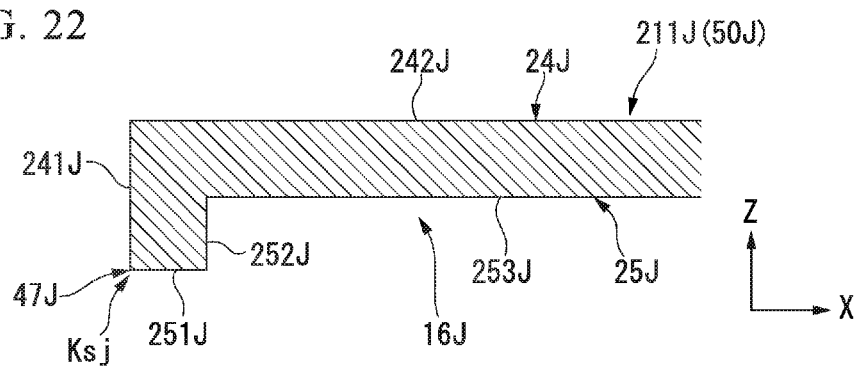
FIG. 22 is a side cross-sectional view showing a portion of a first member according to a tenth embodiment.

FIG. 22 is a view showing an example of a protection part 211J (wall part 50J) according to the present embodiment. The protection part 211J includes an upper surface 24J, and a lower surface 25J in which at least a portion is able to be opposite to the second member (22 or the like).

The upper surface 24J includes a region 241J which is nearest to the optical path AT, and a region 242J which is disposed outside the region 241J with respect to the optical path AT.

The region 241J is substantially parallel to the optical axis AX of the terminal optical element 13. The region 242J is substantially perpendicular to the optical axis AX of the terminal optical element 13.

The lower surface 25J includes a region 251J which is nearest to the optical path AT, a region 252J which is disposed outside the region 251J with respect to the optical path AT, and a region 253J which is disposed outside the region 252J with respect to the optical path AT.

The region 251J is substantially perpendicular to the optical axis AX of the terminal optical element 13. The region 252J is substantially parallel to the optical axis AX of the terminal optical element 13. The region 253J is substantially perpendicular to the optical axis AX of the terminal optical element 13. The region 253J is disposed above the region 251J. The lower surface 25J includes a step between the region 251J and the region 253J.

The protection part 211J (wall part 50J) includes a recessed part 16J to which the second member (22 or the like) is able to be opposite. The region 252J and the region 253J are disposed inside the recessed part 16J.

In the present embodiment, a part 47J, which is nearest to the optical path AT in the protection part 211J, includes a corner portion Ksj which is formed between the region 241J and the region 251J. Moreover, the part 47J which is nearest to the optical path AT in the protection part 211J includes the region 241J.

In the present embodiment, the lowermost part of the protection part 211J includes the corner portion Ksj. Moreover, the lowermost part of the protection part 211J includes the region 251J.

That is, in the present embodiment, the lowermost part which is nearest to the optical path AT in the protection part 211J includes the corner portion Ksj.

The second member (22 or the like) may move below the recessed part 16J, and may move inside the recessed part 16J.

Also in the present embodiment, the change of the pressure, in which the terminal optical element 13 receives from the liquid LQ in the liquid immersion space LS, is decreased.

Eleventh Embodiment

An eleventh embodiment will be described. In the descriptions below, the same reference numerals are assigned to the same or similar components as those of the above-described embodiments, and descriptions thereof are simplified or omitted here.

Figure 23:
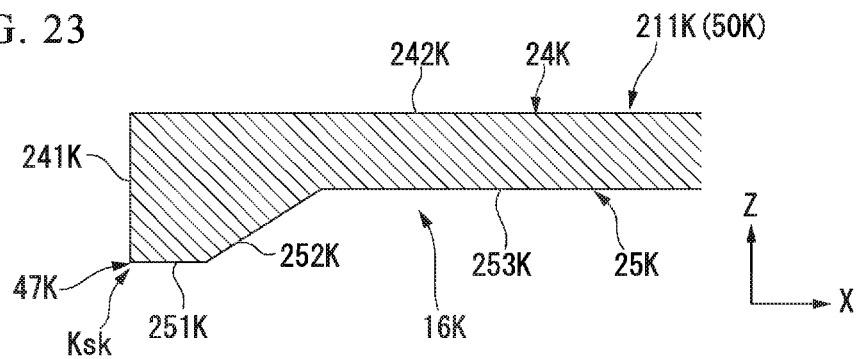
FIG. 23 is a side cross-sectional view showing a portion of a first member according to an eleventh embodiment.

FIG. 23 is a view showing an example of a protection part 211K (wall part 50K) according to the present embodiment. The protection part 211K includes an upper surface 24K, and a lower surface 25K in which at least a portion is able to be opposite to the second member (22 or the like).

The upper surface 24K includes a region 241K which is nearest to the optical path AT, and a region 242K which is disposed outside the region 241K with respect to the optical path AT.

The region 241K is substantially parallel to the optical axis AX of the terminal optical element 13. The region 242K is substantially perpendicular to the optical axis AX of the terminal optical element 13.

The lower surface 25K includes a region 251K which is nearest to the optical path AT, a region 252K which is disposed outside the region 251K with respect to the optical path AT, and a region 253K which is disposed outside the region 252K with respect to the optical path AT.

The region 251K is substantially perpendicular to the optical axis AX of the terminal optical element 13. The region 252K is upwardly and outwardly inclined in the radial direction with respect to the optical axis AX of the terminal optical element 13. The region 253K is substantially perpendicular to the optical axis AX of the terminal optical element 13. The region 253K is disposed above the region 251K. The lower surface 25K includes a step between the region 251K and the region 253K.

The protection part 211K (wall part 50K) includes a recessed part 16K to which the second member (22 or the like) is able to be opposite. The region 252K and the region 253K are disposed inside the recessed part 16K.

In the present embodiment, a part 47K, which is nearest to the optical path AT in the protection part 211K, includes a corner portion Ksk which is formed between the region 241K and the region 251K. Moreover, the part 47K which is nearest to the optical path AT in the protection part 211K includes the region 241K.

In the present embodiment, the lowermost part of the protection part 211K includes the corner portion Ksk. In addition, the lowermost part of the protection part 211K includes the region 251K.

That is, in the present embodiment, the lowermost part which is nearest to the optical path AT in the protection part 211K includes the corner portion Ksk.

The second member (22 or the like) may move below the recessed part 16K, and may move inside the recessed part 16K.

Also in the present embodiment, the change of the pressure, in which the terminal optical element 13 receives from the liquid LQ in the liquid immersion space LS, is decreased.

Twelfth Embodiment

A twelfth embodiment will be described. In the descriptions below, the same reference numerals are assigned to the same or similar components as those of the above-described embodiments, and descriptions thereof are simplified or omitted here.

Figure 24:
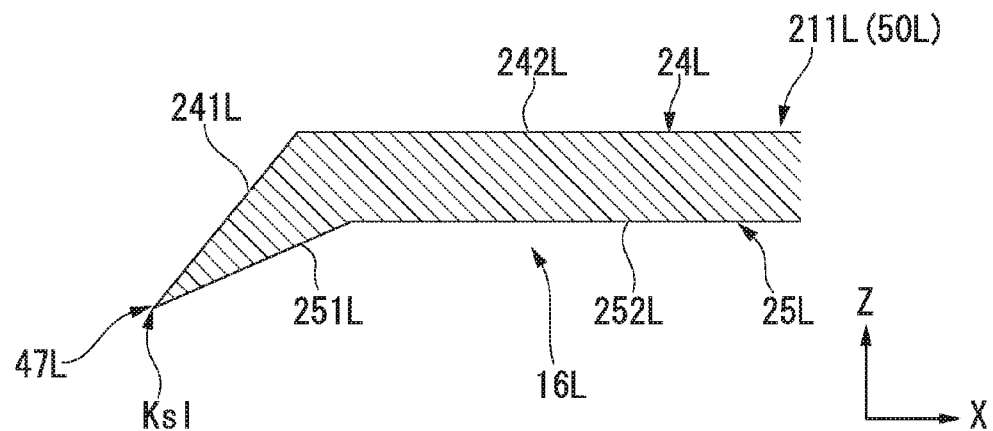
FIG. 24 is a side cross-sectional view showing a portion of a first member according to a twelfth embodiment.

FIG. 24 is a view showing an example of a protection part 211L (wall part 50L) according to the present embodiment. The protection part 211L includes an upper surface 24L, and a lower surface 25L to which at least a portion is able to be opposite to the second member (22 or the like).

The upper surface 24L includes a region 241L which is nearest to the optical path AT, and a region 242L which is disposed outside the region 241L with respect to the optical path AT.

The region 241L is upwardly and outwardly inclined in the radial direction with respect to the optical axis AX of the terminal optical element 13. The region 242L is substantially perpendicular to the optical axis AX of the terminal optical element 13.

The lower surface 25L includes a region 251L which is nearest to the optical path AT, and a region 252L which is disposed outside the region 251L with respect to the optical path AT.

The region 251L is upwardly and outwardly inclined in the radial direction with respect to the optical axis AX of the terminal optical element 13. The region 252L is substantially perpendicular to the optical axis AX of the terminal optical element 13. The region 252L is disposed above the region 251L.

The protection part 211L (wall part 50L) includes a recessed part 16L to which the second member (22 or the like) is able to be opposite. The region 251L and the region 252L are disposed inside the recessed part 16L.

In the present embodiment, a part 47L, which is nearest to the optical path AT in the protection part 211L, includes a corner portion Ks1 which is formed between the region 241L and the region 251L.

In the present embodiment, the lowermost part of the protection part 211L includes the corner portion Ksl.

The second member (22 or the like) may move below the recessed part 16L, and may move inside the recessed part 16L.

Also in the present embodiment, the change of the pressure, in which the terminal optical element 13 receives from the liquid LQ in the liquid immersion space LS, is decreased.

Thirteenth Embodiment

A thirteenth embodiment will be described. In the descriptions below, the same reference numerals are assigned to the same or similar components as those of the above-described embodiments, and descriptions thereof are simplified or omitted here.

Figure 25:
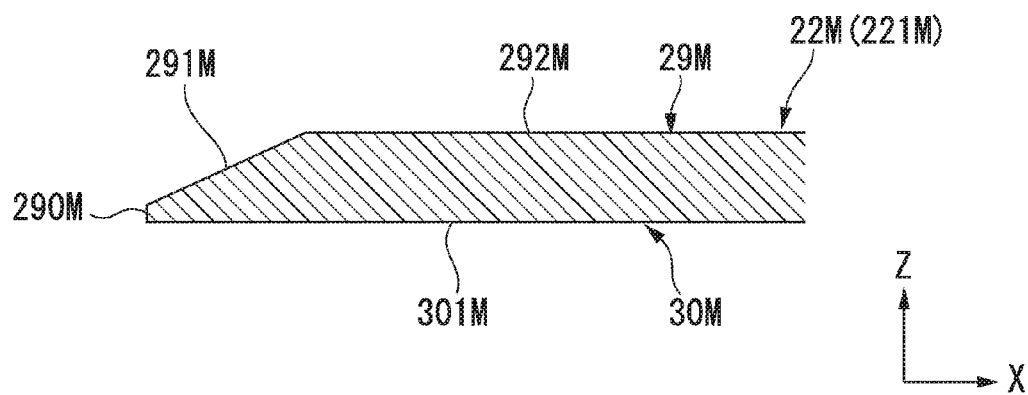
FIG. 25 is a side cross-sectional view showing a portion of a first member according to a thirteenth embodiment.

FIG. 25 is a view showing an example of a second member 22M (part 221M) according to the present embodiment. The second member 22M includes an upper surface 29M, a lower surface 30M to which the upper surface of the substrate P (object) is able to be opposite, and an inner surface 290M which faces the optical path AT.

The upper surface 29M includes a region 291M, and a region 292M which is disposed outside the region 291M with respect to the optical path AT. The region 292M is disposed above the region 291M.

The region 291M is upwardly and outwardly inclined in the radial direction with respect to the optical axis AX of the terminal optical element 13. The region 292M is substantially perpendicular to the optical axis AX of the terminal optical element 13.

The lower surface 30M includes a region 301M. The region 301M is substantially perpendicular to the optical axis AX of the terminal optical element 13.

The inner surface 290M is substantially parallel to the optical axis AX of the terminal optical element 13.

In the present embodiment, the region 291M and the inner surface 290M are end surfaces of the second member 22M facing the optical path AT. In the descriptions below, among the region 291M and the inner surface 290M of the second member 22M facing the optical path AT, the inner surface 290M is appropriately referred to as a first inner surface 290M, and the region 291M is appropriately referred to as a second inner surface 291M.

The second inner surface 291M is disposed above the first inner surface 290M. The lower end of the second inner surface 291M is connected to the first inner surface 290M. The upper end of the second inner surface 291M is connected to the region 292M of the upper surface 29M.

The first inner surface 290M and the second inner surface 291M are not parallel with each other. With respect to the Z axis direction parallel to the optical axis AX of the terminal optical element 13, a size of the second inner surface 291M is larger than a size of the first inner surface 290M.

In the present embodiment, the first inner surface 290M is substantially parallel to the optical axis AX of the terminal optical element 13. The second inner surface 291M is upwardly and outwardly inclined with respect to the optical path AT.

Also in the present embodiment, the second member 22M is able to move smoothly in the state where the end surface of the second member 22M is disposed in the liquid immersion space LS. Moreover, even when the second member 22M moves in the state where the end surface of the second member 22M is disposed in the liquid immersion space LS, the change of the pressure of the liquid LQ in the liquid immersion space LS is suppressed.

Fourteenth Embodiment

A fourteenth embodiment will be described. In the descriptions below, the same reference numerals are assigned to the same or similar components as those of the above-described embodiments, and descriptions thereof are simplified or omitted here.

Figure 26:
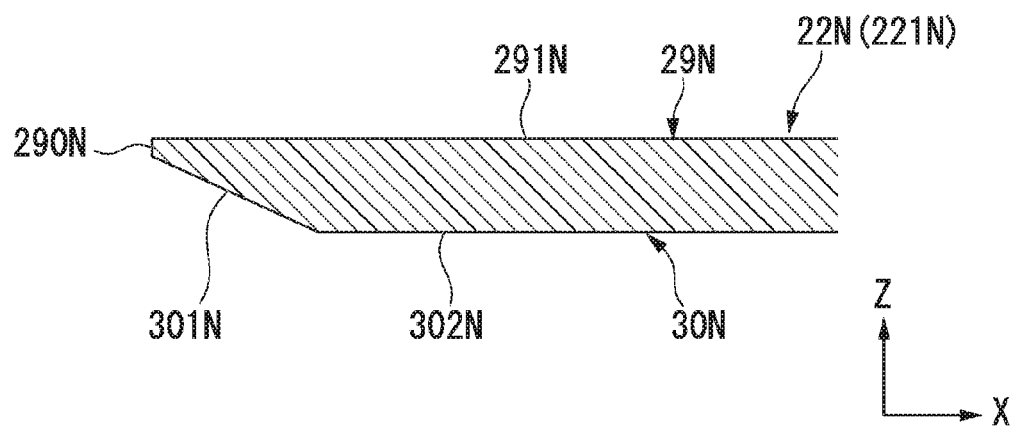
FIG. 26 is a side cross-sectional view showing a portion of a first member according to a fourteenth embodiment.

FIG. 26 is a view showing an example of a second member 22N (part 221N) according to the present embodiment. The second member 22N includes an upper surface 29N, a lower surface 30N to which the upper surface of the substrate P (object) is able to be opposite, and an inner surface 290N which faces the optical path AT.

The upper surface 29N includes a region 291N. The region 291N is substantially perpendicular to the optical axis AX of the terminal optical element 13.

The lower surface 30N includes a region 301N, and a region 302N which is disposed outside the region 301N with respect to the optical path AT. The region 302N is disposed below the region 301N.

The region 301N is downwardly and outwardly inclined in the radial direction with respect to the optical axis AX of the terminal optical element 13. The region 302N is substantially perpendicular to the optical axis AX of the terminal optical element 13.

In the present embodiment, the inner surface 290N and the region 301N are end surfaces of the second member 22N facing the optical path AT. In the descriptions below, among the inner surface 290N and the region 301N of the second member 22N facing the optical path AT, the inner surface 290N is appropriately referred to as a first inner surface 290N, and the region 301N is appropriately referred to as a second inner surface 301N.

The second inner surface 301N is disposed below the first inner surface 290N. The upper end of the second inner surface 301N is connected to the first inner surface 290N. The lower end of the second inner surface 301N is connected to the region 302N of the lower surface 30N.

The first inner surface 290N and the second inner surface 301N are not parallel with each other. With respect to the Z axis direction parallel to the optical axis AX of the terminal optical element 13, a size of the second inner surface 301N is larger than a size of the first inner surface 290N.

In the present embodiment, the first inner surface 290N is substantially parallel to the optical axis AX of the terminal optical element 13. The second inner surface 301N is downwardly and outwardly inclined with respect to the optical path AT.

Also in the present embodiment, the second member 22N is able to move smoothly in the state where the end surface of the second member 22N is disposed in the liquid immersion space LS. Moreover, even when the second member 22N moves in the state where the end surface of the second member 22N is disposed in the liquid immersion space LS, the change of the pressure of the liquid LQ in the liquid immersion space LS is suppressed.

Fifteenth Embodiment

A fifteenth embodiment will be described. In the descriptions below, the same reference numerals are assigned to the same or similar components as those of the above-described embodiments, and descriptions thereof are simplified or omitted here.

Figure 27:
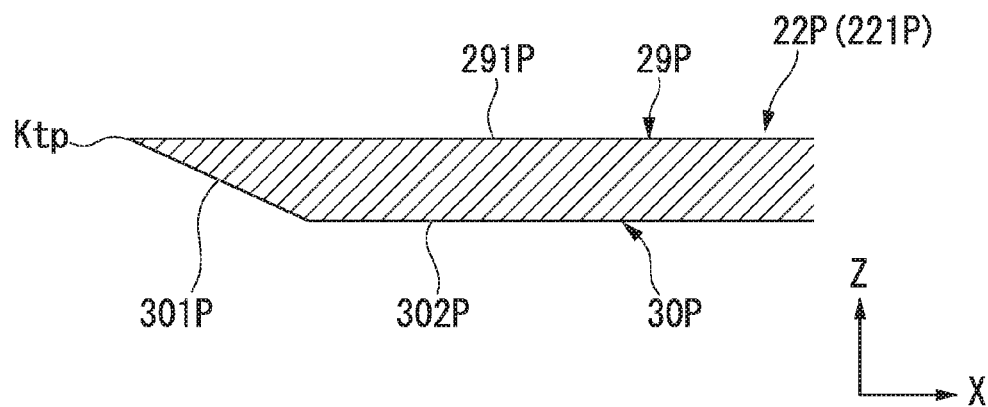
FIG. 27 is a side cross-sectional view showing a portion of a first member according to a fifteenth embodiment.

FIG. 27 is a view showing an example of a second member 22P (part 221P) according to the present embodiment. The second member 22P includes an upper surface 29P, and a lower surface 30P to which the upper surface of the substrate P (object) is able to be opposite.

The upper surface 29P includes a region 291P which is substantially perpendicular to the optical axis AX of the terminal optical element 13.

The lower surface 30P includes a region 301P, and a region 302P which is disposed outside the region 301P with respect to the optical path AT. The region 301P is downwardly and outwardly inclined in the radial direction with respect to the optical axis AX of the terminal optical element 13. The region 302P is substantially perpendicular to the optical axis AX of the terminal optical element 13.

A size of the region 302P is larger than a size of the region 301P in the radial direction with respect to the optical axis AX.

The region 301P faces the optical path AT. The region 301P may also be referred to as an end surface of the second member 22P facing the optical path AT.

A corner portion Ktp is formed between the region 291P and the region 301P. The part which is nearest to the optical path AT in the second member 22P includes the corner portion Ktp.

Also in the present embodiment, the second member 22P is able to move smoothly in the state where the end surface of the second member 22P is disposed in the liquid immersion space LS. Moreover, even when the second member 22P moves in the state where the end surface of the second member 22P is disposed in the liquid immersion space LS, the change of the pressure of the liquid LQ in the liquid immersion space LS is suppressed.

Sixteenth Embodiment

A sixteenth embodiment will be described. In the descriptions below, the same reference numerals are assigned to the same or similar components as those of the above-described embodiments, and descriptions thereof are simplified or omitted here.

Figure 28:
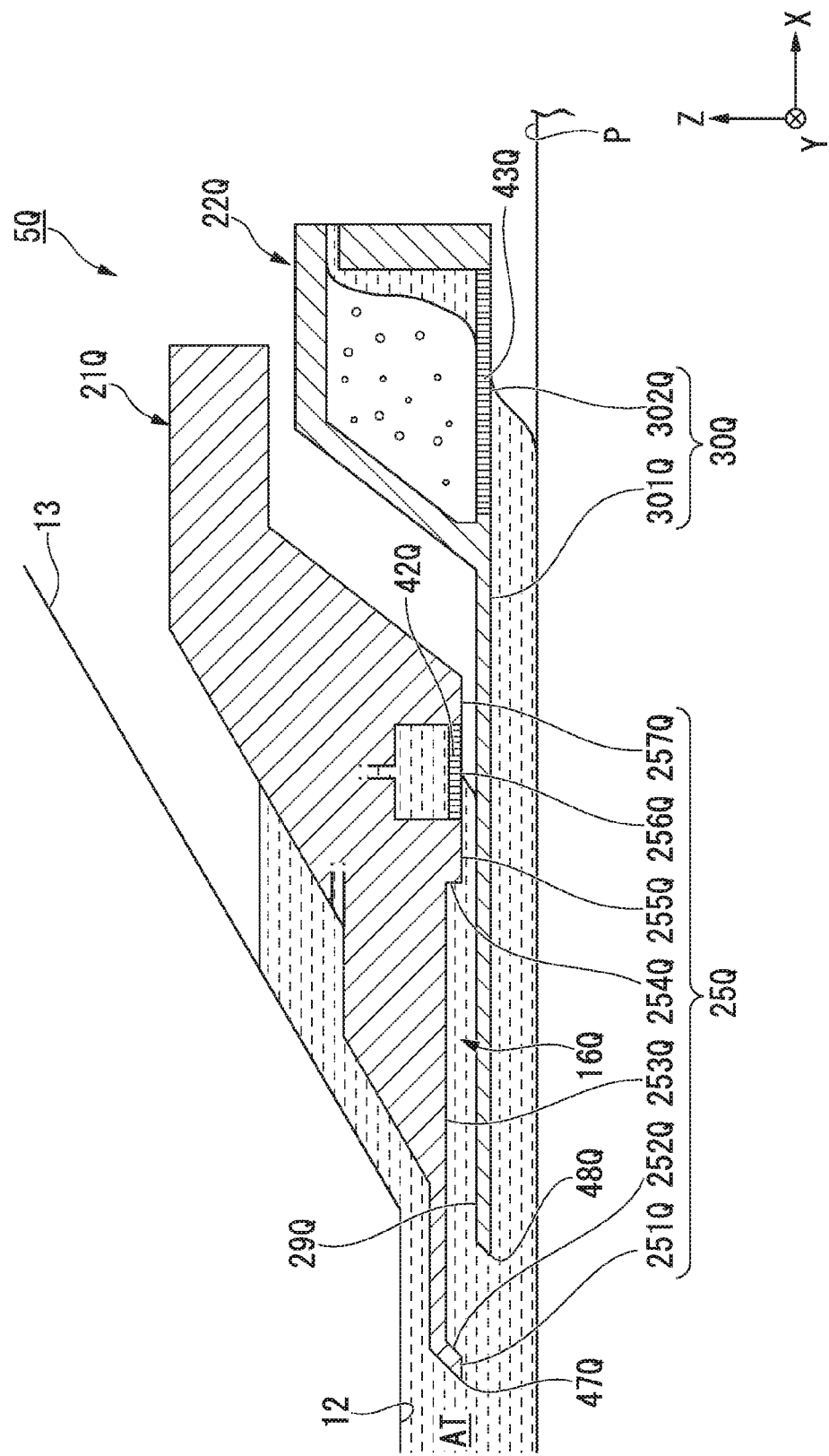
FIG. 28 is a side cross-sectional view showing a portion of a liquid immersion member according to a sixteenth embodiment.

FIG. 28 is a view showing an example of a liquid immersion member 5Q according to the present embodiment. The liquid immersion member 5Q includes a first member 21Q having a lower surface 25Q, and a second member 22Q having an upper surface 29Q and a lower surface 30Q.

The lower surface 25Q of the first member 21Q includes a region 251Q, a region 252Q which is disposed outside the region 251Q with respect to the optical path AT, a region 253Q which is disposed outside the region 252Q with respect to the optical path AT, a region 254Q which is disposed outside the region 253Q with respect to the optical path AT, a region 255Q which is disposed outside the region 254Q with respect to the optical path AT, a region 256Q which is disposed outside the region 255Q with respect to the optical path AT, and a region 257Q which is disposed outside the region 256Q with respect to the optical path AT. At least a portion of the lower surface 25Q is able to be opposite to the upper surface 29Q of the second member 22Q.

A part 47Q, which is nearest to the optical path AT in the first member 21Q, is disposed at the inner edge part of the region 251Q.

The region 252Q is inclined with respect to the optical axis AX of the terminal optical element 13. The region 252Q is upwardly and outwardly inclined in the radial direction with respect to the optical axis AX.

In the present embodiment, the region 251Q is substantially perpendicular to the optical axis AX. That is, the region 251Q is substantially parallel to the XY plane. The region 253Q is substantially perpendicular to the optical axis AX. That is, the region 253Q is substantially parallel to the XY plane. The region 252Q is an inclined region which connects the region 251Q and the region 253Q. A step is formed between the region 251Q and the region 253Q.

In the present embodiment, the region 254Q is substantially parallel to the optical axis AX.

In the present embodiment, the region 255Q is substantially perpendicular to the optical axis AX. That is, the region 255Q is substantially parallel to the XY plane. The region 256Q is substantially perpendicular to the optical axis AX. That is, the region 256Q is substantially parallel to the XY plane. The region 257Q is substantially perpendicular to the optical axis AX. That is, the region 257Q is substantially parallel to the XY plane. The region 254Q is a region which connects the region 253Q and the region 255Q. A step is formed between the region 253Q and the region 255Q.

With respect to the Z axis direction, the region 255Q, the region 256Q, and the region 257Q are disposed at substantially the same position (height). The region 255Q, the region 256Q, and the region 257Q are positioned in substantially the same plane.

With respect to the Z axis direction, the position of the region 251Q, and the positions of the region 252Q, the region 253Q, and the region 254Q are different from one another. With the Z axis direction, the positions of the region 252Q, the region 253Q, and the region 254Q, and the positions of the regions 255Q, the region 256Q, and the region 257Q are different.

The region 252Q, the region 253Q, and the region 254Q are disposed above (at the +Z side of) the region 251Q. The region 255Q, the region 256Q, and the region 257Q are disposed below (at the −Z sides of) the region 252Q, the region 253Q, and the region 254Q.

In the present embodiment, the region 251Q is disposed below (at the −Z sides of) the region 255Q, the region 256Q, and the region 257Q. Moreover, with respect to the Z axis direction, the position of the region 251Q, and the positions of the region 255Q, the region 256Q, and the region 257Q may be substantially the same.

The first member 21Q includes a recessed part 16Q to which the second member 22Q is able to be opposite. The region 252Q, the region 253Q, and the region 254Q are disposed inside the recessed part 16Q.

The region 251Q, the region 252Q, the region 253Q, the region 254Q, the region 255Q, and the region 257Q are non-recovery regions which are not able to recover the liquid LQ. The region 256Q is a recovery region which is able to recover the liquid LQ. The region 256Q includes a liquid recovery part 42Q.

The lower surface 30Q of the second member 22Q includes a region 301Q, and a region 302Q which is disposed outside the region 301Q with respect to the optical path AT. At least a portion of the lower surface 30Q is able to be opposite to the substrate P (object).

A part 48Q, which is nearest to the optical path AT in the second member 22Q, is disposed at the inner edge part of the region 301Q.

In the present embodiment, the region 301Q is substantially perpendicular to the optical axis AX. That is, the region 301Q is substantially parallel to the XY plane. The region 302Q also is substantially perpendicular to the optical axis AX. That is, the region 302Q also is substantially parallel to the XY plane.

With respect to the Z axis direction, the region 301Q and the region 302Q are disposed at substantially the same position (height). The region 301Q and the region 302Q are disposed in substantially the same plane.

The region 301Q is a non-recovery region which is not able to recover the liquid LQ. The region 302Q is a recovery region which is able to recover the liquid LQ. The region 302Q includes a liquid recovery part 43Q.

At least a portion of the second member 22Q is movable below the recessed part 16Q. At least a portion of the second member 22Q is movable below the region 252Q and the region 253Q.

Figure 29:
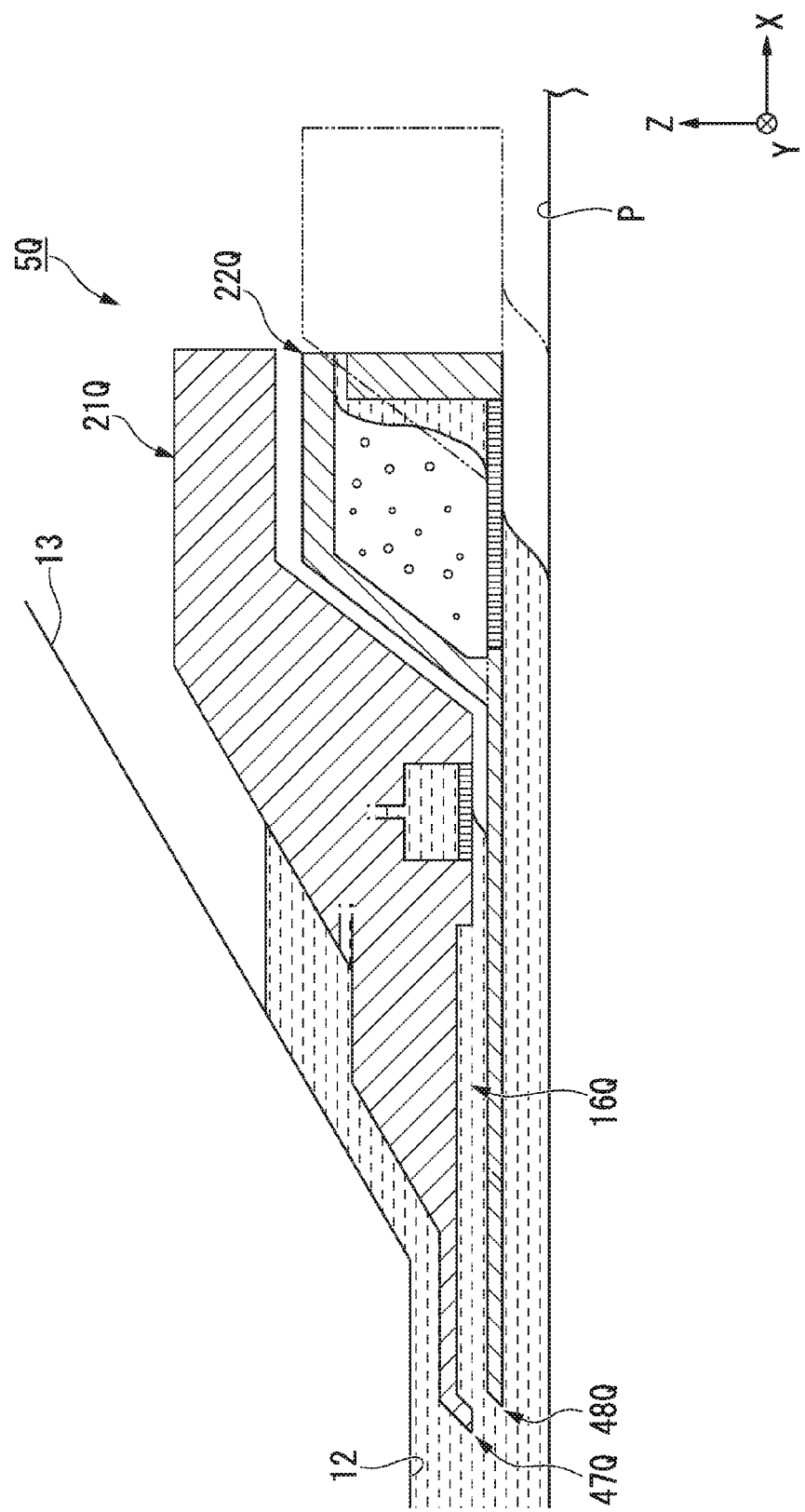
FIG. 29 is a side cross-sectional view showing a portion of the liquid immersion member according to the sixteenth embodiment.

As shown in FIG. 29, the second member 22Q is movable so that the part 48Q is continuously disposed outside the part 47Q with respect to the optical path AT.

Also in the present embodiment, the change of the pressure, in which the terminal optical element 13 receives from the liquid LQ in the liquid immersion space LS, is decreased.

Seventeenth Embodiment

A seventeenth embodiment will be described. In the descriptions below, the same reference numerals are assigned to the same or similar components as those of the above-described embodiments, and descriptions thereof are simplified or omitted here.

Figure 30:
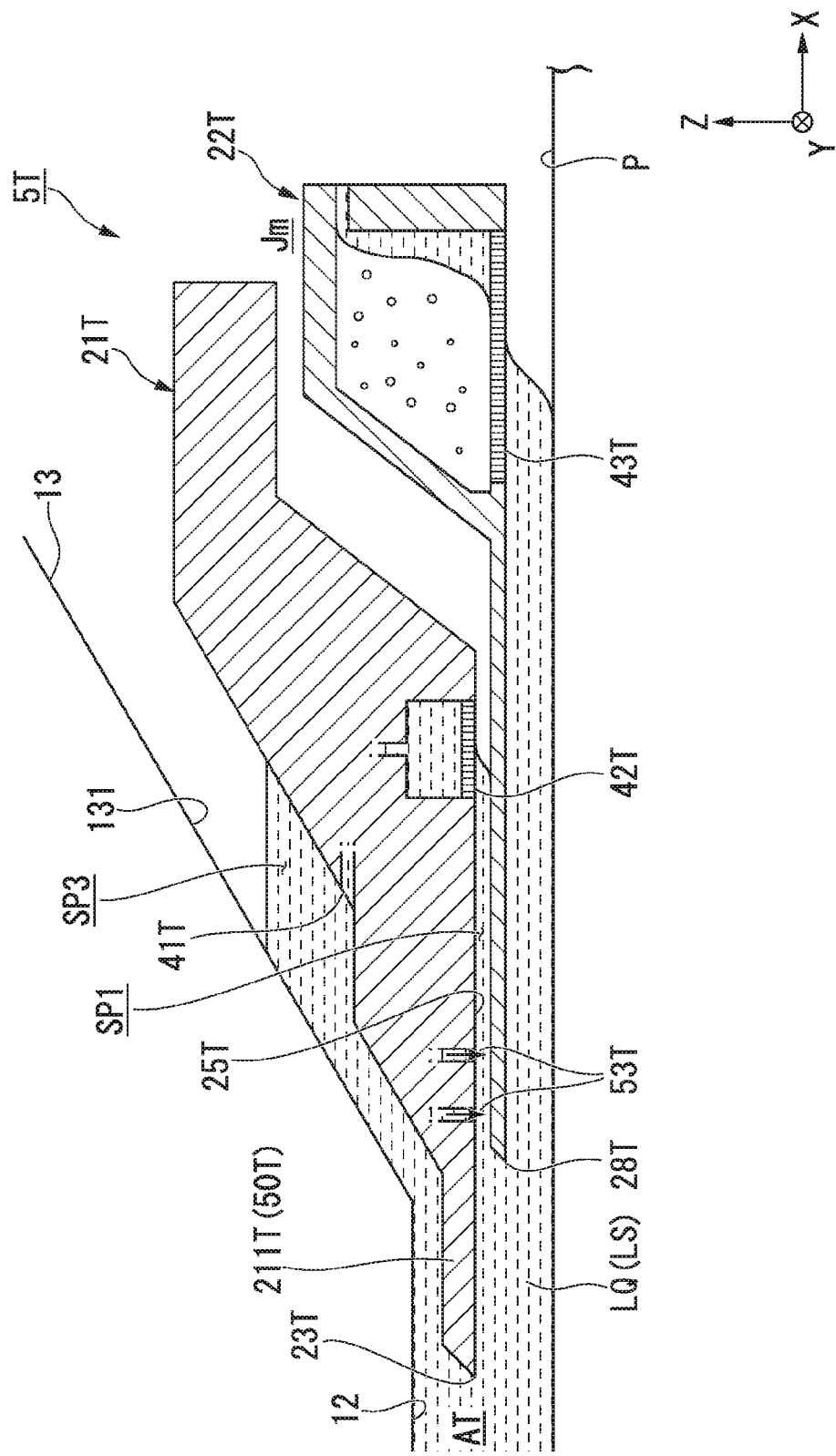
FIG. 30 is a side cross-sectional view showing a portion of a liquid immersion member according to a seventeenth embodiment.

FIG. 30 is a view showing an example of a liquid immersion member 5T according to the present embodiment. The liquid immersion member 5T includes a first member 21T, and a second member 22T which is movable.

The first member 21T includes a liquid supply part 41T which is able to supply the liquid LQ to form the liquid immersion space LS, a liquid supply part 53T which is able to supply the liquid LQ, and a liquid recovery part 42T which is able to recover the liquid LQ. Moreover, the first member 21T includes a protection part 211T (wall part 50T) which is disposed between the terminal optical element 13 and the second member 22T.

The second member 22T includes a liquid recovery part 43T which is able to recover the liquid LQ. The liquid recovery part 43T is able to be opposite to the substrate P (object).

The liquid supply part 41T is disposed at the first member 21T to face the third space SP3 between the outer surface 131 of the terminal optical element 13 and the first member 21T. In addition, the liquid supply part 41T may be disposed at the first member 21T to face the optical path space SPK which includes the optical path ATL of the exposure light EL emitted from the emitting surface 12.

The liquid recovery part 42T is disposed to face the first space SP1 which is formed below the lower surface 25T of the first member 21T.

The liquid supply part 53T is disposed to face the first space SP1 which is formed below the lower surface 25T of the first member 21T. The first space SP1 includes the space between the first member 21T and the second member 22T.

The liquid supply part 53T is disposed in the movement direction of the second member 22T with respect to the optical path AT (the optical axis of the terminal optical element 13). In the present embodiment, the liquid supply part 53T is disposed at each of the +X side and −X side with respect to the optical path AT (the optical axis AX of the terminal optical element 13).

The liquid supply part 53T is disposed at the lower surface 25T of the first member 21T. The lower surface 25T is disposed at the surrounding of the lower end of the first opening part 23T through which the exposure light EL is able to pass.

The liquid supply part 53T is formed on the lower surface 25T, and includes an opening (liquid supply port) which is able to supply the liquid LQ. In the present embodiment, a plurality of liquid supply ports is disposed in the radial direction with respect to the optical axis AX of the terminal optical element 13. In the example shown in FIG. 30, two liquid supply ports are disposed at the +X side lower surface 25T with respect to the optical path AT. A plurality of (two) liquid supply ports also are disposed at the −X side lower surface 25T with respect to the optical path AT.

Figure 31:
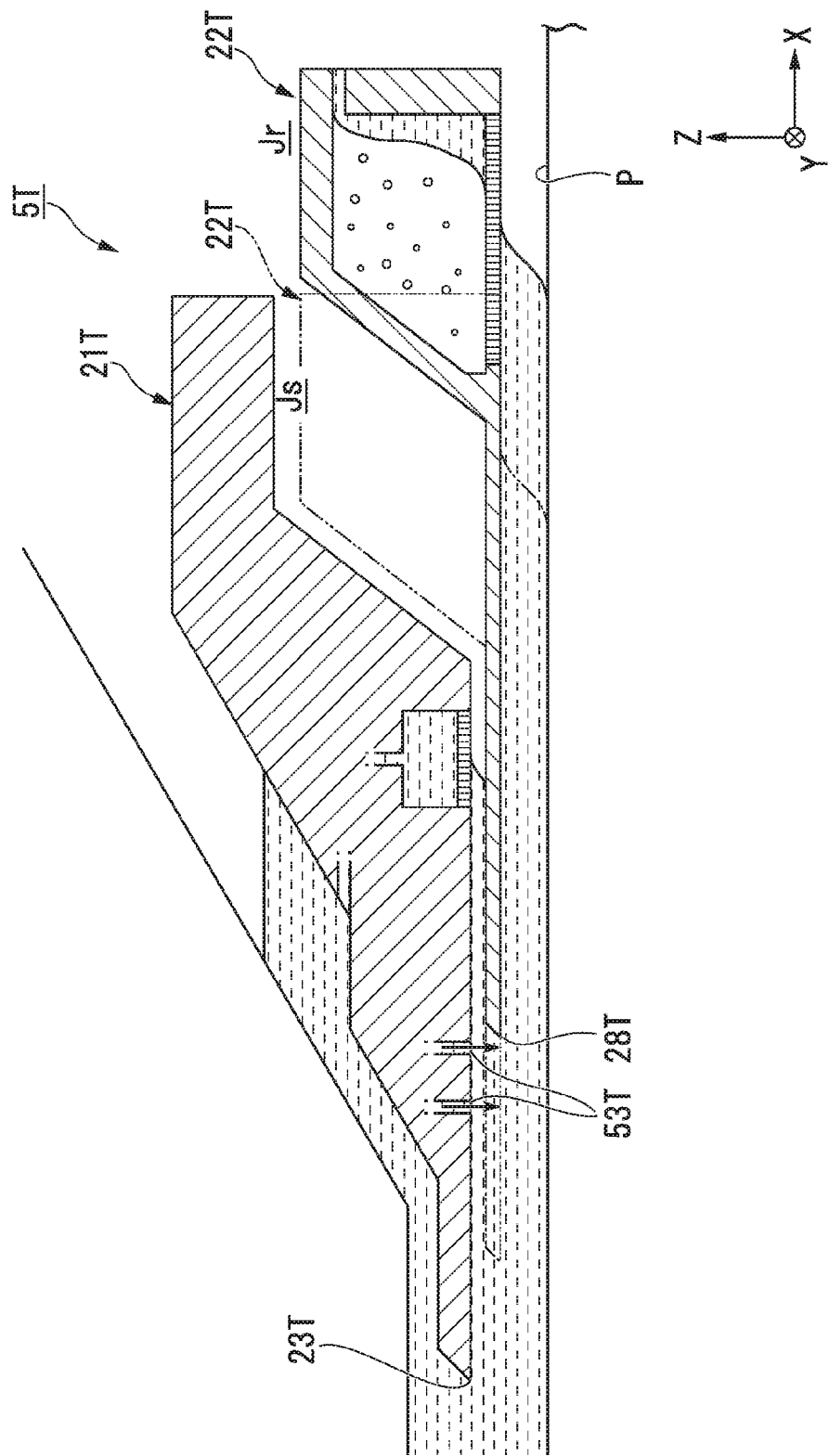
FIG. 31 is a side cross-sectional view showing a portion of the liquid immersion member according to the seventeenth embodiment.

FIG. 30 shows a state where the second member 22T is disposed at the origin point (center position Jm). FIG. 31 shows a state where the second member 22T is disposed at the first end position Jr and a state where the second member 22T is disposed at the second end position Js. In FIG. 31, the second member 22T which is disposed at the first end position Jr is indicated by a solid line, and the second member 22T which is disposed at the second end position Js is indicated by a chain line.

As shown in FIGS. 30 and 31, in the state where the second member 22T is disposed at the center position Jm, or in the state where the second member 22T is disposed at the second end position Js, the liquid supply part 53T, which is disposed at the +X side lower surface 25T with respect to the optical path AT, is opposite to the second member 22T.

As shown in FIG. 31, in the state where the second member 22T is disposed at the first end position Jr, the liquid supply part 53T, which is disposed at the +X side lower surface 25T with respect to the optical path AT, is not opposite to the second member 22T, and is opposite to the substrate P (object).

That is, the second member 22T is movable to change from one of the state where the second member 22T is opposite to the liquid supply part 53T and the state where the second member 22T is not opposite to the liquid supply part 53T to the other state. In the movement of the second member 22T in the X axis direction, the second member 22T is changed from one of the state where the second member 22T is opposite to the liquid supply part 53T and the state where second member 22T is not opposite to the liquid supply part 53T to the other state.

Moreover, although it is not shown, in the state where the second member 22T is disposed at the center position Jm, or in the state where the second member 22T is disposed at the first end position Jr, the liquid supply part 53T disposed at the −X side lower surface 25T with respect to the optical path AT is opposite to the second member 22T.

In addition, in the state where the second member 22T is disposed at the second end position Js, the liquid supply part 53T disposed at the −X side lower surface 25T with respect to the optical path AT is not opposite to the second member 22T, and is opposite to the substrate P (object).

In at least a part of a period in which the second member 22 moves, the liquid LQ is supplied from the liquid supply part 53T.

In the present embodiment, as shown in FIG. 30, in the state where the second member 22T is opposite to the liquid supply part 53T, the liquid LQ is supplied from the liquid supply part 53T. The liquid supply part 53T supplies the liquid LQ to the first space SP1 between the first member 21T and the second member 22T.

Moreover, in the present embodiment, as shown in FIG. 31, in the state where the second member 22T is not opposite to the liquid supply part 53T, the liquid LQ is supplied from the liquid supply part 53T. The liquid supply part 53T supplies the liquid LQ to the space between the first member 21T and the substrate P (object).

When the second member 22T moves in the state where the liquid immersion space LS is formed, if bubbles occur in the liquid LQ of the optical path space SPK including the optical path ATL of the exposure light EL, or a gas portion occurs in the liquid LQ of the optical path space SPK, or the like, the optical path space SPK may not be sufficiently filled with the liquid LQ.

In the present embodiment, since the liquid supply part 53T is provided, the bubbles (gas portion) are prevented from occurring in the liquid LQ of the optical path space SPK.

Figure 32:
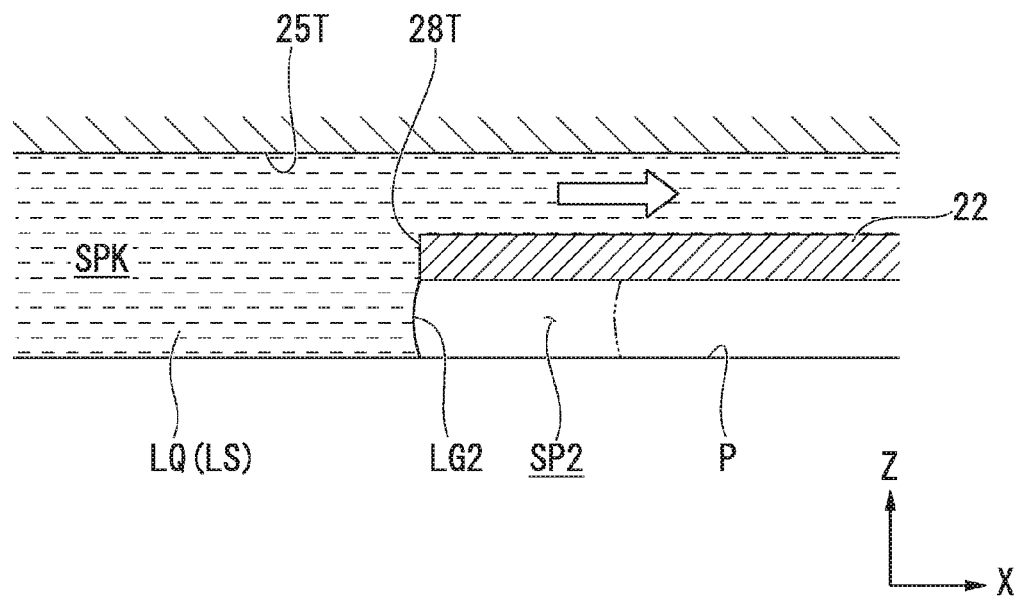
FIG. 32 is a view showing a comparative example.

FIG. 32 shows an example of the liquid immersion member which does not include the liquid supply part 53T. The second member 22T includes a second opening part 28T through which the exposure light EL is able to pass. The second member 22T moves in the state where the liquid immersion space LS is formed, and thus, there is a possibility that the interface LG2 of the liquid LQ between the second member 22T and the substrate P (object) may move in a way to approach the second opening part 28T. For example, the substrate P (object) moves in the Y axis direction while the second member 22T moves in the X axis direction, and thus, there is a possibility that the interface LG2 of the liquid LQ may move in a way to approach the second opening part 28T. If the interface LG2 of the liquid LQ moves to approach the second opening part 28T and at least a portion of the interface LG2 moves below the second opening part 28T, there is a possibility that the bubbles (gas portion) may occur in the liquid LQ of the optical path space SPK.

Figure 33:
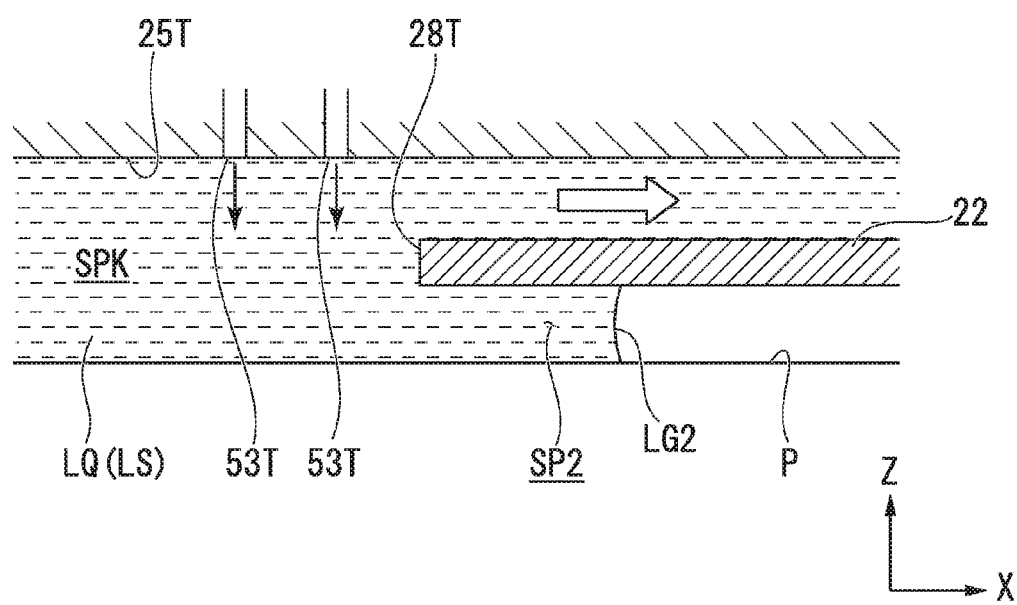
FIG. 33 is a view showing an example of the liquid immersion member according to the seventeenth embodiment.

FIG. 33 shows an example of the liquid immersion member 5T according to the present embodiment. The liquid supply part 53T is provided at the liquid immersion member 5T according to the present embodiment. Accordingly, even when the second member 22T moves in the state where the liquid immersion space LS is formed, the interface LG2 of the liquid LQ between the second member 22T and the substrate P (object) is prevented from moving to approach the second opening part 28T, or at least a portion of the interface LG2 is prevented from moving below the second opening part 28T.

That is, even when the interface LG2 is to approach the second opening part 28T, as shown in FIG. 33, the liquid LQ is supplied to the space between the first member 21T and the substrate P (object) from the liquid supply part 53T, and thus, at least a portion of the liquid LQ flows into the second space SP2 between the second member 22T and the substrate P (object). In other words, the liquid LQ supplied from the liquid supply part 53T replenishes the second space SP2 between the second member 22T and the substrate P (object). Accordingly, the interface LG2 of the liquid LQ is suppressed from approaching the second opening part 28T. Therefore, occurrences of bubbles (gas portion) in the liquid LQ of the optical path space SPK are suppressed.

As described above, also in the present embodiment, the change of the pressure, in which the terminal optical element 13 receives from the liquid LQ in the liquid immersion space LS, is decreased. Moreover, in the present embodiment, since the liquid supply part 53T is provided, occurrences of the bubbles (gas portion) in the liquid LQ are suppressed. Accordingly, occurrences of exposure failure and occurrence of a defective device are suppressed.

Eighteenth Embodiment

An eighteenth embodiment will be described. In the descriptions below, the same reference numerals are assigned to the same or similar components as those of the above-described embodiments, and descriptions thereof are simplified or omitted here.

Figure 34:
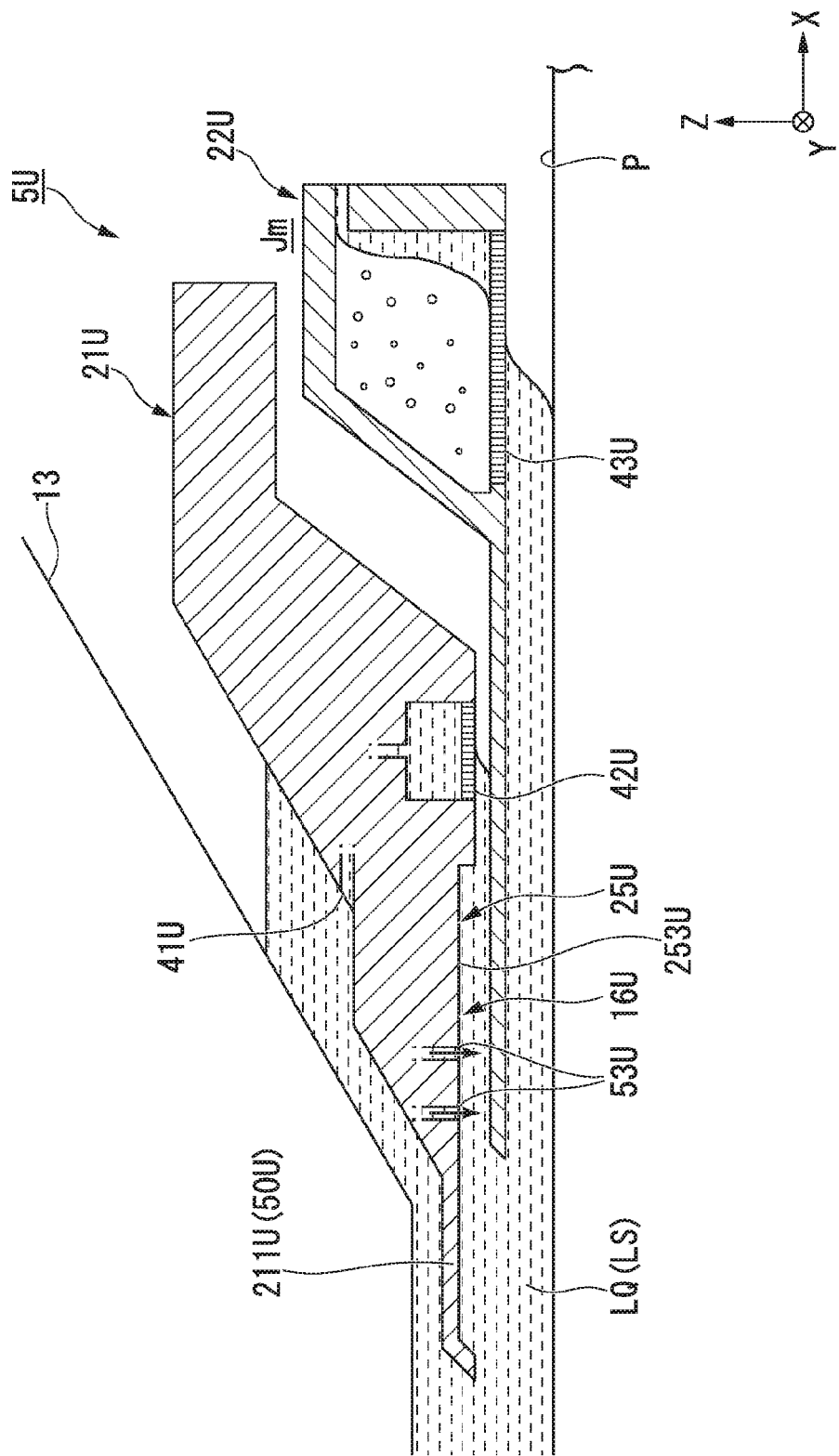
FIG. 34 is a side cross-sectional view showing a portion of a liquid immersion member according to an eighteenth embodiment.

FIG. 34 is a view showing an example of a liquid immersion member 5U according to the present embodiment. The liquid immersion member 5U includes a first member 21U, and a second member 22U which is movable.

The first member 21U includes a liquid supply part 41U which is able to supply the liquid LQ to form the liquid immersion space LS, a liquid supply part 53U which is able to supply the liquid LQ, and a liquid recovery part 42U which is able to recover the liquid LQ. Moreover, the first member 21U includes a protection part 211U (wall part 50U) which is disposed between the terminal optical element 13 and the second member 22U.

The second member 22U includes a liquid recovery part 43U which is able to recover the liquid LQ. The liquid recovery part 43U is able to be opposite to the substrate P (object).

The first member 21U includes a lower surface 25U to which the second member 22U is able to be opposite. The first member 21U includes a recessed part 16U. The second member 22U is able to be opposite to the recessed part 16U. The second member 22U is movable below the recessed part 16U.

In the present embodiment, the liquid supply part 53U is disposed inside the recessed part 16U. The liquid supply part 53U is disposed at a region 253U of the lower surface 25U which is disposed inside the recessed part 16U.

Figure 35:
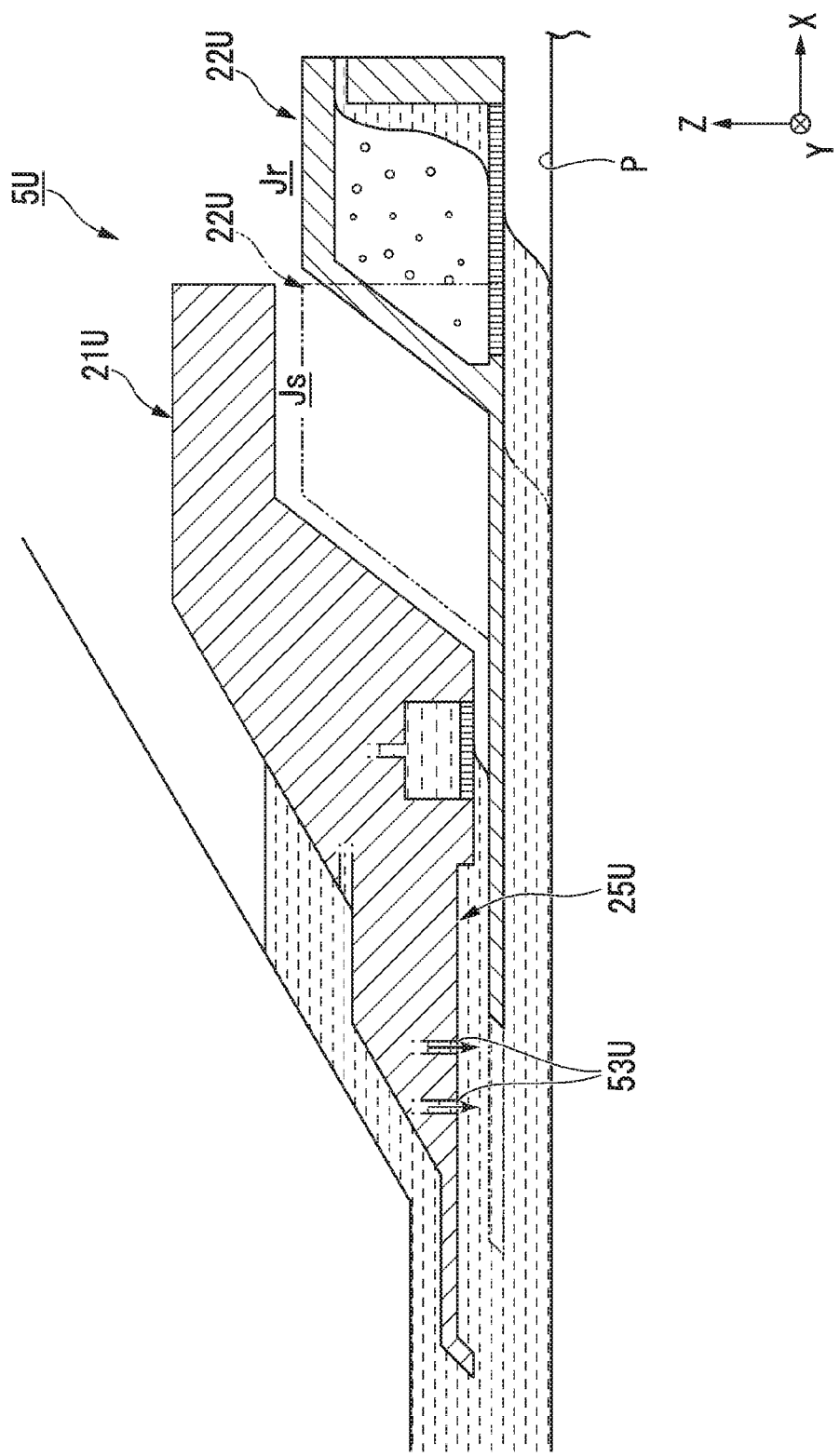
FIG. 35 is a side cross-sectional view showing a portion of the liquid immersion member according to the eighteenth embodiment.

FIG. 34 shows a state where the second member 22U is disposed at the origin point (center position Jm). FIG. 35 shows a state where the second member 22U is disposed at the first end position Jr and a state where the second member 22U is disposed at the second end position Js. In FIG. 35, the second member 22U which is disposed at the first end position Jr is indicated by a solid line, and the second member 22U which is disposed at the second end position Js is indicated by a chain line.

As shown in FIGS. 34 and 35, in the state where the second member 22U is disposed at the center position Jm, or in the state where the second member 22U is disposed at the second end position Js, the liquid supply part 53U, which is disposed at the +X side lower surface 25U with respect to the optical path AT, is opposite to the second member 22U.

As shown in FIG. 35, in the state where the second member 22U is disposed at the first end position Jr, the liquid supply part 53U, which is disposed at the +X side lower surface 25U with respect to the optical path AT, does not face the second member 22U, and faces the substrate P (object).

That is, also in the present embodiment, the second member 22U is movable to change from one of the state where the second member 22U faces the liquid supply part 53U and the state where the second member 22U does not face the liquid supply part 53U to the other state.

Moreover, although it is not shown, in the state where the second member 22U is disposed at the center position Jm, or in the state where the second member 22U is disposed at the first end position Jr, the liquid supply part 53U disposed at the −X side lower surface 25U with respect to the optical path AT faces the second member 22U.

In addition, in the state where the second member 22U is disposed at the second end position Js, the liquid supply part 53U disposed at the −X side lower surface 25U with respect to the optical path AT does not face the second member 22U, and faces the substrate P (object).

As shown in FIG. 35, also in the present embodiment, in the state where the second member 22U is opposite to the liquid supply part 53U, the liquid LQ is supplied from the liquid supply part 53U. The liquid supply part 53U supplies the liquid LQ to the first space SP1 between the first member 21U and the second member 22U.

Moreover, as shown in FIG. 35, in the state where the second member 22U is not opposite to the liquid supply part 53U, the liquid LQ is supplied from the liquid supply part 53U. The liquid supply part 53U supplies the liquid LQ to the space between the first member 21U and the substrate P (object).

As described above, also in the present embodiment, the change of the pressure, in which the terminal optical element 13 receives from the liquid LQ in the liquid immersion space LS, is decreased. Moreover, in the present embodiment, since the liquid supply part 53U is provided, occurrences of the bubbles (gas portion) in the liquid LQ are suppressed. Accordingly, occurrence of exposure failure and occurrences of a defective device are suppressed.

Moreover, in the seventeenth and eighteenth embodiments, in at least a part of the period of the state where the second member 22T (22U) is opposite to the liquid supply part 53T (53U), the liquid LQ may not be supplied from the liquid supply part 53T (53U).

In addition, in the seventeenth and eighteenth embodiments, in at least a part of the period of the state where the second member 22T (22U) is not opposite to the liquid supply part 53T (53U), the liquid LQ may not be supplied from the liquid supply part 53T (53U).

Moreover, in the seventeenth and eighteenth embodiments, the liquid supplied from the liquid supply part 41T (41U) and the liquid supplied from the liquid supply part 53T (53U) may be the same kind as each other, or may not be the same kind as each other.

In addition, in the seventeenth and eighteenth embodiments, the liquid supplied from the liquid supply part 41T (41U) and the liquid supplied from the liquid supply part 53T (53U) may have the same degree of cleanness as each other, or may not have the same degree of cleanness as each other.

Moreover, in the seventeenth and eighteenth embodiments, the liquid supplied from the liquid supply part 41T (41U) and the liquid supplied from the liquid supply part 53T (53U) may have the same temperature as each other, or may not have the same temperature as each other.

Nineteenth Embodiment

A nineteenth embodiment will be described. In the descriptions below, the same reference numerals are assigned to the same or similar components as those of the above-described embodiments, and descriptions thereof are simplified or omitted here.

Figure 36:
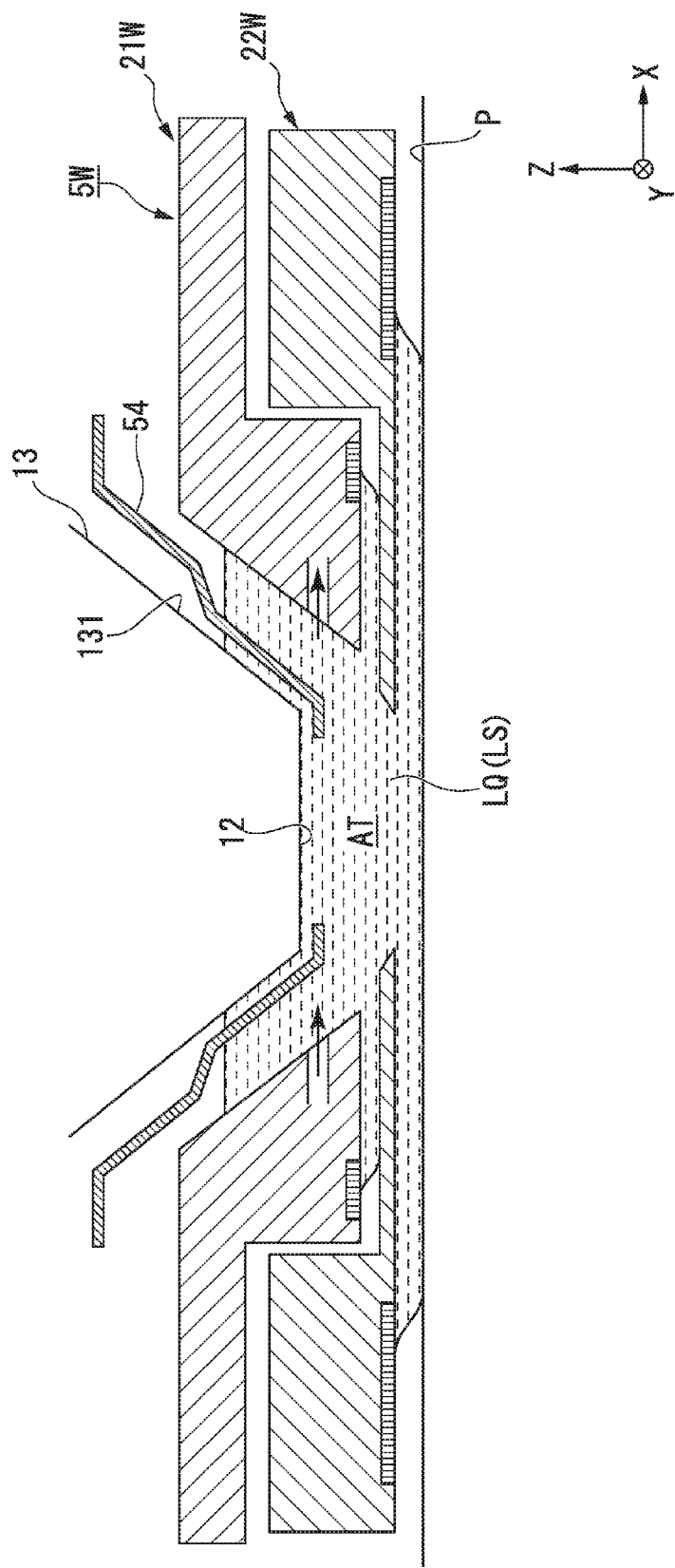
FIG. 36 is a view showing an example of an exposure apparatus according to a nineteenth embodiment.

FIG. 36 is a view showing an example of the exposure apparatus EX according to the present embodiment. The exposure apparatus EX includes a liquid immersion member 5W which forms the liquid immersion space LS. The liquid immersion member 5W includes a first member 21W which is disposed at the surrounding of the terminal optical element 13, and a second member 22W in which at least a portion is disposed below the first member 21W, is able to be opposite to the substrate P (object), and is movable outside the optical path AT of the exposure light EL.

The exposure apparatus EX includes a protection member 54 which protects the terminal optical element 13. The protection member 54 is a member separated from the liquid immersion member 5W. The protection member 54 is disposed at at least a portion of the surrounding of the terminal optical element 13. In the present embodiment, a portion of the protection member 54 is disposed to face the outer surface 131 of the terminal optical element 13 via a gap. A portion of the protection member 54 is disposed to face the emitting surface 12 of the terminal optical element 13 via a gap.

The protection member 54 decreases the change in the pressure in which the terminal optical element 13 receives from the liquid LQ in the liquid immersion space LS. At least a portion of the protection member 54 is disposed between the terminal optical element 13 and the liquid immersion member 5W outside the optical path AT. At least a portion of the protection member 54 is disposed between the terminal optical element 13 and the second member 22W outside the optical path AT.

For example, the protection member 54 may be supported by a support apparatus which supports the projection optical system PL. For example, the protection member 54 may be supported by the reference frame 8A. For example, the protection member 54 may be supported by the apparatus frame 8B.

As described above, also in the present embodiment, the change of the pressure, in which the terminal optical element 13 receives from the liquid LQ in the liquid immersion space LS, is decreased. Accordingly, occurrences of exposure failure and occurrences of a defective device are suppressed.

In addition, in the first to nineteenth embodiments, the size (distance G1$b$ or the like) in the Z axis direction of the first space SP1 may be determined to decrease the change in the pressure in which the terminal optical element 13 receives from the liquid LQ in the liquid immersion space LS. In order to decrease the change in the pressure in which the terminal optical element 13 receives from the liquid LQ in the liquid immersion space LS, the size (distance G1$b$ or the like) in the Z axis direction of the first space SP1 may be adjusted (changed).

Figure 37:
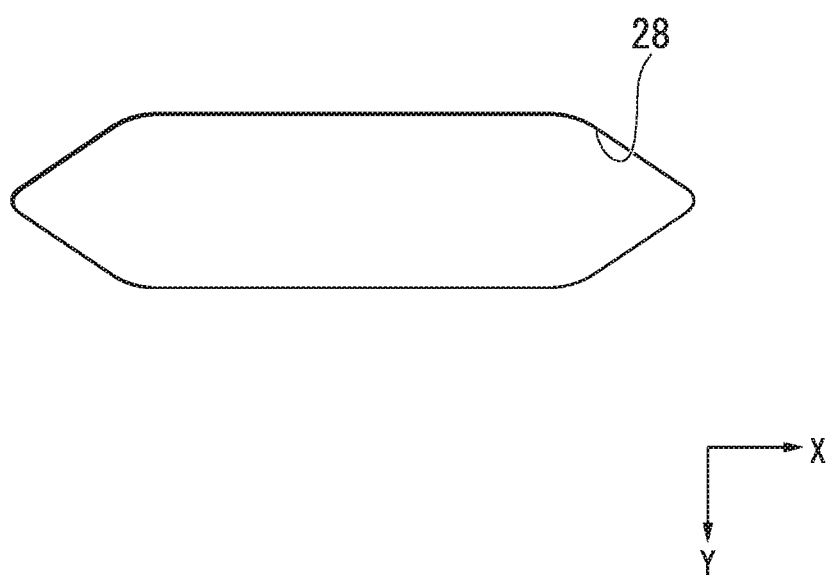
FIG. 37 is a view showing an example of a second opening part.

Moreover, in the first to nineteenth embodiments, as shown in FIG. 37, the second opening part (28 or the like) provided at the second member (22 or the like) may be formed in a hexagonal shape.

Moreover, in each of the above-described embodiments, the first member (21 or the like) may not be an annular shape. The first member (21 or the like) may be disposed at at least a portion of the surrounding of the optical path AT (terminal optical element 13). A plurality of the first members (21 or the like) may be disposed at the surrounding of the optical path AT.

Moreover, in each of the above-described embodiments, the second member (22 or the like) may not be an annular shape. The second member (22 or the like) may be disposed at at least a portion of the surrounding of the optical path AT (terminal optical element 13). A plurality of the second members (22 or the like) may be disposed at the surrounding of the optical path AT.

In addition, in each of the above-described embodiments, the liquid recovery parts (42, 42Q, 42T, or the like) which recover the liquid from the first space SP1 may not be provided. Moreover, instead of the liquid recovery part (42 or the like) provided at the first member (21 or the like), or in addition to the liquid recovery part (42 or the like) provided at the first member (21 or the like), a liquid recovery part which recovers the liquid from the first space SP1 may be provided at the second member (22 or the like).

Figure 40C:
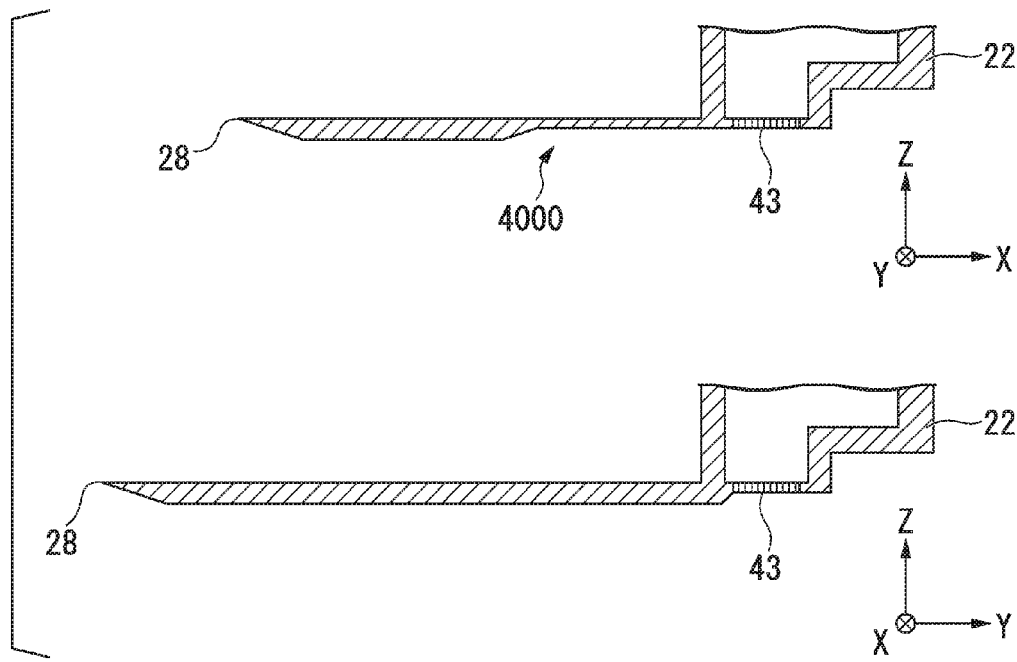
FIG. 40C is a side cross-sectional view showing a portion of the liquid immersion member.

In addition, in the first to nineteenth embodiments, a thickness of the second member at the surrounding of the second opening part (28 or the like) of the second member (22 or the like) may not be uniform. For example, as shown in FIG. 40A, a recessed part 4000 is formed on the lower surface of the second member, and thus, the thickness of the second member on both sides of the second opening part in the X axis direction may be thinner than the thickness of the second member on both sides of the second opening part in the Y axis direction. Accordingly, in the vicinity of the second opening part, the size in the Z axis direction of the second space SP2 on both sides of the second opening part in the X axis direction is larger than the size in the Z axis direction of the second space SP2 on both sides of the second opening part in the Y axis direction. Accordingly, the liquid LQ easily flows in the second space SP2 in the X axis direction. Therefore, for example, even when the second member moves in the X axis direction, the interface LG2 of the liquid immersion space LS can be suppressed from approaching the optical path ATL. In addition, the pressure of the liquid LQ in the liquid immersion space LS below the terminal optical element 13 is able to be suppressed from increasing, and an effect for suppressing the displacement of the terminal optical element 13 is able to be expected. It is needless to say that the shape, the position, and the size of the recessed part 4000 of the second member is not limited to FIG. 40, which causes the size in the Z direction of a portion of the second space SP2 on both sides of the second opening part in the X axis direction to be larger than the size in the Z axis direction of the second space SP2 on both sides of the second opening part in the Y axis direction. For example, as shown in FIGS. 40B and 40C, the recessed part 4000 may be formed at a position away from the second opening part between the second opening part (28 or the like) and the liquid recovery part (43 or the like).

Figure 40D:
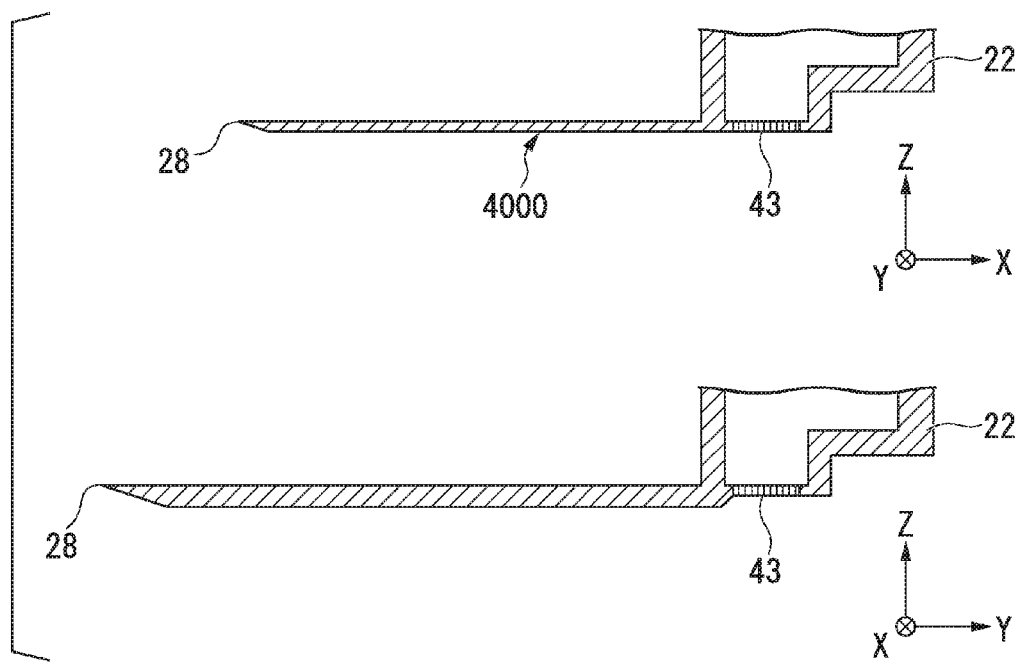
FIG. 40D is a side cross-sectional view showing a portion of the liquid immersion member.

Moreover, as shown in FIG. 40D, the recessed part 4000 may be provided at the lower surface of the second member from the second opening part (28 or the like) to the liquid recovery part (43 or the like) on both sides of the second opening part in the X axis direction so that the size in the Z axis direction of the second space SP2 is larger than the size in the Z axis direction of the second space SP2 on both sides of the second opening part in the Y axis direction.

In addition, in the first to nineteenth embodiments, in order to decrease the change in the pressure in which the terminal optical element 13 receives from the liquid LQ in the liquid immersion space LS, a supply amount of the liquid LQ from the liquid supply part 41 may be changed. For example, when the second member (22 or the like) moves in the –X axis direction, the liquid supply amount from the liquid supply part 41 positioned at the +X side of the terminal optical element 13 may be made smaller than the liquid supply amount from the liquid supply part 41 positioned at the –X side of the terminal optical element 13, and when the second member (22 or the like) moves in the +X axis direction, the liquid supply amount from the liquid supply part 41 positioned at the –X side of the terminal optical element 13 may be made smaller than the liquid supply amount from the liquid supply part 41 positioned at the +X side of the terminal optical element 13.

Figure 41:
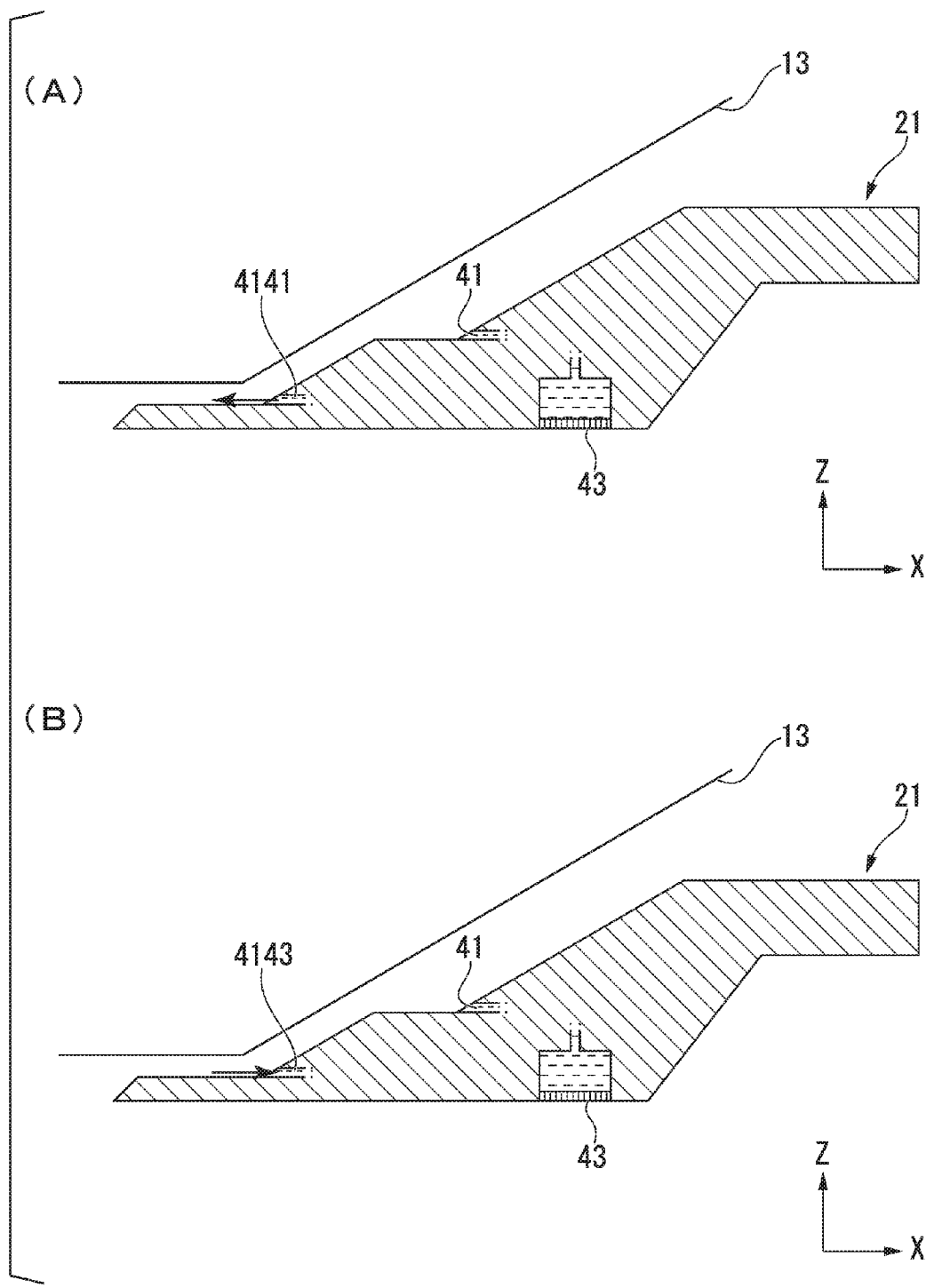
FIG. 41 is a side cross-sectional view showing a portion of the liquid immersion member.

Moreover, in the first to nineteenth embodiments, in order to decrease the change in the pressure in which the terminal optical element 13 receives from the liquid LQ in the liquid immersion space LS, a liquid supply part different from the liquid supply part 41 may be provided. For example, as shown in FIG. 41(*a*), a liquid supply part 4141 may be provided at the first member 21. For example, when the second member (22 or the like) moves in the –X axis direction, the liquid supply amount from the liquid supply part 4141 positioned at the +X side of the terminal optical element 13 may be made smaller than the liquid supply amount from the liquid supply part 4141 positioned at the –X side of the terminal optical element 13, and when the second member (22 or the like) moves in the +X axis direction, the liquid supply amount from the liquid supply part 4141 positioned at the –X side of the terminal optical element 13 may be made smaller than the liquid supply amount from the liquid supply part 4141 positioned at the +X side of the terminal optical element 13. In this case, the supply of the liquid LQ from the liquid supply part 41 is performed to be similar to the above-described first to nineteenth embodiments.

In addition, in the first to nineteenth embodiments, a liquid recovery part, which decreases the change in the pressure in which the terminal optical element 13 receives from the liquid LQ in the liquid immersion space LS, may be provided. For example, as shown in FIG. 41(b), a liquid recovery part 4143 may be provided at the first member 21. For example, when the second member (22 or the like) moves in the −X axis direction, the liquid recovery amount from the liquid recovery part 4143 positioned at the +X side of the terminal optical element 13 may be made larger than the liquid recovery amount from the liquid recovery part 4143 positioned at the −X side of the terminal optical element 13, and when the second member (22 or the like) moves in the +X axis direction, the liquid recovery amount from the liquid recovery part 4143 positioned at the −X side of the terminal optical element 13 may be made larger than the liquid recovery amount from the liquid recovery part 4143 positioned at the +X side of the terminal optical element 13.

Moreover, as described above, when the change of the pressure, in which the terminal optical element 13 receives from the liquid LQ in the liquid immersion space LS, is able to be decreased by at least one of the liquid supply and the liquid recovery, the first member 21 may not have the function which protects the terminal optical element 13, and as shown in FIG. 36, the protection member 54 may not be provided.

Moreover, in the first to nineteenth embodiments, the modifications, or the like, in order to decrease the change in the pressure in which the terminal optical element 13 receives from the liquid LQ in the liquid immersion space LS, the first member 21 may be moved. In this case, the first member 21 may not have the function which protects the terminal optical element 13, and as shown in FIG. 36, the protection member 54 may not be provided.

In addition, in the first to nineteenth embodiments, the modifications, or the like, an actuator which applies a force to the terminal optical element 13 or the like may be provided so that the position of the terminal optical element 13 is not changed or the terminal optical element 13 is not inclined even when the pressure, in which the terminal optical element 13 receives from the liquid LQ in the liquid immersion space LS, is changed. In this case, the first member 21 may not have the function which protects the terminal optical element 13, and as shown in FIG. 36, the protection member 54 may not be provided.

Moreover, in the first to nineteenth embodiments, the modifications, or the like, the projection optical system PL may be adjusted or the position (movement) of the substrate stage 2 may be controlled so that a state of an image projected on the substrate P is deteriorated or the image is not projected at a position different from a desired position on the substrate P even when the pressure, in which the terminal optical element 13 receives from the liquid LQ in the liquid immersion space LS, is changed. In this case, the first member 21 may not have a function which protects the terminal optical element 13, and as shown in FIG. 36, the protection member 54 may not be provided.

In addition, in each of the above-described embodiments, the controller 6 includes a computer system which includes a CPU or the like. In addition, the controller 6 includes an interface which is able to perform communication with a computer system and an external apparatus. For example, the storage apparatus 7 includes a memory such as a RAM, a hard disk, and a recording medium such as a CD-ROM. In the storage apparatus 7, an operating system (OS) which controls the computer system is installed and a program of controlling the exposure apparatus EX is stored.

Moreover, an input apparatus which is able to input signals may be connected to the controller 6. The input apparatus includes input equipment such as a keyboard or a mouse, a communication apparatus or the like which is able to input data from the external apparatus, and the like. Moreover, a display apparatus such as a liquid crystal display may also be provided.

The controller (computer system) 6 is able to read various information which includes the programs which are recorded in the storage apparatus 7. Programs are recorded in the storage apparatus 7, and the programs make the controller 6 perform the control of the liquid immersion exposure apparatus which exposes the substrate by the exposure light via the liquid filled in the optical path of the exposure light between the emitting surface of the optical member from which the exposure light is emitted and the substrate.

According to the above-described embodiments, the programs which are recorded in the storage apparatus 7 may make the controller 6 perform: forming a liquid immersion space of a liquid on the substrate movable below the optical member by using a liquid immersion member that includes a first member which is disposed at at least a portion of surrounding of the optical member, a second member which includes at least a portion disposed below the first member, which is capable of being opposite to the object, and which is movable outside an optical path of the exposure light, and a protection part which protects the optical member; exposing the substrate by the exposure light emitted from the emitting surface via the liquid in the liquid immersion space; moving the second member with respect to the first member in at least a part of an exposure of the substrate; and decreasing a change of a pressure, which the optical member receives from the liquid in the liquid immersion space, by use of the protection part.

Moreover, according to the above-described embodiments, the programs which are recorded in the storage apparatus 7 may make the controller 6 perform: forming a liquid immersion space of a liquid on the substrate movable below the optical member by using a liquid immersion member that includes a first member which is disposed at at least a portion of surrounding of the optical member, and a second member which includes at least a portion disposed below the first member, which is capable of being opposite to the object, and which is movable outside an optical path of the exposure light, in which the first member includes a wall part disposed between the optical member and the second member, the second member includes a second upper surface and a second lower surface which is capable of being opposite to a surface of the object, and a lowermost part of the wall part is disposed at a same height as the second upper surface or is disposed below the second upper surface; exposing the substrate by the exposure light emitted from the emitting surface via the liquid in the liquid immersion space; and moving the second member with respect to the first member in at least a part of an exposure of the substrate.

In addition, according to the above-described embodiments, the programs which are recorded in the storage apparatus 7 may make the controller 6 perform: forming a liquid immersion space of a liquid on the substrate movable below the optical member by using a liquid immersion member that includes a first member which is disposed at at least a portion of surrounding of the optical member, and a second member which includes at least a portion disposed below the first member, which is capable of being opposite to the object, and which is movable outside an optical path of the exposure light, in which the first member includes a wall part disposed between the optical member and the second member, the second member includes a second upper surface and a second lower surface which is capable of being opposite to a surface of the object, and a lowermost part of the wall part is disposed at a same height as the second lower surface or is disposed below the second lower surface; exposing the substrate by the exposure light emitted from the emitting surface via the liquid in the liquid immersion space; and moving the second member with respect to the first member in at least a part of an exposure of the substrate.

Moreover, according to the above-described embodiments, the programs which are recorded in the storage apparatus 7 may make the controller 6 perform: forming a liquid immersion space of a liquid on the substrate movable below the optical member by using a liquid immersion member that includes a first member which is disposed at at least a portion of surrounding of the optical member, and a second member which includes at least a portion disposed below the first member, which is capable of being opposite to the object, and which is movable outside an optical path of the exposure light, in which the first member includes a wall part disposed between the optical member and the second member, the second member includes a second upper surface and a second lower surface which is capable of being opposite to a surface of the object, a lowermost part of the wall part is disposed above the second upper surface of the second member, a gap is formed between the first member and the second upper surface outside the lowermost part with respect to the optical path, and the distance between the lowermost part and the second upper surface is smaller than a size of the gap in a direction parallel to the optical axis of the optical member; exposing the substrate by the exposure light emitted from the emitting surface via the liquid in the liquid immersion space; and moving the second member with respect to the first member in at least a part of an exposure of the substrate.

In addition, according to the above-described embodiments, the programs which are recorded in the storage apparatus 7 may make the controller 6 perform: forming a liquid immersion space of a liquid on the substrate movable below the optical member by using a liquid immersion member that includes a first member which is disposed at at least a portion of surrounding of an optical path of the exposure light, and a second member which includes at least a portion disposed below the first member, which is capable of being opposite to the object, and which is movable outside the optical path, in which the first member includes a wall part disposed between the optical member and the second member, the wall part includes a first part nearest to the optical path, the second member includes a second part nearest to the optical path, and the second part is continuously disposed outside the first part with respect to the optical path in a movement period of the second member; exposing the substrate by the exposure light emitted from the emitting surface via the liquid in the liquid immersion space; and moving the second member with respect to the first member in at least a part of an exposure of the substrate.

Moreover, according to the above-described embodiments, the programs which are recorded in the storage apparatus 7 may make the controller 6 perform: forming a liquid immersion space of a liquid on the substrate movable below the optical member by using a liquid immersion member that includes a first member which is disposed at at least a portion of surrounding of the optical member, and a second member which includes at least a portion disposed below the first member, which is capable of being opposite to the object, and which is movable outside an optical path of the exposure light emitted from the emitting surface, in which the first member includes a first lower surface in which at least a portion is able to be opposite to the second member, and the first lower surface includes a first region, and a second region which is disposed outside the first region with respect to the optical path and which is disposed above the first region; exposing the substrate by the exposure light emitted from the emitting surface via the liquid in the liquid immersion space; and moving the second member with respect to the first member in at least a part of an exposure of the substrate.

In addition, according to the above-described embodiments, the programs which are recorded in the storage apparatus 7 may make the controller 6 perform: forming a liquid immersion space of a liquid on the substrate movable below the optical member by using a liquid immersion member that includes a first liquid supply part which is configured to supply the first liquid, a first member which is disposed at at least a portion of surrounding of the optical member, a second member which includes at least a portion disposed below the first member, which is capable of being opposite to the object, and which is movable outside an optical path of the exposure light, and a second liquid supply part which is configured to supply a second liquid, in which the second member is moved so that one of a first state and a second state is changed to the other state, the first state being a state in which the second member is opposite to the second liquid supply part and the second state being a state in which the second member is not opposite to the second supply part; exposing the substrate by the exposure light emitted from the emitting surface via the liquid in the liquid immersion space; and moving the second member with respect to the first member in at least a part of an exposure of the substrate.

In addition, according to the above-described embodiments, the programs which are recorded in the storage apparatus 7 may make the controller 6 perform: forming a liquid immersion space of a liquid on the substrate movable below the optical member by using a liquid immersion member that includes a first member which is disposed at at least a portion of surrounding of the optical member, and a second member which includes at least a portion disposed below the first member, which is capable of being opposite to the object, and which is movable outside an optical path of the exposure light; exposing the substrate by the exposure light emitted from the emitting surface via the liquid in the liquid immersion space; moving the second member with respect to the first member in at least a part of an exposure of the substrate; and decreasing a change of a pressure, which the optical member receives from the liquid in the liquid immersion space, by use of a protection part.

The programs which are stored in the storage apparatus 7 are read by the controller 6, and thus, various apparatuses of the exposure apparatus EX such as the substrate stage 2, the measurement stage 3, and the liquid immersion member 5 cooperate with one another and perform various processing such as the liquid immersion exposure of the substrate P in the state where the liquid immersion space LS is formed.

Moreover, in each of the above-described embodiments, the optical path ATL on the emitting surface 12 side (image surface side) of the terminal optical element 13 of the projection optical system PL is filled with the liquid LQ. However, for example, the projection optical system PL may be the projection optical system in which the optical path of the incident side (object surface side) at the terminal optical element 13 is also filled with the liquid LQ as disclosed in PCT International Publication No. WO 2004/019128.

In addition, in each of the above-described embodiments, the liquid LQ is water. However, the liquid may be liquid other than the water. Preferably, the liquid LQ is transparent with respect to the exposure light EL, has high refractive index with respect to the exposure light EL, and is stable with respect to the projection optical system PL or the film of a photosensitive material (photoresist) which forms the surface of the substrate P or the like. For example, the liquid LQ may be fluorinated liquid such as hydrofluoroether (HFE), perfluorinated polyether (PFPE), and Fomblin® oil. Moreover, the liquid LQ may be various fluids, such as, for example, supercritical liquid.

Moreover, in each of the above-described embodiment, the substrate P includes a semiconductor wafer used to manufacture a semiconductor device. However, for example, the substrate P includes a glass substrate for a display device, a ceramic wafer for a thin film magnetic head, a mask or an original plate (synthetic quartz, silicon wafer) of a reticle which is used in an exposure apparatus, or the like.

Moreover, in each of the above-described embodiments, the exposure apparatus EX is a scanning type exposure apparatus (scanning stepper) of a step-and-scan system in which the mask M and the substrate P synchronously move and the patterns of the mask M are scanned and exposed. However, for example, the exposure apparatus EX may be a projection exposure apparatus (stepper) of a step-and-repeat system in which patterns of the mask M are collectively exposed in a state where the mask M and the substrate P are stationary and the substrate P is sequentially step-moved.

In addition, the exposure apparatus EX may be an exposure apparatus (a collective exposure apparatus of a stitch system) in which, in the exposure of a step-and-repeat system, after the reduced image of a first pattern is transferred on the substrate P using the projection optical system in a state where the first pattern and the substrate P are substantially stationary, the reduced image of a second pattern is partially overlapped with the first pattern using the projection optical system and is collectively exposed on the substrate P in a state where the second pattern and the substrate P are substantially stationary. Moreover, the exposure apparatus of the stitch system may be an exposure apparatus of a step-and-stitch system in which at least two patterns are partially overlapped on the substrate P and transferred thereto, and the substrate P is sequentially moved.

In addition, for example, the exposure apparatus EX may be an exposure apparatus in which patterns of two masks are combined on the substrate via the projection optical system and one shot region on the substrate is approximately simultaneously double-exposed by single scanning exposure, as disclosed in U.S. Pat. No. 6,611,316. Moreover, the exposure apparatus EX may be an exposure apparatus of a proximity system, a mirror projection aligner, or the like.

Figure 38:
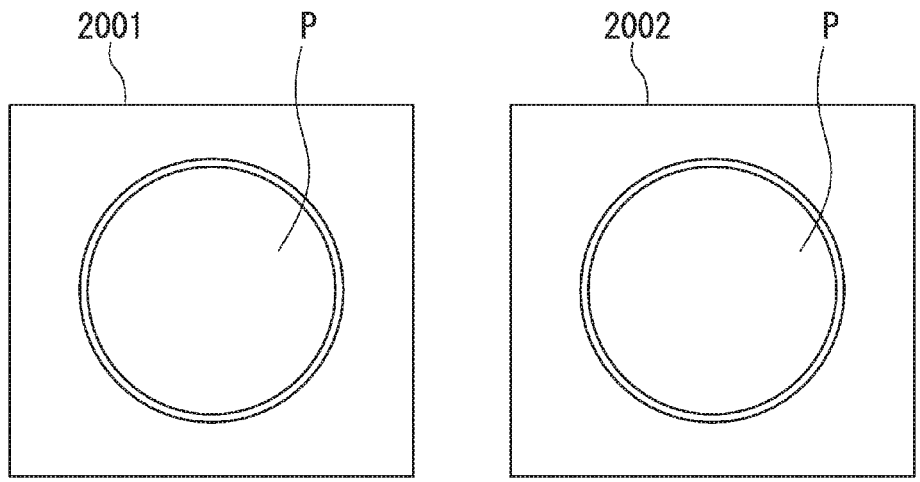
FIG. 38 is a view showing an example of a substrate stage.

In addition, in each of the above-described embodiments, the exposure apparatus EX may be an exposure apparatus of a twin stage type which includes a plurality of substrate stages, as disclosed in U.S. Pat. No. 6,341,007, U.S. Pat. No. 6,208,407, U.S. Pat. No. 6,262,796, or the like. For example, as shown in FIG. 38, when the exposure apparatus EX includes two substrate stages 2001 and 2002, the object which is able to be disposed so as to be opposite to the emitting surface 12 includes at least one of one substrate stage, a substrate which is held by a first holding part of the one substrate stage, another substrate stage, and a substrate which is held by a first holding part of another substrate stage.

Moreover, the exposure apparatus EX may be an exposure apparatus which includes the plurality of substrate stages and measurement stages.

The exposure apparatus EX may be an exposure apparatus used to manufacture a semiconductor element which exposes a semiconductor element pattern on the substrate P, an exposure apparatus used to manufacture a liquid crystal display element or a display, or an exposure apparatus used to manufacture a thin film magnetic head, an imaging element (CCD), a micromachine, a MEMS, a DNA chip, or a reticle or mask, or the like.

Moreover, in each of the above-described embodiments, the light transmission type mask is used in which a predetermined light shielding pattern (or a phase pattern, a dimming pattern) is formed on the substrate having light transparency. However, instead of this mask, for example, as disclosed in U.S. Pat. No. 6,778,257, a variable molding mask (also referred to as an electronic mask, an active mask, or an image generator) may be used which forms a transparent pattern, a reflective pattern, or a light-emitting pattern based on electronic data of the pattern to be exposed. In addition, instead of the variable molding masks which include a non-light emission type image display element, a pattern-forming apparatus which includes a self light-emission type image display element may be provided.

In each of the above-described embodiments, the exposure apparatus EX includes the projection optical system PL. However, the components in each of the above-described embodiments may be applied to an exposure apparatus and an exposing method which do not use the projection optical system PL. For example, the components in each of the above-described embodiments may be applied to an exposure apparatus and an exposing method in which the liquid immersion space is formed between an optical member such as a lens and the substrate and the exposure light is radiated to the substrate via the optical member.

Moreover, for example, the exposure apparatus EX may be an exposure apparatus (a lithography system) in which interference fringes are formed on the substrate P, and thus, a line-and-space pattern is exposed on the substrate P, as disclosed in PCT International Publication No. WO 2001/035168.

The exposure apparatuses EX of the above-described embodiments are manufactured by assembling various subsystems including each above-described component so as to maintain predetermined mechanical accuracy, electrical accuracy, and optical accuracy. In order to secure the various accuracies, before and after the assembly, adjustment for achieving optical accuracy with respect to various optical systems, adjustment for achieving mechanical accuracy with respect to various mechanical systems, and adjustment for achieving electrical accuracy with respect to various electrical systems are performed. The process of assembling the exposure apparatus from various subsystems includes mechanical connections, wiring connections of electric circuits, piping connections of air-pressure circuits, or the like between various subsystems. Of course, the respective assembly processes of each subsystem are needed before the assembly process from various subsystems to the exposure apparatus. After the assembly process of exposure apparatus by various subsystems is terminated, a general adjustment is performed, and thus, various accuracies in the overall exposure apparatus are secured. Moreover, preferably, the manufacturing of the exposure apparatus is performed in a clean room in which temperature, a degree of cleanness, or the like is controlled.

Figure 39:
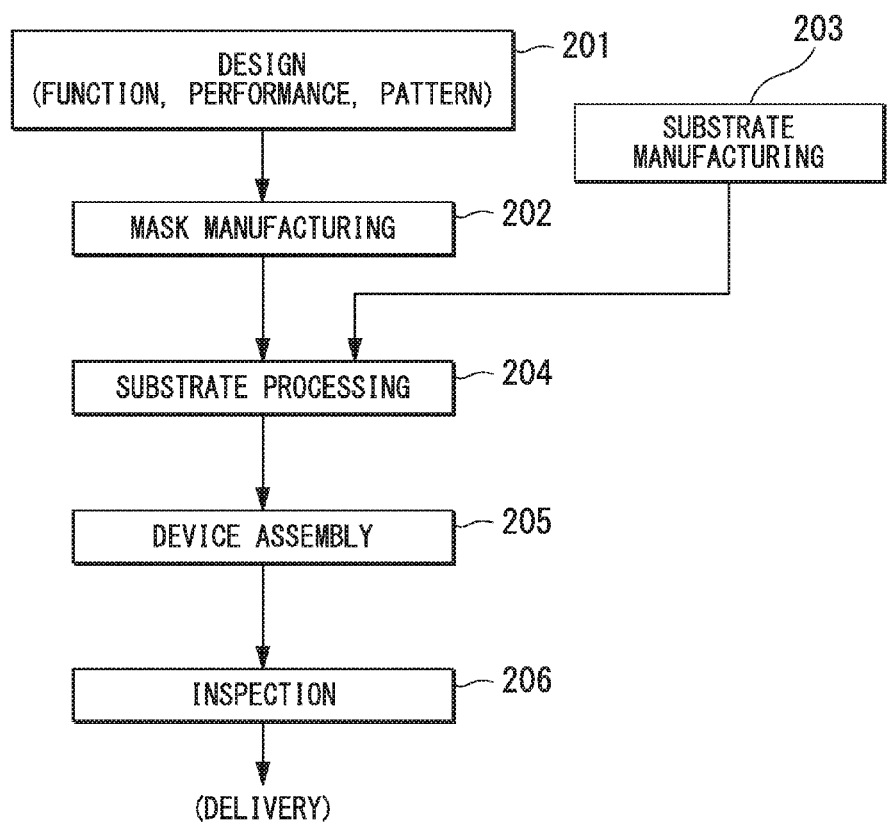
FIG. 39 is a flowchart for explaining an example of a method of manufacturing a device.

As shown in FIG. 39, a micro-device such as a semiconductor device is manufactured through a step 201 in which the function and performance design of the micro-device is performed, a step 202 in which a mask (reticle) is manufactured based on the design step, a step 203 in which a substrate which is a base material of the device is manufactured, a substrate processing step 204 which includes the substrate processing (exposure processing) including exposing the substrate by the exposure light from the pattern of the mask and developing the exposed substrate according to the above-described embodiments, a device assembly step (which includes manufacturing processes such as a dicing process, a bonding process, and a package process) 205, an inspection step 206, or the like.

Moreover, the aspects of each of the above-described embodiments may be appropriately combined. In addition, some components may not be used. Moreover, as long as legally permitted, the disclosures of all publications and United States Patents with respect to the exposure apparatuses or the like cited in each of the above-mentioned embodiments and modifications are incorporated in the disclosures of the present application.

What is claimed is:

1. A liquid immersion exposure apparatus in which a substrate is exposed with exposure light via liquid in a liquid immersion space formed under an emitting surface of an optical member, the apparatus comprising:
a movable stage having a holder on which the substrate is held,
a projection system having the optical member, and
a liquid immersion member to form the liquid immersion space, which includes (i) a first liquid supply part, (ii) a second liquid supply part, (iii) a first member that is disposed at at least a portion of surrounding of the optical member and that has a first liquid recovery part, (iv) a second member that is movable outside an optical path of the exposure light relative to the first member and that has a second liquid recovery part,
wherein:
an innermost edge of the first member is lower than a bottom surface of the second member,
a portion of the first member is disposed between the optical member and the second member,
the second liquid supply part supplies liquid to a gap between the first member and the second member, and
the second member moves in a direction perpendicular to an optical axis of the optical member so that a relative speed between the second member and the movable stage is smaller than a relative speed between the first member and the movable stage.

2. The apparatus according to claim 1, wherein
the innermost edge of the first member defines an opening through which the exposure light is projected.

3. The apparatus according to claim 1, wherein
the first member has the first liquid supply part which supplies liquid to a gap between the first member and the optical member.

4. The apparatus according to claim 1, wherein
the innermost edge of the first member defines an opening through which the exposure light is projected,
the first liquid supply part is disposed above the opening, and
the first liquid supply part supplies liquid to a gap between the first member and the optical member.

5. The apparatus according to claim 4, wherein
the liquid supplied from the first liquid supply part is allowed to move via the opening to a gap to be formed under a lower surface of the second member.

6. The apparatus according to claim 5, wherein
the second liquid recovery part is arranged at the lower surface of the second member to recover the liquid in the gap to be formed under the lower surface of the second member.

7. The apparatus according to claim 4, wherein
the liquid supplied from the first liquid supply part is allowed to move via the opening to the gap between the first member and the second member.

8. The apparatus according to claim 1, wherein
the second liquid recovery part is arranged at a lower surface of the second member to recover the liquid in a gap to be formed under the lower surface of the second member.

9. The apparatus according to claim 8, wherein
the substrate is exposed with the exposure light via the liquid immersion space a portion of which is formed between the lower surface of the second member and an upper surface of the substrate and which covers a portion of the upper surface of the substrate.

10. The apparatus according to claim 1, wherein
the first liquid recovery part recovers liquid from the gap between the first member and the second member.

11. The apparatus according to claim 10, wherein
the innermost edge of the first member defines an opening through which the exposure light is projected,
the first member has the second liquid supply part, and
the first liquid recovery part of the first member is arranged radially outward of the second liquid supply part with respect to the opening.

12. A device manufacturing method comprising:
exposing a substrate using the apparatus according to claim 1, and
developing the exposed substrate.

13. A liquid immersion exposure method comprising:
holding a substrate on a holder of a movable stage;
forming a liquid immersion space under an emitting surface of an optical member of the projection system using a liquid immersion member, while supplying liquid from a first liquid supply part and a second liquid supply part and while recovering the liquid from a first liquid recovery part and a second liquid recovery part; and
exposing the substrate with an exposure beam from the optical member of a projection system via liquid in the liquid immersion space,
wherein:
the liquid immersion member includes (i) the first liquid supply part, (ii) the second liquid supply part, (iii) a first member that is disposed at at least a portion of surrounding of the optical member and that has the first liquid recovery part, (iv) a second member that is movable outside an optical path of the exposure light relative to the first member and that has the second liquid recovery part,
an innermost edge of the first member is lower than a bottom surface of the second member,
a portion of the first member is disposed between the optical member and the second member,
the liquid from the second liquid supply part is supplied to a gap between the first member and the second member, and the second member moves in a direction perpendicular to an optical axis of the optical member so that a relative speed between the second member and the movable stage is smaller than a relative speed between the first member and the movable stage.

14. The method according to claim 13, wherein the innermost edge of the first member defines an opening through which the exposure light is projected to the substrate.

15. The method according to claim 13, wherein the first member has the first liquid supply part which supplies the liquid to a gap between the first member and the optical member.

16. The method according to claim 13, wherein the innermost edge of the first member defines an opening through which the exposure light is projected, the first liquid supply part is disposed above the opening, and the first liquid supply part supplies the liquid to a gap between the first member and the optical member.

17. The method according to claim 16, wherein the liquid supplied from the first liquid supply part is allowed to move via the opening to a gap to be formed under a lower surface of the second member.

18. The method according to claim 17, wherein the second liquid recovery part is arranged at the lower surface of the second member to recover the liquid in the gap to be formed under the lower surface of the second member.

19. The method according to claim 16, wherein the liquid supplied from the first liquid supply part is allowed to move via the opening to the gap between the first member and the second member.

20. The method according to claim 13, wherein the second liquid recovery part is arranged at a lower surface of the second member to recover the liquid in a gap to be formed under the lower surface of the second member.

21. The method according to claim 20, wherein the substrate is exposed with the exposure light via the liquid immersion space a portion of which is formed between the lower surface of the second member and an upper surface of the substrate and which covers a portion of the upper surface of the substrate.

22. The method according to claim 13, wherein the first liquid recovery part recovers liquid from the gap between the first member and the second member.

23. The method according to claim 22, wherein the innermost edge of the first member defines an opening through which the exposure light is projected, the first member has the second liquid supply part, and the first liquid recovery part of the first member is arranged radially outward of the second liquid supply part with respect to the opening.

* * * * *